(12) United States Patent
Maunder et al.

(10) Patent No.: US 10,439,645 B2
(45) Date of Patent: Oct. 8, 2019

(54) FULLY PARALLEL TURBO DECODING

(71) Applicant: Accelercomm Limited, Southampton (GB)

(72) Inventors: Robert Maunder, Hampshire (GB); An Li, Hampshire (GB); Isaac Perez-Andrade, Hampshire (GB)

(73) Assignee: Accelercomm Limited, Southampton, Hampshire (GB)

( * ) Notice: Subject to any disclaimer, the term of this patent is extended or adjusted under 35 U.S.C. 154(b) by 294 days.

(21) Appl. No.: 15/503,379

(22) PCT Filed: Jul. 30, 2015

(86) PCT No.: PCT/EP2015/067527
§ 371 (c)(1),
(2) Date: Feb. 10, 2017

(87) PCT Pub. No.: WO2016/023762
PCT Pub. Date: Feb. 18, 2016

(65) Prior Publication Data
US 2017/0244427 A1  Aug. 24, 2017

(30) Foreign Application Priority Data
Aug. 13, 2014 (GB) .................................. 1414376.2

(51) Int. Cl.
*H03M 13/29* (2006.01)
*H03M 13/15* (2006.01)
(Continued)

(52) U.S. Cl.
CPC .... *H03M 13/1575* (2013.01); *H03M 13/1111* (2013.01); *H03M 13/2771* (2013.01);
(Continued)

(58) Field of Classification Search
CPC ......... H03M 13/1575; H03M 13/3761; H03M 13/1111; H03M 13/2792; H03M 13/3769;
(Continued)

(56) References Cited

U.S. PATENT DOCUMENTS 6,452,979 B1 * 9/2002 Ariel ................. H03M 13/2957
375/265
8,547,257 B2 * 10/2013 Miller ................. H03M 1/0687
341/118

(Continued)

*Primary Examiner* — Albert Decady
*Assistant Examiner* — Enam Ahmed
(74) *Attorney, Agent, or Firm* — Haverstock & Owens LLP

(57) ABSTRACT

A circuit performs a turbo detection process recovering data symbols from a received signal effected, during transmission, by a Markov process with effect that the data symbols are dependent on preceding data symbols represented as a trellis having a plurality of trellis stages. The circuit comprises processing elements, associated with trellis stages representing these dependencies and each configured to receive soft decision values corresponding to associated data symbols Each processing element configured, in one clock cycle to receive data representing a priori forward and backward state metrics, and a priori soft decision values for data symbols detected for the trellis stage. For each clock cycle of the turbo detection process, the circuit processes, for processing elements representing the trellis stages, the a priori information for associated data symbols detected for the trellis stage, and to provide extrinsic soft decision values corresponding to data symbols for a next clock cycle.

20 Claims, 28 Drawing Sheets

(51) Int. Cl.
*H03M 13/00* (2006.01)
*H03M 13/27* (2006.01)
*H03M 13/11* (2006.01)
*H03M 13/37* (2006.01)
*H03M 13/45* (2006.01)
*H04L 1/00* (2006.01)

(52) U.S. Cl.
CPC ... *H03M 13/2792* (2013.01); *H03M 13/2957* (2013.01); *H03M 13/3761* (2013.01); *H03M 13/3769* (2013.01); *H03M 13/45* (2013.01); *H03M 13/617* (2013.01); *H03M 13/6505* (2013.01); *H03M 13/6513* (2013.01); *H03M 13/6519* (2013.01); *H03M 13/6525* (2013.01); *H03M 13/6544* (2013.01); *H03M 13/6561* (2013.01); *H04L 1/0052* (2013.01); *H04L 1/0055* (2013.01); *H04L 1/0058* (2013.01); *H04L 1/0071* (2013.01); *H03M 13/2789* (2013.01)

(58) Field of Classification Search
CPC ............... H03M 13/45; H03M 13/617; H03M 13/6505; H03M 13/6513; H03M 13/2771; H03M 13/2957; H03M 13/6561; H03M 13/6544; H03M 13/6525; H03M 13/6519; H03M 13/2789; H04L 1/0058; H04L 1/0071; H04L 1/0052; H04L 1/0055
USPC .......................................................... 714/776
See application file for complete search history.

(56) References Cited

U.S. PATENT DOCUMENTS

2006/0156201 A1* 7/2006 Zhang .................. H04L 47/263
714/776
2013/0191706 A1* 7/2013 Zopf ..................... H04L 1/0014
714/776
2014/0026020 A1* 1/2014 Feldbauer ............ G10L 19/005
714/776

* cited by examiner

| Characteristic | Log-BCJR LTE $N \in$ [40, 6144] | Log-BCJR WiMAX $N \in$ [24, 2400] | State-of-art LTE $N \in$ [40, 6144] | State-of-art WiMAX $N \in$ [40, 6144] |
|---|---|---|---|---|
| Time periods per decoding iteration $T$ | $2N$ TtotP | $2N$ TtotP | $N/64$ TtotP | $N/32$ TtotP |
| Time period duration $D$ | 1.13 TtotP | 1.22 TtotP | 0.43 TtotP | 0.33 TtotP |
| Complexity per decoding iteration $C$ | 1.10 TtotP | 1.25 TtotP | 1.77 TtotP | 1.58 TtotP |
| Decoding iterations required $I$ | 1/6 TtotP | 1/4 TtotP | 1/6 TtotP | 1/4 TtotP |
| Overall throughput $\propto 1/(T \times D \times I)$ | $2.65/N$ TtotP | $1.64/N$ TtotP | $893/N$ TtotP | $388/N$ TtotP |
| Overall latency $T \times D \times I$ | $N/2.65$ TtotP | $N/1.64$ TtotP | $N/893$ TtotP | $N/388$ TtotP |
| Overall complexity $C \times I$ | 0.18 TtotP | 0.31 TtotP | 0.30 TtotP | 0.40 TtotP |
| Memory required | 9.33 TtotP | 8.00 TtotP | 1.25 TtotP | 1.67 TtotP |

Table 1 providing a performance comparison with a Fully-Parallel Turbo Decoder according to an embodiment of the present technique with an equivalent Log-BCJR Turbo Decoder and a State-of-the-Art Turbo Decoder, wherein TtotP = times that of the proposed fully-parallel turbo decoder.

FIG. 14

| Turbo Code | Operation | Fully-parallel of Present Technique ||||  Log - BCJR |||||||
|---|---|---|---|---|---|---|---|---|---|---|---|
| | | (7) | (8) | (9) | (10) | Total | Forward recursion || Backward recursion ||| Total |
| | | | | | | | (2) | (3) | (4) | (5) | (6) | |
| LTE | + or − | 29.5 {3} | 8 | 8 | 2 {2} | 47.5 {5} | 1.5 | 12 | 12 {1} | 28 {2} | 2 {2} | 55.5 {5} |
| | max* | 0 | 8 | 8 | 14 {3} | 30 {3} | 0 | 8 | 8 {1} | 0 | 14 {3} | 30 {4} |
| WiMAX | + or − | 74 {3} | 8 | 8 | 4 {2} | 94 {5} | 12 | 30 | 30 {1} | 62 {2} | 4 {2} | 138 {5} |
| | max* | 0 | 24 | 24 | 32 {4} | 80 {4} | 0 | 24 | 24 {2} | 0 | 32 {4} | 80 {6} |

Table 2 providing an indication of numbers of calculations required for a Fully-parallel Turbo Decoder according to the present technique with an equivalent Log-BCJR Turbo Decoder.

FIG. 15

FULLY PARALLEL TURBO DECODING

TECHNICAL FIELD OF THE DISCLOSURE

The present disclosure relates to detection circuits for performing a turbo detection process to recover a frame of data symbols from a received signal, the data symbols of the frame having been affected, during the process of transmission, by a Markov process with the effect that the data symbols of the frame in the received signal are dependent on one or more preceding data symbols which can be represented as a trellis having a plurality of trellis states. In some examples the detection circuit forms part of a receiver and operates in co-operation with another detection circuit to perform the turbo detection process.

Embodiments of the present disclosure may provide therefore receivers configured to recover the frame of data symbols using a turbo decoder and methods for decoding turbo encoded data. In one example the data symbols are bits.

BACKGROUND OF THE DISCLOSURE

Over the past two decades, wireless communication has been revolutionized by channel codes that benefit from iterative decoding algorithms. For example, the Long Term Evolution (LTE) [1] and WiMAX [2] cellular telephony standards employ turbo codes [3], which comprise a concatenation of two convolutional codes. Conventionally, the Logarithmic Bahl-Cocke-Jelinek-Raviv (Log-BCJR) algorithm [4] is employed for the iterative decoding of the Markov chains that are imposed upon the encoded bits by these convolutional codes. Meanwhile, the WiFi standard for Wireless Local Area Networks (WLANs) [5] has adopted Low Density Parity Check (LDPC) codes [6], which may operate on the basis of the min-sum algorithm [7]. Owing to their strong error correction capability, these sophisticated channel codes have facilitated reliable communication at transmission throughputs that closely approach the capacity of the wireless channel. However, the achievable transmission throughput is limited by the processing throughput of the iterative decoding algorithm, if real-time operation is required. Furthermore, the iterative decoding algorithm's processing latency imposes a limit upon the end-to-end latency. This is particularly relevant, since multi-gigabit transmission throughputs and ultra-low end-to-end latencies can be expected to be targets for next-generation wireless communication standards [8]. Therefore, there is a demand for iterative decoding algorithms having improved processing throughputs and lower processing latencies. Owing to the inherent parallelism of the min-sum algorithm, it may be operated in a fully-parallel manner, facilitating LDPC decoders having processing throughputs of up to 16.2 Gbit/s [9]. By contrast, the processing throughput of state-of-the-art turbo decoders [10] is limited to 2.15 Gbit/s. This may be attributed to the inherently serial nature of the Log-BCJR algorithm, which is imposed by the data dependencies of its forward and backward recursions [4]. More specifically, the turbo-encoded bits generated by each of typically two convolutional encoders must be processed serially, spread over numerous consecutive time periods, which are clock cycles in a practical integrated circuit implementation. Furthermore, the Log-BCJR algorithm is typically applied to the two convolutional codes alternately, until a sufficient number of decoding iterations have been performed. As a result, thousands of time periods are required to complete the iterative decoding process of the state-of-the-art turbo decoder.

Accordingly, providing an alternative to the Log-BCJR decoder, which has fewer data dependencies and which enables fully parallel processing represents a technical problem.

SUMMARY OF THE DISCLOSURE

According to a first example embodiment of the present technique there is provided a detection circuit for performing a turbo detection process to recover a frame of data symbols or bits from a received signal comprising fixed point data representing one or more soft decision values for each data symbol of the frame. The data symbols or bits of the frame have been affected, during transmission, by a Markov process with the effect that the data symbols of the frame in the received signal are dependent on one or more preceding data symbols which can be represented as a trellis having a plurality of trellis states. The detection circuit comprises a plurality of processing elements. Each of the processing elements is associated with one of the trellis stages representing the dependency of the data symbols of the frame according to the Markov process and each of the processing elements is configured to receive one or more soft decision values corresponding to one or more data symbols associated with the trellis stage. Each of one or more of the processing elements is configured, in one clock cycle, to receive fixed point data representing a priori forward state metrics from a first neighboring processing element, to receive fixed point data representing a priori backward state metrics from a second neighboring processing element, and to receive fixed point data representing a priori soft decision values for the one or more data symbols being detected for the trellis stage. The processing element combines the a priori forward state metrics, the a priori backward state metrics and the a priori soft decision values relating to the one or more data symbols to determine fixed point extrinsic forward state metrics, fixed point extrinsic backward metrics and extrinsic soft decision values corresponding to the one or more data symbols for the trellis stage associated with the processing element, and communicates the extrinsic forward state metrics to the second neighboring processing element, which becomes the a priori forward state metrics for a next clock cycle, communicates the extrinsic backward state metrics to the first neighboring processing element, which becomes the a priori backward state metrics for the next clock cycle, and provides the extrinsic soft decision values, which becomes the a priori soft decision values relating to the data symbol for the next clock cycle. In one example the extrinsic soft decision values are provided to a second detection circuit for processing as part of the turbo detection process. In other example the extrinsic soft decision values are provided for storing in memory so that the detection circuit can use these for a subsequent iteration of the turbo detection process. For one or more of a plurality of consecutive clock cycles of the turbo detection process, the processing elements of the detection circuit are configured to operate simultaneously.

Embodiments of the present technique can provide a receiver for detecting and recovering a frame of data symbols or bits from a received signal. The data symbols of the frame as present in the received signals have during the process of transmission been affected by a Markov process to the effect that data symbols of the frame in the received signal are dependent on one or more preceding data symbols which can be represented as a trellis having a plurality of trellis states.

As will be appreciated by those skilled in the art this description of the frame of data symbols as represented by the received signal could be manifested as transmitting the frame of data symbols through a channel which suffers from inter-symbol interference. Therefore a received symbol of the frame may be detected or represented within the received signal as a combination of a received symbols and one or more preceding symbols so that the channel introduces inter-symbol interference and therefore introduces some memory corresponding to a Markov process. In other embodiments the data symbols may be encoded with a turbo code with the effect that the data symbols in the received signal are represented by one or more different encoded data symbols which may be systematic data symbols representing the original data symbols as input to the turbo encoder or parity data symbols which are produced by the turbo encoder. Furthermore, in accordance with turbo encoding, the encoder may be provided with a plurality of convolutional encoders each of which may output a plurality data symbols for each input data symbol.

In some examples, for each of a plurality of clock cycles of the turbo detection process, the detection circuit may be configured to co-operate with at least one other detection circuit to process, for each of the processing elements representing the trellis stages, the a priori information for the one or more data symbols being detected for the trellis stage associated with the processing element, and to exchange the extrinsic soft decision values corresponding to the one or more data symbols generated by the processing element with the at least one other processing element. In some example the processing elements of each of the detection circuit and the at least one other detection circuit may operate in each clock cycle and after each clock cycle the first detection circuit and the at least one other detection circuit exchange the extrinsic soft decision values to the other.

According to the present technique a receiver comprises a demodulator for detecting and demodulating a received signal to recover an estimate of a frame of data symbols represented as soft decision values, a soft decision value representing the probability of each of the data symbols of the frame adopting each of its possible values. For the example of a turbo encoded frame of data symbols or bits the demodulator generates for each encoded data symbol or bit a soft decision value. The receiver further comprises a first detection processor configured to receive the soft decision values representing the frame of data symbols and a second detection processor which is configured to cooperate with the first detection processor to perform a turbo detection process to generate an estimate of the frame of data symbols. The first detection processor comprises a plurality of processing elements, each of the processing elements being associated with one of the trellis stages representing the dependency of the data symbols of the frame according to the Markov process. Each of the processing elements is configured to receive the soft decision value corresponding to one or more data symbols associated with the trellis stage and each of the plurality of processing elements is configured to receive data representing a priori forward state metrics from one neighbouring processing element, to receive data representing a priori backward state metrics from another neighbouring processing element and to receive data representing a priori information for the data symbols being detected for the trellis stage associated with the processing element from the second detection processor and from the demodulator. Each processing element is configured to combine the a priori forward state metrics, the a priori backward state metrics and the a priori information relating to the data symbols to produce extrinsic forward metrics, and extrinsic backward metrics and extrinsic data information and to communicate the extrinsic forward state metrics to the second neighbouring processing element which becomes the a priori forward state metrics for a next iteration, to communicate the extrinsic backward state metrics to the first neighbouring processing element which becomes the a priori backward state metrics for the next iteration and to communicate the extrinsic data information to the second detection processor for which becomes the a priori information for a next iteration of the turbo detection process. The first detection processor and the second detection processor are configured to exchange for each of the processing elements representing the trellis stages, the a priori information for the data symbol being detected for the trellis stage associated with the processing element and the corresponding extrinsic data information generated by the processing element for each of a plurality of iterations of the turbo detection process. In each clock cycle, processing elements from both decoders are being activated. This is in contrast to conventional decoders, where one decoder remains inactive whenever the other is activated.

Embodiments of the present technique can provide an improved turbo detection processor which modifies conventional algorithms such as the Log-BCJR also known as Log-MAP algorithm so that processing elements which are associated with each of the trellis stages describing a Markov process to which the data symbols have been subjected during the process of transmission, with the effect that each of the processing elements can operate autonomously and therefore in parallel thereby providing an improvement in the processing rate of the turbo detection processor and reducing a latency in recovering a data frame from a received signal. The improved turbo detector as mentioned above can be applied to decode a turbo encoded data frame or used as a turbo equaliser where a received data frame has suffered inter-symbol interference during transmission or other applications such as turbo synchronisation and Low Density Parity Check (LDPC) decoding. The present technique can therefore facilitate turbo decoders with similar processing throughputs and latencies as fully parallel LDPC decoders. Furthermore, this solution would bring similar benefits to the recovery of Markov chains of data in other applications that are typically decoded using the Log-BCJR algorithm, such as equalisation, synchronisation, channel estimation and source decoding.

In order to achieve the fully parallel processing architecture for the turbo detector the present technique removes the data dependencies which are associated with a conventional turbo detector such as the Log-BCJR or Log-MAP algorithm by not requiring that a previous stage in the turbo decoder completes before executing operations of the turbo decoder for a current iteration. That is to say, a conventional turbo decoder would require that all stages in the forward direction ripple through in a serial manner to calculate the forward state metrics and correspondingly ripple through in the backward direction to generate the backward state metrics. Accordingly, the detection processor according to the present technique does not wait for the turbo detector to ripple forward the state metrics in the forward or backward directions but accepts a current value of the forward or backward state metrics at the output of the neighbouring processing elements and a priori information relating to the data symbol from another detection processor in the form that they currently are. This represents something of an approximation with respect to the Log-BCJR algorithm and accordingly the inventor has found that a greater number of iterations is required for the turbo detector according to the present technique to achieve the same decoding performance compared to the Log-BCJR algorithm. However, as will be explained in the following paragraphs, the inventor has discovered that an equivalent performance can be produced albeit with a greater number of iterations but with a faster detection process because the number of clock cycles in order to produce an equivalent performance of turbo detection/decoding is smaller than that produced by the conventional Log-BCJR algorithm.

For the example in which the receiver in accordance with the present technique is arranged to detect data symbols of a frame which have been encoded with a turbo encoder then the receiver may further include an interleaver which is configured between the first and second detection processors to convey a priori information relating to the data symbol between the first detector and the second detection processor whereby the processing elements of the first detection processor receive and transmit extrinsic information relating to the data symbol and receive a priori information relating to the data symbol from different processing elements of the second detection processor in accordance with an interleaving pattern. Accordingly, for the example where interleaving has been applied to a second convolutional encoder forming the turbo encoding process in accordance with odd-even interleaving, then the data information relating to the data symbol is communicated between processing elements of the first and the second detection processors which are odd-indexed or even-indexed depending on the interleaving applied by the turbo encoder. Accordingly, where odd-even interleaving has been applied the odd-indexed processing elements in the first detection processor and the even-indexed processing elements in the second detection processor may be executed alternatively between each clock cycle with the even-indexed processing elements in the first detection processor and the odd-indexed processing elements in the second detection processor, thereby providing a 50% saving on processing.

According to the present technique the processing elements may include a by-pass circuit which allows for selected processing elements to be switched off to reflect a shorter frame length and corresponding interleaver pattern. Accordingly, a corresponding saving in energy consumption can be achieved. The by-pass circuit may comprise a multiplexer, which is configured to select either an output from a current trellis stage or a previous trellis stage to by-pass the processing element. In some examples the interleaver is hardwired according to a predetermined interlever pattern and by-passes allow a sub-set of the interleaver pattern to be selected. In some examples the interleaver may be configurable to accommodate different interleaver patterns, which may be set in accordance with a particular turbo encoder. In another example the interleaver is re-configurable to route extrinsic information to different processing elements, which can therefore configure the turbo decoder in accordance with a particular turbo encoder. In one example the interleaver is implemented as a Beneg-network, which can be configured as desired.

The processing elements may also include one or more registers which are used to store the a priori forward state metrics or a priori backward state metrics or a priori information relating to the data symbol between time periods or clock cycles.

Various further aspects and features of the present disclosure are defined in the appended claims and include a communications device, a method of communicating using a communications device.

BRIEF DESCRIPTION OF DRAWINGS

Embodiments of the present disclosure will now be described by way of example only with reference to the accompanying drawings wherein like parts are provided with corresponding reference numerals and in which:

FIG. 14 presents a table 1, showing a performance comparison between a Fully-Parallel Turbo Decoder according to an embodiment of the present technique with an equivalent Log-BCJR Turbo Decoder and a State-of-the-Art Turbo Decoder [10], in which the abbreviation TtotP is used to mean "times that of the proposed fully-parallel turbo decoder";

FIG. 15 presents a table 2, showing an indication of numbers of calculations required for a Fully-parallel Turbo Decoder according to the present technique with an equivalent Log-BCJR Turbo Decoder, and in curly brackets number of calculations in the critical path length;

FIG. 17c the LTE turbo decoder when using the approximate max* operator;

DESCRIPTION OF EXAMPLE EMBODIMENTS

Example Communications System

Figure 1:
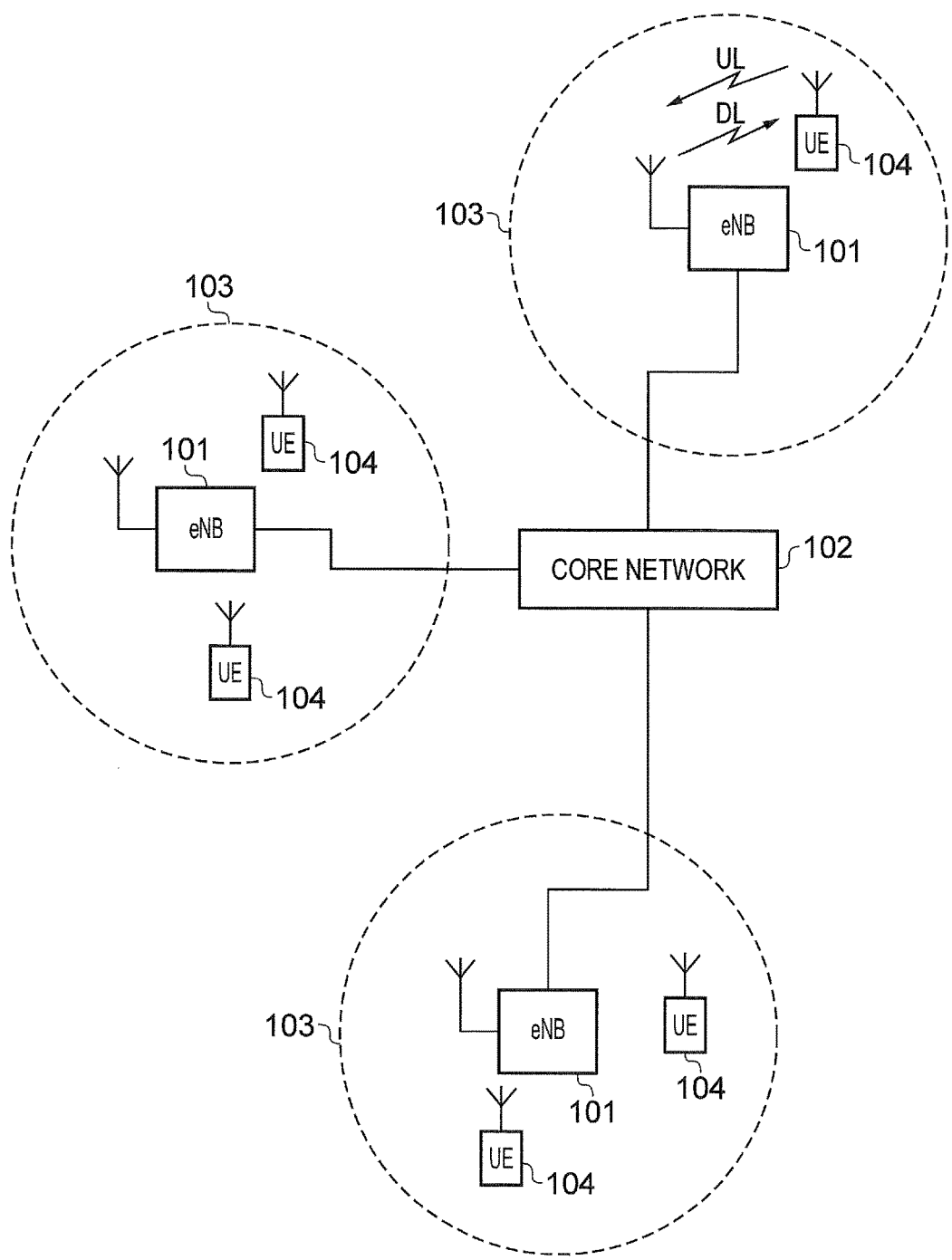
FIG. 1 is a schematic diagram of a mobile communications system operating in accordance with the LTE standard.

FIG. 1 provides a schematic diagram of a conventional mobile telecommunications system 100, where the system includes mobile communications devices 101, infrastructure equipment 102 and a core network 103. The infrastructure equipment may also be referred to as a base station, network element, enhanced Node B (eNodeB) or a coordinating entity for example, and provides a wireless access interface to the one or more communications devices within a coverage area or cell. The one or more mobile communications devices may communicate data via the transmission and reception of signals representing data using the wireless access interface. The network entity 102 is communicatively linked to the core network 103 where the core network may be connected to one or more other communications systems or networks which have a similar structure to that formed from communications devices 101 and infrastructure equipment 102. The core network may also provide functionality including authentication, mobility management, charging and so on for the communications devices served by the network entity. The mobile communications devices of FIG. 1 may also be referred to as communications terminals, user equipment (UE), terminal devices and so forth, and are configured to communicate with one or more other communications devices served by the same or a different coverage area via the network entity. These communications may be performed by transmitting and receiving signals representing data using the wireless access interface over the two way communications links represented by lines 104 to 109, where 104, 106 and 108 represent downlink communications from the network entity to the communications devices and 105, 107 and 109 represent the uplink communications from the communications devices to the network entity. The communications system 100 may operate in accordance with any known protocol, for instance in some examples the system 100 may operate in accordance with the 3GPP Long Term Evolution (LTE) standard where the network entity and communications devices are commonly referred to as eNodeB and UEs, respectively.

As will be appreciated from the operation explained above at the physical layer the UEs and the eNodeBs are configured to transmit and receive signals representing data. As such a typical transmitter/receiver chain is shown in FIGS. 2 and 3.

Figure 2:
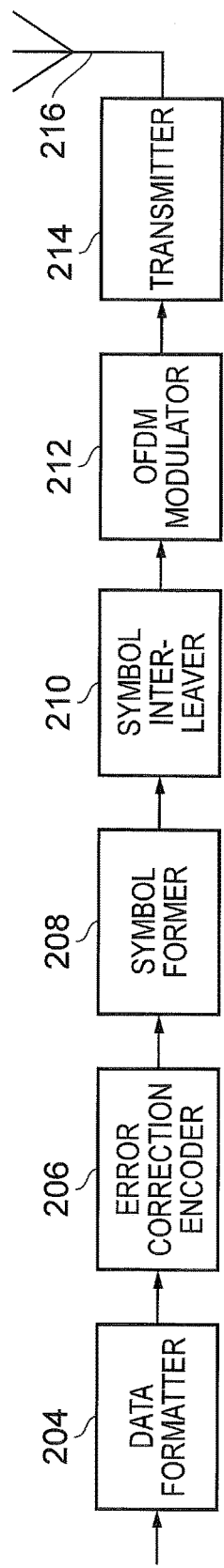
FIG. 2 is a schematic block diagram of an example transmitter for the LTE system shown in FIG. 1.

FIG. 2 provides a schematic block diagram illustrating components which make up a transmitter which may form part of the e-NodeB 101 or a communications device 104 of the physical layer transmission via the wireless access interface of the LTE system as illustrated in FIG. 1. In FIG. 2, data is received via an input 201 at a data formatter 204 and formed into frames or sub frames for transmission. Frames of data are then encoded with an error correction code by an error correction encoder 206 and fed to a symbol former 208 which forms the error correction encoded bits into groups of bits for mapping on to symbols for modulation. The data symbols are then interleaved by a symbol interleaver 210 and fed to an OFDM modulator 212 which modulates the subcarriers of an OFDM symbol with the data symbols which have been received from the interleaver 210. The OFDM symbols are then converted to an RF frequency and transmitted by a transmitter 214 via an antenna 216.

Correspondingly, a receiver operating to receive data transmitted via the physical layer for either the communications device 104 or an eNodeB 101 via an LTE wireless access interface includes a receiver antenna 301, which detects the radio frequency signal transmitted via the wireless access interface to a radio frequency receiver 302. FIG. 3 represents a simplified version of a receiver and several blocks will make up an OFDM demodulator/equaliser 304 which converts the time domain OFDM symbol into the frequency domain and demodulates the subcarriers of the OFDM symbol to recover the data symbols and performs deinterleaving etc. However an output of the OFDM demodulator/equaliser 304 is to feed the encoded soft decision values representing the data bits to a turbo decoder 306. The turbo decoder performs a turbo decoding algorithm to detect and recover an estimate of the transmitted data bits which are output as a stream of data bits on an output 308 corresponding to the input 201.

Figure 3:
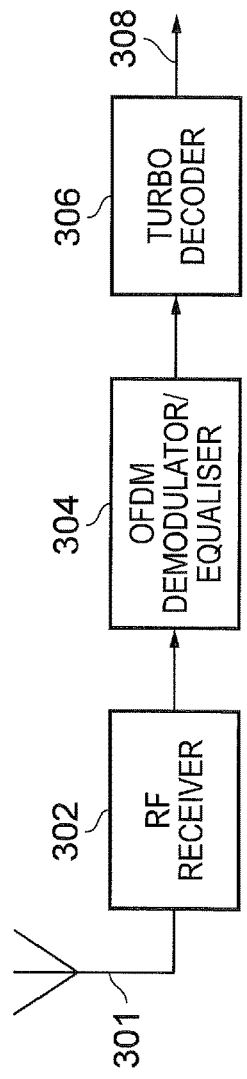
FIG. 3 is a schematic block diagram of an example receiver for the LTE system shown in FIG. 1.

It will be appreciated that FIGS. 2 and 3 have been drawn in order to illustrate an example embodiment of the present technique in which a fully parallel turbo decoder performs detection of the data bits encoded by the error correction encoder 206. However, it will be appreciated that the generalisation of the turbo detection process in accordance with the embodiments of the present invention can be provided to other parts of the receiver chain, notably for some systems which suffer from Inter-Symbol-Interference as a turbo equaliser and so the term detector is used generally to refer to both equalisation, demodulation and error correction decoding in which fully parallel turbo decoding algorithm in accordance with the present technique can be applied. As mentioned above, other applications of the fully parallel turbo algorithm include recovery of Markov chains of data in other applications that are typically decoded using the Log-BCJR algorithm, such as equalisation, synchronisation, channel estimation, LDPC decoding and source decoding.

Figure 4:
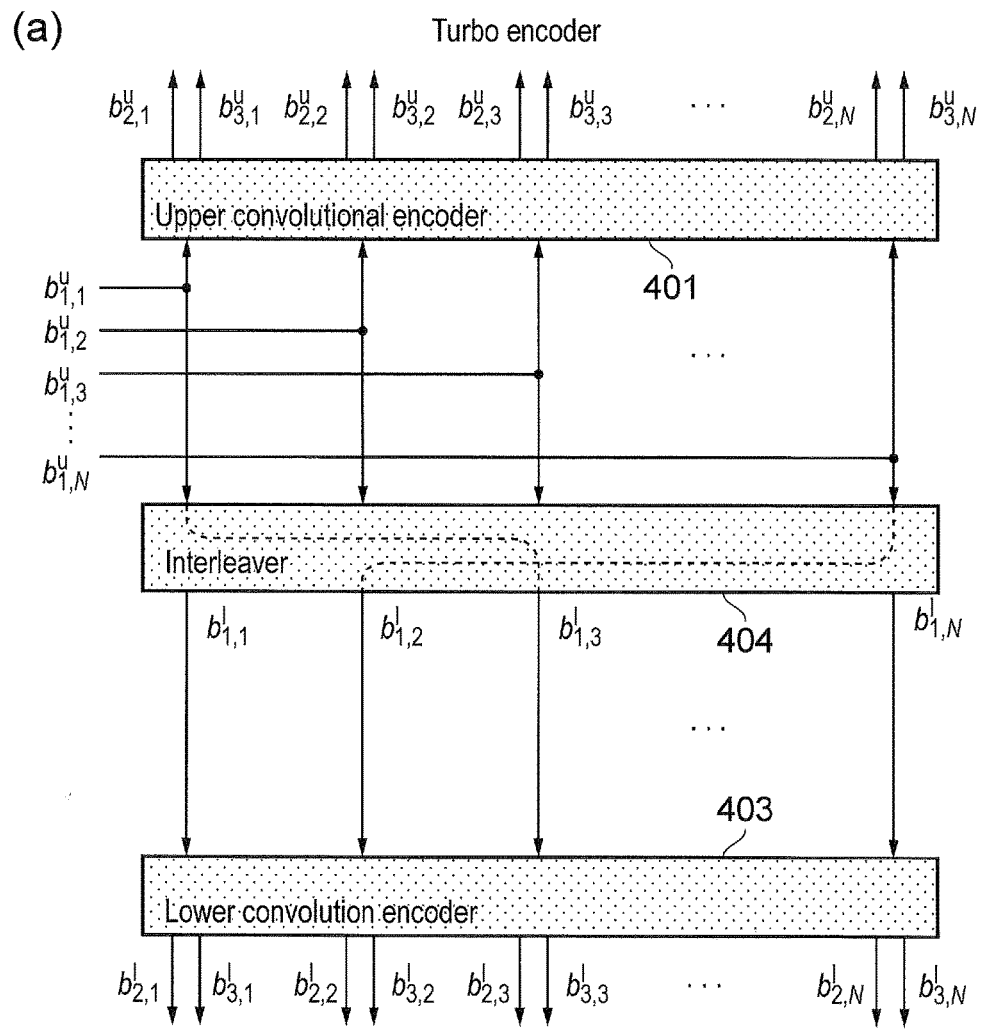
FIG. 4 is a schematic block diagram of a simplified turbo encoder for an LTE standard or a WiMAX standard.

For the example of LTE as mentioned above, an example embodiment of an error correction encoder 206 shown in FIG. 2 is shown in FIG. 4. FIG. 4 provides an example representation illustrating a simplified turbo encoder, which encodes a message frame $b_1^u = [b_{1,k}^u]_{k=1}^N$ comprising N number of bits, each having a binary value $b_{1,k}^u \in \{0, 1\}$. This message frame is provided to an upper convolutional encoder 401, and a lower convolutional encoder 403, as shown in FIG. 4. The upper convolutional encoder 401 performs a convolutional encoding process such as the examples provided below to generate two N-bit encoded frames, namely a parity frame $b_2^u=[b_{2,k}^u=]b_{k=1}^N$ and a systematic frame $b_3^u=[b_{3,k}^u]_{k=1}^N$. Meanwhile, the message frame $b_1^u$ is interleaved, by an internal turbo encoding interleaver 404, in order to obtain the N-bit interleaved message frame $b_1^l=[b_{1,k}^l]_{k=1}^N$ which, as shown in FIG. 4 is provided to a lower convolutional encoder 403, which also applies a convolutional encoder to generate two more N-bit encoded frames, namely a parity frame $b_2^l=[b_{2,k}^l]_{k=1}^N$ and a systematic frame $b_3^l=[b_{3,k}^l]_{k=1}^N$. Here, the superscripts 'u' and 'l' indicate relevance to the upper and lower convolutional encoders 401, 403, respectively. However, in the following, these superscripts are only used when necessary to explicitly distinguish between the two convolutional encoders 401, 403 of the turbo encoder and are omitted when the discussion applies equally to both. Note that the turbo encoder represents the N-bits of the message frame $b_1^u$ using four encoded frames, comprising a total of 4N-bits and resulting in a turbo coding rate of $R=N/(4N)=¼$.

As explained above with reference to FIG. 2, following turbo encoding, the encoded frames may be modulated onto a wireless channel and transmitted to a receiver, such as the example provided in FIG. 3.

LTE Turbo Encoder

Figure 5:
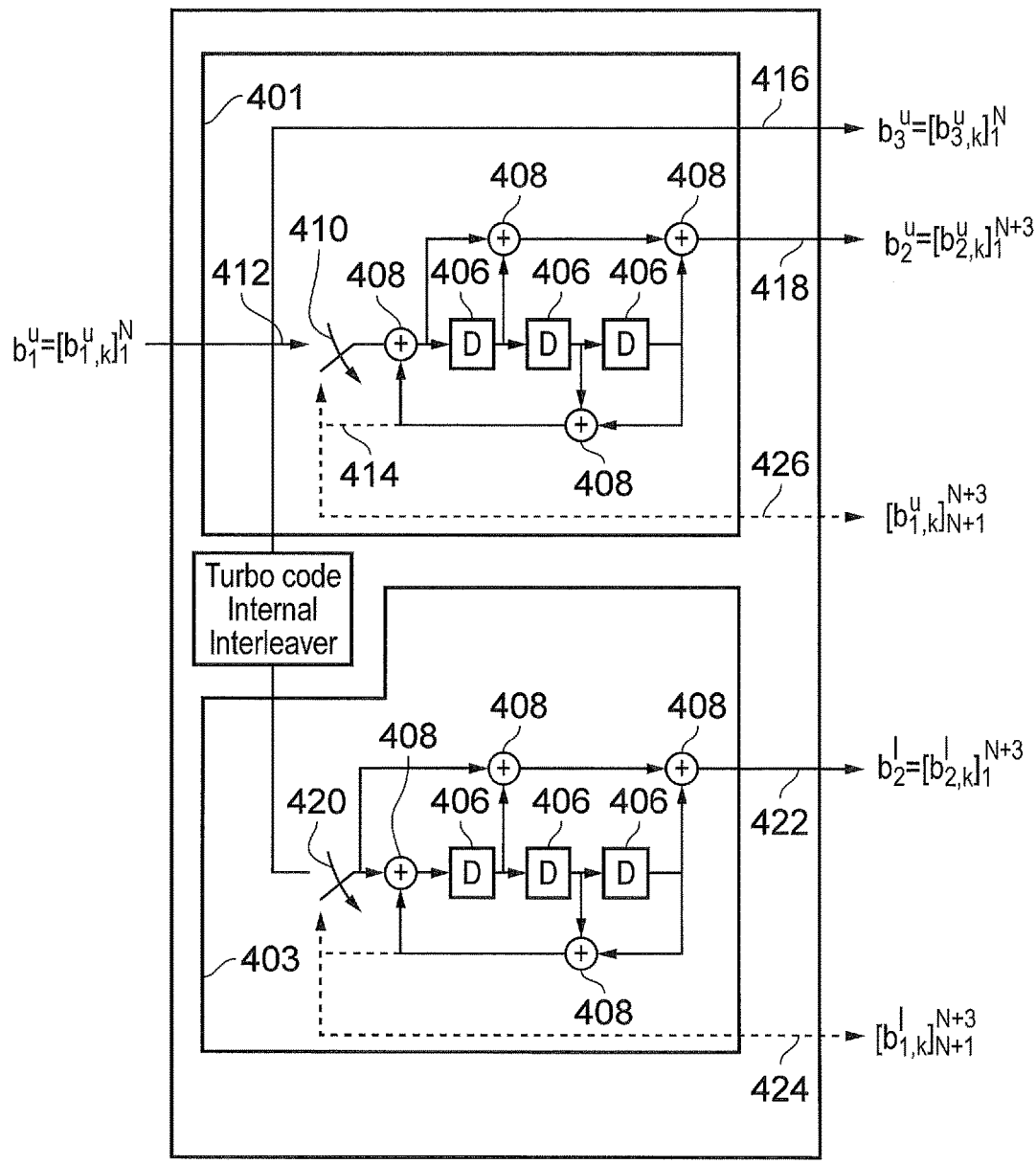
FIG. 5 is a schematic block diagram showing a more detailed example of an LTE turbo encoder.

A more specific example of a turbo encoder is provided in FIG. 5. FIG. 5 provides an example of a turbo encoder, which corresponds to an example which has been proposed for the LTE standard [1]. For the example shown in FIG. 5 the turbo encoder is a 1/3 rate code in which data bits received from a data formatter 204 as shown in FIG. 2 are fed to an upper convolutional encoding processor 401. As can be seen in FIG. 5 the received N-bits of the message frame $b_1^u=[b_{1,k}^u]_{k=1}^N$ are also fed to a lower convolutional encoding processor 403 via a turbo code internal interleaver 404. In accordance with a known arrangement the N-bits of the message frame $b_1^u=[b_{1,k}^u]_{k=1}^N$ are fed to memory elements 406 which are connected to other memory elements 406 to form a shift register type arrangement. An output of the memory elements 406 is used to form an input to XOR units 408, which form at their output a bit from a logical XOR of their inputs, which forms either an encoded output bit or a bit which is fed back as an input to one of the memory elements 406. A switch in the upper convolutional encoder 410 switches the input bits between an input 412 and an output of the upper convolutional encoder 414 to form respectively, on a first output 416, a systematic frame $b_3^u=[b_{3,k}^u]_{k=1}^N$, and on a third output 426, three message termination bits $[b_{1,k}^u]_{k=N+1}^{N+3}$. A second output 418 of the upper convolutional encoder 401 provides a parity frame $b_2^2=[b_{2,k}^u]_{k=1}^{N+3}$. In FIG. 5 the three message termination bits $[b_{1,k}^u]_{k=N+1}^{N+3}$ are used to terminate the upper convolutional encoder 401 in a known state, which is not shown in FIG. 4 for simplicity.

In the lower convolutional encoder 403 a switch 420 switches between the received bits from the internal interleaver 404 and corresponds to the switch 410 for the upper convolutional encoder. In a similar manner to the upper convolutional encoder, output channels 422, 424 of the lower convolutional encoder provide respectively a parity frame $b_2^l=[b_{2,k}^l]_{k=1}^{N+3}$ and three message termination bits $[b_{1,k}^l]_{k=N+1}^{N+3}$. The systematic data bits of the lower convolutional encoder $b_3^l=[b_{3,k}^l]_{k=1}^N$ are not output from the lower convolutional encoder because these are already present on the first output 416. Accordingly, with the first output 416 providing the input bits as a systematic code the second and fourth outputs 418, 422 providing respective parity bits, the turbo encoder provides a 1/3 rate code. As with the upper convolutional encoder, three message termination bits $[b_{1,k}^l]_{k=N+1}^{N+3}$ are used to terminate the lower convolutional encoder 403 in a known state, which is not shown in FIG. 4 for simplicity.

In summary, the LTE turbo encoder [1] of FIG. 5 employs twelve additional termination bits to force each convolutional encoder into the final state $S_{N+3}=0$. More specifically, the upper convolutional encoder 401 generates the three message termination bits $b_{1,N+1}^u$, $b_{1,N+2}^u$, $b_{N+3}^u$ as well as the three parity termination bits frame $b_{2,N+1}^u$, $b_{2,N+2}^u$, $b_{2,N+3}^u$. The lower convolutional encoder 403 operates in a similar manner, generating corresponding sets of three message termination bits $b_{1,N+3}^l$, $b_{1,N+2}^l$, $b_{1,N+3}^l$ as well as the three parity termination bits $b_{2,N}^l$, $b_{N+1}^l$, $b_{2,N+3}^l$. In contrast to the systematic frame $b_3^u$ that is produced by the upper convolutional encoder, that of the lower convolutional encoder $b_3^l$ is not output by the LTE turbo encoder. Owing to this, the LTE turbo encoder uses a total of (3N+12) bits to represent the N bits of the message frame $b_1^u$, giving a coding rate of $R=N/(3N+12)$.

Figure 6:
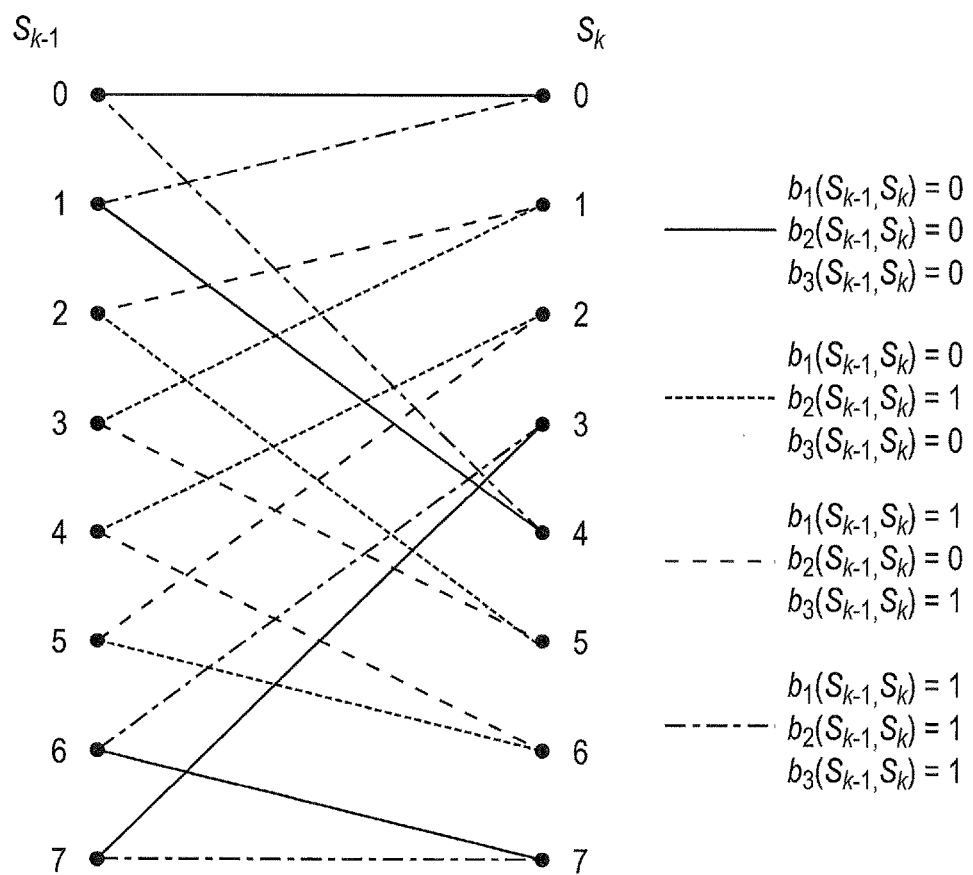
FIG. 6 is an illustration of state and state transitions representing encoding using a convolutional encoder forming part of the turbo encoder of FIG. 5.

The example of the turbo encoder presented in FIG. 5 provides upper and lower convolutional encoders 401, 403, which each have three memory elements 406. As will be known by those acquainted with convolutional encoders, the binary content of the memory elements 406 can be interpreted as a state, so that the convolutional encoding process can be synthesised as transitions through a trellis comprising the possible states of the convolutional encoder. As such, a convolutional encoder or a turbo encoder can be described as a Markov process and therefore represented as a trellis diagram. An example of state transition diagram for a convolutional encoder is shown in FIG. 6. The state transition diagram of FIG. 6 represents one stage of a trellis having M=8 states and K=2 transitions per state, and can therefore provide an example corresponding to the upper and lower convolutional encoders 401, 403, which operate in the same manner. For the upper convolutional encoder 401 begins from an initial state of $S_0=0$ and successively transitions into each subsequent state $S_k \in \{0, 1, 2, \ldots, M-1\}$ by considering the corresponding message bit $b_{1,k}$. Since there are two possible values for the message bit $b_{1,k} \in \{0,1\}$ there are K=2 possible values for the state $S_k$ that can be reached by transitioning from the previous state $S_k-1$. In FIG. 6 for example, a previous state of $S_k-1=0$ implies that the subsequent state is selected from $S_k \in \{0,4\}$. This example can also be expressed using the notation $c(0,0)=1$ and $c(0,4)=1$, where $c(S_{k-1},S_k)=1$ indicates that it is possible for the convolutional encoder to transition from $S_{k-1}$ into $S_k$, whereas $c(S_{k-1}, S_k)=0$ indicates that this transition is impossible. Of the K=2 options, the value for the state $S_k$ is selected such that $b_1(S_{k-1},S_k)=b_{1,k}$. For example, $S_{k-1}=0$ and $b_{1,k}=0$ gives $S_k=0$, while $S_{k-1}=0$ and $b_{1,k}=1$ gives $S_k=4$ in FIG. 6. In turn, binary values are selected for the corresponding bit in the parity frame $b_2$ and the systematic frame $b_3$, according to $b_{2,k}=b_2(S_{k-1},S_k)$ and $b_{3,k}=b_3(S_{k-1},S_k)$. In the example of FIG. 6, $S_{k-1}=0$ and $S_k=0$ gives $b_{2,k}=0$ and $b_{3,k}=0$, while $S_{k-1}=0$ and $S_k=4$ gives $b_{2,k}=1$ and $b_{3,k}=1$.

Turbo Encoder Internal Bit Interleaver

As explained above, turbo encoders typically include an internal bit interleaver 404, which interleaves the data bits from the order in which they are encoded between the upper and the lower convolutional encoders 401, 403. For example, the LTE turbo encoder shown in FIG. 5, employs an odd-even interleaver [14] that supports various frame lengths N in the range 40 to 6144 bits.

Example WiMAX Turbo Encoder

Like the example of an LTE turbo encoder, a turbo encoder which operates in accordance with the WiMAX standard [2] employs an odd-even interleaver, supporting various frame lengths N in the range 24 to 2400 bits. However, in contrast to the LTE turbo encoder, the WiMAX turbo encoder is duobinary [2]. More specifically, the upper WiMAX convolutional encoder encodes two N-bit message frames at once $b_1^u$ and $b_2^u$. In response, a turbo encoder which operates in accordance with the WiMAX standards produces four N-bit encoded frames, namely two parity frames $b_3^u$ and $b_4^u$, as well as two systematic frames $b_5^u$ and $b_6^u$. Meanwhile, the message frames $b_1^I$ and $b_2^I$ are interleaved, in order to obtain two N-bit interleaved message frames $b_1^I$ and $b_2^I$. These two N-bit interleaved message frames $b_1^I$ and $b_2^I$ are encoded by a lower convolutional encoder 403, in order to generate two parity frames $b_3^I$ and $b_4^I$. As for the example of the LTE turbo encoder however, the lower encoder's N-bit systematic frames $b_5^I$ and $b_6^I$ are not output by a WiMAX turbo encoder. Therefore, a WiMAX turbo encoder represents the 2N bits of the message frames $b_1^u$ and $b_2^u$ using six encoded frames, comprising a total of 6N bits and resulting in a coding rate of R=(2N)/(6N)=⅓. In a WiMAX turbo encoder, the upper and lower convolutional encoders 401, 403 operate on the basis of a state transition diagram having K=4 transitions from each of M=8 states, in correspondence to the four possible combinations of the two message bits. Rather than employing termination bits, WiMAX employs tail-biting to ensure that $S_N = S_0$, which may require $S_N$ and $S_0$ to have non-zero values.

Turbo Decoder Using Log BCJR-Algorithm

The section above has described a turbo encoder as shown in FIG. 2 with reference to FIGS. 4, 5 and 6. Embodiments of the present technique can provide a fully-parallel turbo decoder, which has an improved rate of decoding, a smaller memory requirements and a reduced number of arithmetic calculations to implement in comparison to conventional algorithms. In order better appreciate the improvement provided by the present technique with respect to conventional turbo decoders or detectors, a conventional turbo decoder which operates in accordance with the conventional log BCJR algorithm will first be described, which is configured to decode a turbo encoded frame of data bits which has been turbo encoded in accordance with an example of turbo encoder as explained above with reference to FIGS. 4, 5 and 6 according to the LTE standard.

Figure 7:
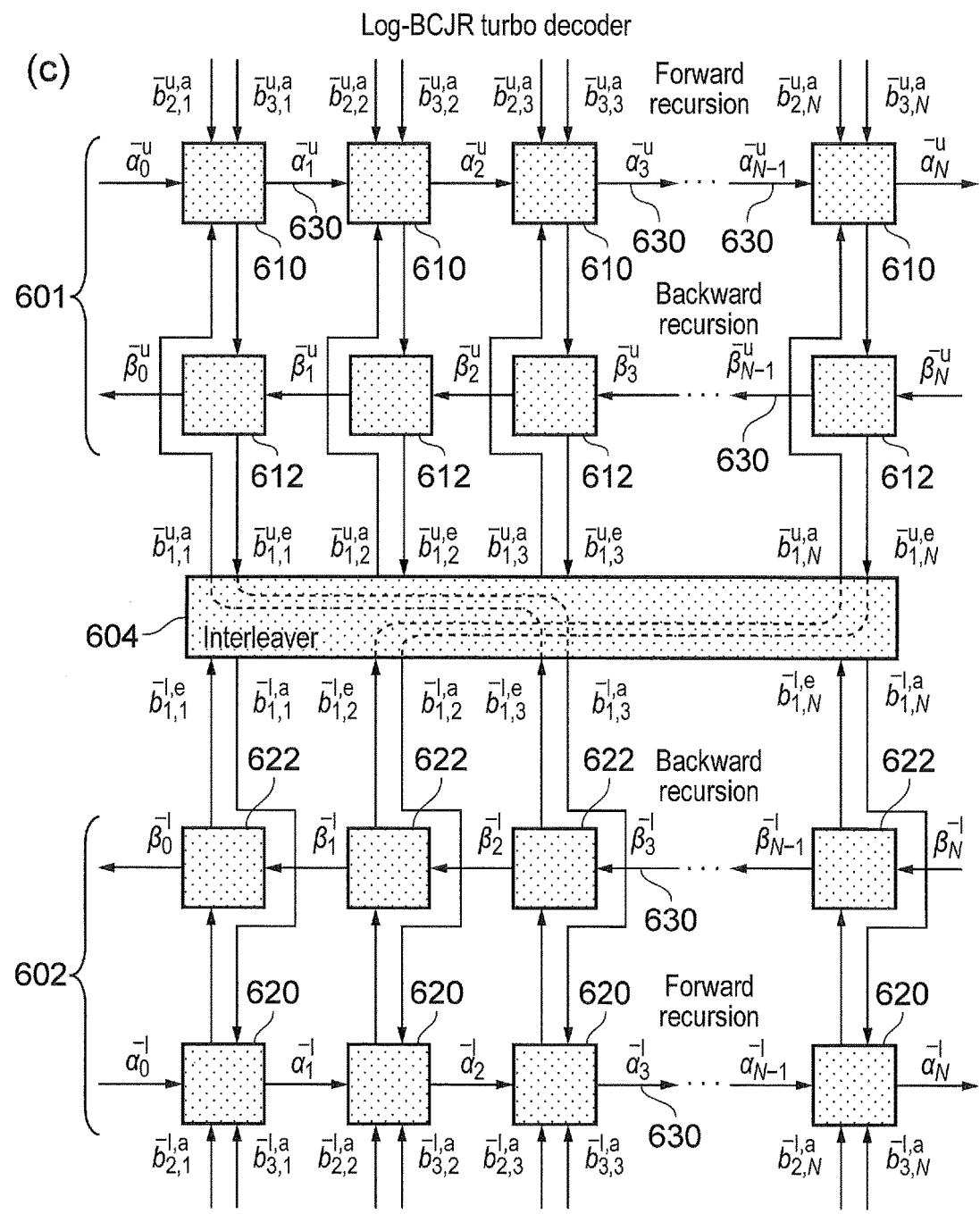
FIG. 7 is a schematic block diagram of an example turbo decoder according to a Log-BCJR algorithm.

Following their transmission over a wireless channel, the four encoded frames $b_2^u$, $b_3^u$, $b_2^I$ and $b_3^I$, generated by the turbo encoder as illustrated in FIG. 4, may be demodulated and provided to the turbo decoder of FIG. 7. However, owing to the effect of noise in the wireless channel, the demodulator will be uncertain of the bit values in these encoded frames. Therefore, instead of providing frames comprising N hard-valued bits, the demodulator provides four frames each comprising N soft-valued a priori Logarithmic Likelihood Ratios (LLRs) $\bar{b}_2^{u,a}=[\bar{b}_{2,k}^{u,a}]_{k=1}^N$, $\bar{b}_3^{u,a}=[\bar{b}_{3,k}^{u,a}]_{k=1}^N$, $\bar{b}_2^{I,a}=[\bar{b}_{2,k}^{I,a}]_{k=1}^N$, and $\bar{b}_3^{I,a}=[\bar{b}_{3,k}^{I,a}]_{k=1}^N$. Here, sere, an LLR to bit $b_{j,k}$ is defined by $$\bar{b}_{j,k} = \ln \frac{Pr(b_{j,k}=1)}{Pr(b_{j,k}=0)}, \quad (1)$$

where the superscripts 'a', 'e' or 'p' may be appended to indicate an a priori, extrinsic or a posteriori LLR, respectively.

The Log-BCJR algorithm generally forms a decoding or detection process which performs a forward recursion process and a backward recursion process through a trellis representing the connection of each of the states of a Markov process, such as a convolutional encoder. For the turbo encoded data, a decoder which performs a Log-BCJR decoding process comprises a upper decoder and a lower decoder. Each of the upper and lower decoders each perform a forward recursion process and a backward recursion process and generate for each iteration extrinsic LLRs which are fed to other of the upper and lower decoders.

FIG. 7 provides a schematic block diagram illustrating an example implementation of a simplified turbo decoder for the Log-BCJR algorithm, which corresponds to the simplified turbo encoder of FIG. 4. The Log-BCJR turbo decoder is operated iteratively, where each of the I iterations comprises the operation of all processing elements or algorithmic blocks shown. During the forward and backward recursions of the Log-BCJR algorithm, the $k^{th}$ pair of algorithmic blocks in the upper and lower rows perform calculations relating to one stage of the trellis according to Equations (2)-(6) [4]:

$$\bar{\gamma}_k(S_{k-1}, S_k) = [\Sigma_{j=1}^L [b_j(S_{k-1}, S_k) \cdot \bar{b}_{j,k}^a]] + \ln[Pr\{S_k|S_{k-1}\}] \quad (2)$$

$$\bar{\alpha}_k(S_k) = \max^*_{\{S_{k-1}|c(S_{k-1}, S_k)=1\}} [\bar{\gamma}_k(S_{k-1}, S_k) + \bar{\alpha}_{k-1}(S_{k-1})] \quad (3)$$

$$\bar{\beta}_{k-1}(S_{k-1}) = \max^*_{\{S_k|c(S_{k-1}, S_k)=1\}} [(\bar{\gamma}_k(S_{k-1}, S_k) + \bar{\beta}_k(S_k)] \quad (4)$$

$$\bar{\delta}_k(S_{k-1}, S_k) = \bar{\gamma}_k(S_{k-1}, S_k) + \bar{\alpha}_{k-1}(S_{k-1}) + \bar{\beta}_k(S_k) \quad (5)$$

$$\bar{b}_{j,k}^e = [\max^*_{\{(S_{k-1}, S_k)|b_j(S_{k-1}, S_k)=1\}} [\bar{\delta}_k(S_{k-1}, S_k)]] - [\max^*_{\{(S_{k-1}, S_k)|b_j(S_{k-1}, S_k)=0\}} [\bar{\delta}_k(S_{k-1}, S_k)]] - \bar{b}_{j,k}^a \quad (6)$$

The term $\ln[Pr\{S_k|S_{k-1}\}]$ in equation (2) has been included to increase the generality of the Log-BCJR algorithm, so as to illustrate that the present technique can be applied to applications beyond channel decoding. This term facilitates the exploitation any additional a priori knowledge that the receiver has for the probability $Pr\{S_k|S_{k-1}\}$ of entering the state $S_k$ given that the previous state $S_{k-1}$ has been entered. This could source from knowledge of the channel characteristics and from information received over the channel, for coded demodulation or turbo equalization. When used for source decoding, this could source from knowledge of the source probability distribution. Similarly, this additional term provides for numerous other applications, including turbo synchronization and turbo channel estimation. In applications such as turbo decoding where no additional a priori knowledge is available, then this term can be omitted or set to a constant value and so in the following discussion can be ignored.

As shown in FIG. 7, a first set of 2N processing elements or algorithmic blocks 601 are devoted to performing a first part of the turbo decoding algorithm on the turbo encoded data produced by an upper convolutional encoder 401. A first row of N processing elements 610 of the upper decoder 601 are devoted to performing a forward recursion process through a trellis of possible states, whereas a second row of N processing elements 612 are devoted to performing backward recursion through the trellis stages according to the Log-BCJR algorithm. Each processing element corresponds to one of the N stages in the trellis, which comprises a set of transitions between a set of previous states and a set of next states. A second set of 2N processing elements or algorithmic blocks 602 are devoted to performing a second part of the turbo decoding algorithm on the turbo encoded data produced by the lower convolutional encoder 403. As for the upper decoder 601, the lower decoder includes a first row of N processing elements 620 of the lower decoder 602, which are devoted to performing a forward recursion process through a trellis of possible states, whereas a second row of N processing elements 622 are devoted to performing backward recursion through the trellis states according to the Log-BCJR algorithm.

The $k^{th}$ processing element 610, of the N processing elements 610 of the upper decoder 60 which are devoted to performing the forward recursion part of the Log-BCJR algorithm 610, is arranged to receive the $k^{th}$ LLR values $\bar{b}_{2,k}^{u,a}$, $\bar{b}_{3,k}^{u,a}$, from the demodulator which were estimated for the frames of encoded bits $b_2^u$, $b_3^u$, generated by the upper encoder 401. Correspondingly, the $k^{th}$ processing element 620 of the N processing elements 620 of the lower decoder 602, which are devoted to performing the forward recursion part of the Log-BCJR algorithm, is arranged to receive the $k^{th}$ LLR values $\bar{b}_{2,k}^{l,a}$, $\bar{b}_{3,k}^{l,a}$, from the demodulator which were estimated for the frames of encoded bits $b_2^l$, $b_3^l$, generated by the lower encoder 402.

The $k^{th}$ processing element 610, 620, which each in turn are arranged to perform the forward recursion, in the upper detection processor 601 and the lower detection processor 602, one after the other serially employs equation (2) (without the term $\ln[\Pr\{S_k|S_{k-1}\}]$ for the present example) to combine the L=3 a priori LLRs $\bar{b}_{1,k}^a$, $\bar{b}_{2,k}^a$, and $b_{3,k}^a$, in order to obtain an a priori metric $\bar{\gamma}_k(S_{k-1},S_k)$ for each transition in the state transition diagram (as illustrated for example in FIG. 6). Following this calculation, each of the $k^{th}$ processing elements 610, 620 performing the forward recursion, combines these a priori transition metrics with the a priori forward state metrics of $\bar{\alpha}_{k-1}(S_{k-1})$ according to equation (3), in order to obtain the extrinsic forward state metrics of $\bar{\alpha}_k(S_k)$. These extrinsic state metrics are then passed to the $k+1^{th}$ processing element 610, 620, to be employed as a priori state metrics in the next time period. However as will be appreciated by those familiar with the Log-BCJR algorithm the upper and lower decoders of the turbo decoder work alternately, so that when one is active the other is idle.

The $k^{th}$ processing element 612, 622, which are performing the backward recursion, in the upper turbo decoder 601 and the lower turbo decoder 602 employs equation (4) to combine the a priori metric $\bar{\gamma}_k(S_{k-1},S_k)$ for each transition with the a priori backward state metrics $\bar{\beta}_k(S_k)$. This produces an extrinsic backward state metric $\bar{\beta}_{k-1}(S_{k-1})$, which may be passed to the $k-1^{th}$ processing element, to be employed as a priori state metrics in the next time period. Furthermore, the $k^{th}$ processing element 612, 622, which are performing the backward recursion, in the upper turbo decoder 601 and the lower turbo decoder 602 employs equation (5) to obtain an a posteriori metric $\bar{\delta}_k(S_{k-1},S_k)$ for each transition in the state transition diagram (as for example illustrated in FIG. 5). Finally, the $k^{th}$ processing element 612, 622, which are performing the backward recursion, in the upper turbo decoder 401 and the lower turbo decoder employs equation (6) to generate an extrinsic message LLR $\bar{b}_{j,k}^e$ for the $k^{th}$ bit. These LLR values are swapped between the upper and lower decoders 601, 602.

The upper decoder 601 and the lower decoder 602 exchange extrinsic LLRs for each of the data bits of the frame, which become an estimate of the systematic bits of the encoded data frame. More specifically, an interleaver 604 performs deinterleaving of the LLR values of data bits passed between an upper decoder 601 and the lower decoder 602, to reverse the interleaving of the data bits which are used by the upper convolutional encoder 401 and the lower convolutional encoder 402 of a turbo encoder.

The interleaver 604 exchanges extrinsic information with the other decoder 601, 602, which uses it as a priori information. More specifically, as shown in FIG. 7 the $k^{th}$ algorithmic block 612 which is performing the backward recursion in the upper decoder 601 provides as an output an extrinsic estimate of the LLR value for the message data bit $\bar{b}_{1,k}^{u,e}$ to the interleaver 604, which after interleaving forms the a priori LLR value $\bar{b}_{1,k}^{l,a}$ as input to the $k^{th}$ processing element 620, which is performing the forward recursion in the lower decoder 602.

For a first decoding iteration of the Log-BCJR turbo decoder, zero-values are employed for the a priori message LLRs. The simplified example decoder of FIG. 7 can be applied to the example turbo encoders for the LTE standard and the WiMAX standard, using the Log-BCJR algorithm of (2)-(6) decoder having L=3 and L=2 a priori LLRs for the LTE encoder, as well as the blocks of the WiMAX turbo code having L=6 and L=4. Depending on whether termination or tailbiting is employed, values for $\bar{\alpha}_0$ and $\bar{\beta}_N$ can be selected for the Log-BCJR turbo decoder.

Disadvantages of Conventional Turbo Decoders

As will be appreciated in the explanation of the turbo decoder according to a conventional arrangement of the Log-BCJR decoding process above, each of the respective detection processors must wait until the forward recursion has been completed and the backward recursion has been completed before outputting the extrinsic LLR information to corresponding processing elements in the other of the upper and lower detection processor, via the interleaver 604. Furthermore, a Log-BCJR turbo decoder is operated iteratively, where each of the I iterations comprises the operation of all processing elements or algorithmic blocks shown in FIG. 7. As such, T=4N consecutive time periods are required to complete each decoding iteration, so that the 4N algorithmic blocks are operated sequentially, in the order indicated by the bold arrows 630 of FIG. 7. These arrows 630 indicate the data dependencies of the Log-BCJR algorithm, which impose the forward and backward recursions shown in FIG. 7. Therefore, as explained below, when implementing the LTE or WiMAX turbo decoders, the number of time periods required by the Log-BCJR algorithm is 2N Times that of the Proposed (TtotP) fully-parallel turbo decoder embodying the present technique, which requires T=1 or T=2 time periods as discussed below.

Fully Parallel Turbo Decoder

In contrast to the Log-BCJR algorithm, a detector which operates in accordance with an embodiment of the present technique is configured to remove as far as possible data dependencies, thereby facilitating fully-parallel turbo decoding. More specifically, the proposed fully-parallel algorithm can process all turbo-encoded bits in both components of the turbo code at the same time. This process is repeated iteratively, until a sufficient number of decoding iterations have been performed. Owing to this, the iterative decoding process can be completed using just tens of time periods, which is significantly lower than the number required by the state-of-the-art turbo decoder of [10]. Note that a number of fully-parallel turbo decoders have been previously proposed, although these suffer from significant disadvantages that are not manifested in detectors/decoders embodying the present technique. In [11], the min-sum algorithm is employed to perform turbo decoding. However, this approach only works for a very limited set of turbo code designs, which does not include those employed by any standards, such as LTE and WiMAX. A fully-parallel turbo decoder implementation that represents the soft information using analogue currents was proposed in [12], however it only supports very short message lengths N. Similarly, [13] proposes a fully-parallel turbo decoder algorithm that operates on the basis of stochastic bit sequences. However, this algorithm requires significantly more time periods than the Log-BCJR algorithm, therefore having a significantly lower processing throughput.

Other proposals have been made to improve a rate of performing turbo detection. For example, CN 102611464 [17], CN 102723958 [18], WO 2011/082509 [19] and a published article entitled "A 122 Mb/s Turbo decoder using a mid-range GPU" by Xianjun J., et al [20] there are disclosed turbo decoders with improved processing performance and reduced complexity. The article entitled "A 122 Mb/s Turbo decoder using a mid-range GPU" by Xianjun J., et al [20] discloses using a plurality of processing elements referred to as sub-decoder, each processing element being assigned to one bit of a code block. As such there is an improvement in the parallel processing which is possible. However in contract with embodiments of the present technique the decoder referred to in the above mentioned article does not operate the decoders at the same time.

Figure 8:
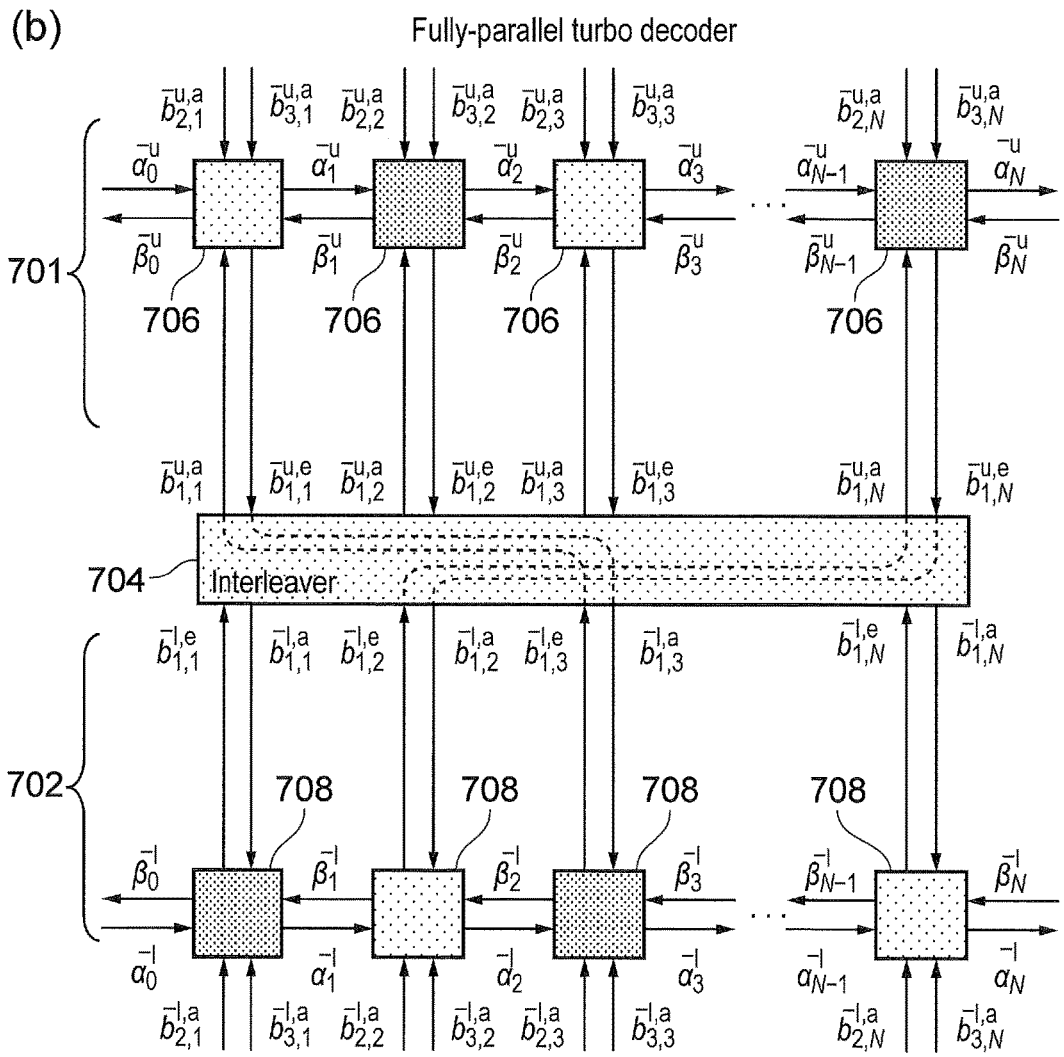
FIG. 8 is a schematic block diagram of a fully-parallel turbo decoder according to an example embodiment of the present technique.

Embodiments of the present technique can provide a fully parallel arrangement of processing to perform a turbo decoding process which is based on the Log-BCJR turbo decoding algorithm but simplified in order to allow all of the processing elements to operate in parallel. FIG. 8 provides an example but simplified arrangement of a fully parallel decoding technique. In FIG. 8, the respective upper and lower turbo decoding parts 701, 702 correspond to the upper and lower turbo decoding parts of the Log-BCJR algorithm 601, 602, but are replaced with N parallel processing elements or algorithmic blocks 706, 708. Thus the upper decoder 701 is comprised of N processing elements 706 whereas the lower decoder 702 is comprised of Nprocessing elements 708.

As shown in FIG. 8 and in correspondence with the operation of the Log-BCJR algorithm, the demodulator in the receiver of FIG. 3, provides the a priori LLRs to the turbo decoder's 2N processing elements 708, 706 (algorithmic blocks), which as shown in FIG. 8 are arranged in two rows. More specifically, following their transmission over a wireless channel, the four encoded frames $b_2^u$, $b_3^u$, $b_2^l$ and $b_3^l$ are demodulated and provided to the turbo decoder of FIG. 8. The demodulator provides four frames each comprising N soft-valued a priori Logarithmic Likelihood Ratios (LLRs) $\bar{b}_2^{u,a}=[\bar{b}_{2,k}^{u,a}]_{k=1}^N$, $\bar{b}_3^{u,a}=[\bar{b}_{3,k}^{u,a}]_{k=1}^N \bar{b}_{2,k}^{l,a}{}_{k=1}^N$, and $\bar{b}_3^{l,a}=[\bar{b}_{3,k}^{l,a}]_{k=1}^N$ to the fully-parallel turbo decoder's 2N processing elements or algorithmic blocks, with the a priori parity LLR $\bar{b}_{2,k}^{u,a}$ and the a priori systematic LLR $\bar{b}_{3,k}^{u,a}$ being provided to the $k^{th}$ algorithmic block 706 in the upper decoder 701 shown in FIG. 8. Furthermore, the interleaver 704 provides the $k^{th}$ algorithmic block in the upper decoder 701 with the a priori message LLR $\bar{b}_{1,k}^{u,a}$, as will be detailed below. Meanwhile, the $k^{th}$ algorithmic block in the lower decoder 702 is correspondingly provided with the a priori LLR values $\bar{b}_{1,k}^{l,a}$, $\bar{b}_{2,k}^{l,a}$, and $\bar{b}_{3,k}^{l,a}$. In addition to this, the $k^{th}$ algorithmic block 706, 708 in each of the upper and lower decoders 701, 702 is also provided with a vector of a priori forward state metrics $\bar{\alpha}_{k-1}=[\bar{\alpha}_{k-1}(S_{k-1})]_{S_{k-1}=0}^{M-1}$ and a vector of a priori backward state metrics $\bar{\beta}_k=[\bar{\beta}_k(S_k)]_{S_k=0}^{M-1}$, as will be detailed below. Unlike a conventional turbo decoder operating in accordance with the BCJR algorithm described above with reference to FIG. 7, each of the processing elements 706, 708 of the upper and lower decoders 701, 702 operates in an identical manner to receive the soft decision a priori LLR values of $\bar{b}_2^{u,a}=[\bar{b}_{2,k}^{u,a}]_{k=1}^N$, $\bar{b}_3^{u,a}=[\bar{b}_{3,k}^{u,a}]_{k=1}^N$ for a processing element 706 of the upper decoder 701, or $\bar{b}_2^{u,a}=[\bar{b}_{2,k}^{l,a}]_{k=1}^N$, and $\bar{b}_3^{l,a}=[\bar{b}_{3,k}^{l,a}]_{k=1}^N$ for a processing element 708 in the lower decoder 702, corresponding to one or more data symbols associated with the trellis stage and to receive a priori forward state metrics $\bar{\alpha}_{k-1}$ from one neighbouring processing element, to receive a priori backward statement metrics $\bar{\beta}_k$ from a second neighbouring processing element and to receive a priori LLR value $\bar{b}_{1,k}^a$ for the data symbol being detected for the trellis stage associated with the $k^{th}$ processing element from the second detection processor. Each processing element performs calculations associated with one trellis stage, comprising a set of transitions between a set of previous states and a set of next states. Each processing element is configured to combine the a priori forward state metrics $\bar{\alpha}_{k-1}=[\bar{\alpha}_{k-1}(S_{k-1})]_{S_{k-1}=0}^{M-1}$, the a priori backward state metrics $\bar{\beta}_k=[\bar{\beta}_k(S_k)]_{S_k=0}^{M-1}$ and the a priori LLR value $\bar{b}_{1,k}^a$ relating to the data symbol, according to the following equations (7) to (10).

$$\delta_k(S_{k-1},S_k)=[\sum_{j=1}^L [b_j(S_{k-1},S_k)\cdot \bar{b}_{j,k}^a]]+\ln[Pr\{S_k|S_{k-1}\}]+ \bar{\alpha}_{k-1}(S_{k-1})+\bar{\beta}_k(S_k) \qquad (7)$$

$$\bar{\alpha}_k(S_k)=[\max^*_{\{S_{k-1}|c(S_{k-1},S_k)=1\}}[\delta_k(S_{k-1},S_k)]]-\bar{\beta}_k(S_k) \qquad (8)$$

$$\bar{\beta}_{k-1}(S_{k-1})=[\max^*_{\{S_k|c(S_{k-1},S_k)=1\}}[\delta_k(S_{k-1},S_k)]] \bar{\alpha}_{k-1}(S_{k-1}) \qquad (9)$$

$$[\max^*_{\{(S_{k-1},S_k)|b_j(S_{k-1},S_k)=1\}}[\delta_k(S_{k-1},S_k)]]-[\max^*_{\{(S_{k-1},S_k)|b_j(S_{k-1},S_k)=0\}}[\delta_k(S_{k-1},S_k)]]-\bar{b}_{j,k}^a \qquad (10)$$

Each processing element 706, 708 therefore produces the extrinsic forward state metrics $\bar{\alpha}_k=[\bar{\alpha}_k(S_k)]_{S_k=0}^{M-1}$, and the extrinsic backward state metrics $\bar{\beta}_{k-1}=[\bar{\beta}_{k-1}(S_{k-1})]_{S_{k-1}=0}^{M-1}$ and one or more extrinsic LLR values $\bar{b}_{j,k}^e$ in accordance with the above equations (7) to (10). The processing element 706, 708 then communicates the extrinsic forward state metric $\bar{\alpha}_k$ to the second neighbouring processing element which becomes the a priori forward state metrics for a next iteration, the extrinsic backwards state metrics $\bar{\beta}_{k-1}$ to the first neighbouring processing element which becomes the a priori backward state metric for the next iteration and communicates the one or more extrinsic LLR values $\bar{b}_{j,k}^e$ for the data information to the other detection processor which become a priori LLR values for a next iteration of the turbo detection process.

As will be appreciated therefore, each of the upper and lower turbo decoders 701, 702 uses equation (7) to (10) to combine the L=3 a priori LLR values $\bar{b}_{1,k}^a$, $\bar{b}_{2,k}^a$ and $\bar{b}_{3,k}^a$, as well as the a priori forward state metrics $\bar{\alpha}_{k-1}$, the a priori backward state metrics $\bar{\beta}_k$. This produces an a posteriori transition metric $\delta_k(S_{k-1},S_k)$ for each of the possible transitions in the state transition diagram of the $k^{th}$ stage, namely for each pair of previous state $S_{k-1}$ and next state $S_k$ for which $c(S_{k-1},S_k)=1$. These a posteriori transition metrics are then combined by (8), (9) and (10), in order to produce the vector of extrinsic forward state metrics $\bar{\alpha}_{k-1}=[\bar{\alpha}_{k-1}(S_{k-1})]_{S_{k-1}=0}^{M-1}$ and the vector of extrinsic backward state metrics $\bar{\beta}_k=[\bar{\beta}_k(S_k)]_{S_k=0}^{M-1}$ and the extrinsic message LLR $\bar{b}_{1,k}^e$, respectively. These equations employ the Jacobian logarithm, which is defined for two operands as $$\max^*(\bar{\delta}_1,\bar{\delta}_2)=\max(\bar{\delta}_1,\bar{\delta}_2)+\ln(1+e^{-|(\bar{\delta}_1-\bar{\delta}_2)|}) \qquad (11)$$

and may be extended to more operands by exploiting its associativity property. Alternatively, the exact max* operator of (11) may be optionally and advantageously replaced with one of the following approximations [4]:

$$\max^*(\overline{\delta}_1,\overline{\delta}_2) \approx \max(\overline{\delta}_1,\overline{\delta}_2) \quad (12)$$

$$\max^*(\overline{\delta}_1,\overline{\delta}_2) \approx A \cdot \max(\overline{\delta}_1,\overline{\delta}_2) + B \quad (13)$$

$$\max^*(\overline{\delta}_1,\overline{\delta}_2) \approx A(\overline{\delta}_1,\overline{\delta}_2) \cdot \max(\overline{\delta}_1,\overline{\delta}_2) + B(\overline{\delta}_1,\overline{\delta}_2) \quad (14)$$

in order to reduce the complexity of the proposed fully-parallel turbo decoder, at the cost of slightly degrading its error correction performance. Note that A and B are constants in equation (12), whereas $A(\overline{\delta}_1, \overline{\delta}_2)$ and $B(\overline{\delta}_1, \overline{\delta}_2)$ are simple functions of $(\overline{\delta}_1, \overline{\delta}_2)$ in equation (14).

The proposed fully-parallel turbo decoder is operated iteratively, where each of the I iterations comprises the operation of all processing elements or algorithmic blocks shown in FIG. 8. The turbo decoder may be considered to be fully-parallel, since each iteration is completed within just T=1 time period, by operating all 2N of the algorithmic blocks simultaneously. In general, the extrinsic information produced by each algorithmic block in FIG. 7 is exchanged with those provided by the connected algorithmic blocks, to be used as a priori information in the next decoding iteration. More specifically, the $k^{th}$ algorithmic block 706, 708 in each of the upper and lower decoders 701, 702 passes the extrinsic message LLR $\overline{b}_{1,k}^e$ through the interleaver 704, to be used as an a priori LLR by the connected block or processing element 706, 708 in the other of the upper and lower decoders 701, 702 during the next decoding iteration. Meanwhile, this processing element or algorithmic block 706, 708 in the other of the upper and the lower decoder 701, 702 provides an extrinsic message LLR which is used as the a priori message LLR $\overline{b}_{1,k}^a$ during the next decoding iteration. This exchange of the extrinsic LLR message information between the upper and lower decoders 701, 702, which becomes the a priori message LLR $\overline{b}_{1,k}^a$ for the iteration in the other of the upper and lower decoders 701, 702, via the interleaver 704 corresponds substantially to the operation of the conventional Log-BCJR turbo decoder as explained above with reference to FIG. 7. However as explained below, to achieve a fully parallel turbo decoder, the $k^{th}$ processing element or algorithmic block 706, 708 in each of the upper and lower decoders provides the vectors of extrinsic forward state metrics $\overline{\alpha}_k = [\overline{\alpha}_k(S_k)]_{S_k=0}^{M-1}$ and extrinsic backward state metrics $\overline{\beta}_{k-1} = [\overline{\beta}_{k-1}(S_{k-1})]_{S_{k-1}=0}^{M-1}$ for the neighbouring algorithmic blocks to employ in the next decoding iteration.

As will be appreciated from the above explanation, embodiments of the present technique can provide a fully parallel implementation for a turbo detector or decoder. To this end, data dependencies, which are present in the Log-BCJR algorithm (illustrated by the bold arrows 630 in FIG. 7) are reduced by substituting equation (2) into (5). As a result each of the processing elements or algorithmic blocks 706, 708 is arranged to determine the state transition metric $\overline{\delta}_k(S_{k-1}, S_k)$ for each of the possible transitions in the state transition diagram of the $k^{th}$ stage, namely for each pair of previous state $S_{k-1}$ and next state $S_k$ for which $c(S_{k-1}, S_k)=1$ by combining the a priori forward state metrics and the a priori backward state metrics, which were provided as inputs for the present iteration to form the extrinsic forward state metrics and backward state metrics respectively. Furthermore using the identity $\max^*(\overline{\delta}_1-\overline{\delta}_3, \overline{\delta}_2-\overline{\delta}_3) = \max^*(\overline{\delta}_1, \overline{\delta}_2) - \overline{\delta}_3$, (8) and (9) can be derived by rearranging (5) and substituting it into (3) and (4), respectively.

According to the above explanation, each of the processing elements considers one trellis stage as exemplified in FIG. 6 and is arranged to receive both a priori forward and backward state metrics in a clock cycle or time period and output the extrinsic forward and backward state metrics. These are provided to the neighbouring processing elements to be used in the next clock cycle or time period. In a single clock cycle in some examples, a plurality of the processing elements from at least two of the decoders can operate in parallel. Furthermore the a priori/extrinsic forward state metrics, the a priori/extrinsic backward state metrics, the a priori message LLRs and the extrinsic message information are represented using a fixed point representation.

Following the completion of the final decoding iteration, an a posteriori LLR pertaining to the $k^{th}$ message bit $b_k$ may be obtained as $\overline{b}_{1,k}^p = \overline{b}_{1,k}^{u,e}$ and may also be combined with systematic information $\overline{b}_{3,k}^{u,a}$. An estimation of the message bit $b_k$ may then be obtained as the result of the binary test $\overline{b}_{1,k}^p > 0$.

Figure 9:
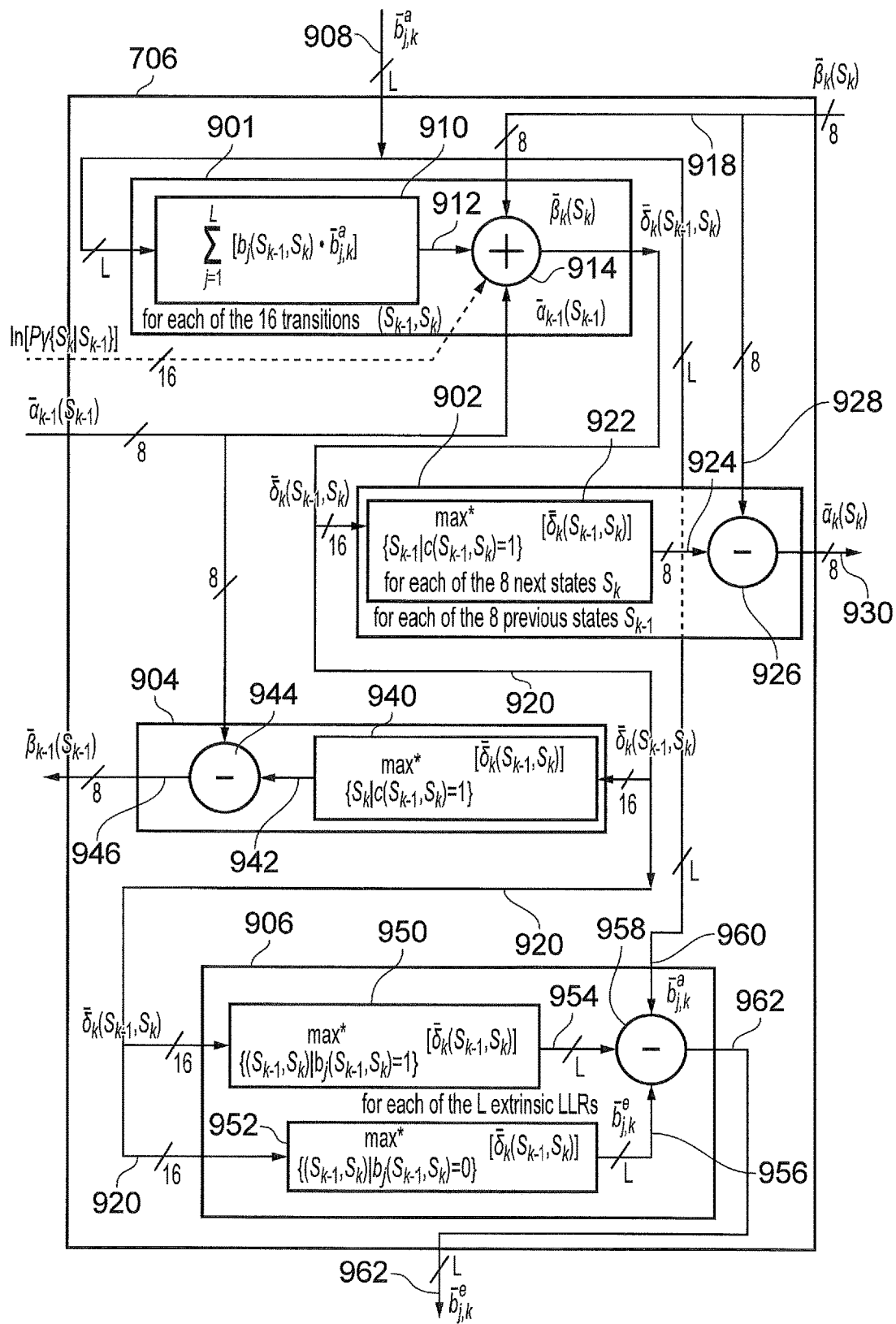
FIG. 9 is a schematic block diagram showing a more detailed implementation of a processing element forming part of the fully-parallel turbo decoder of FIG. 8.

A schematic block diagram illustrating one implementation of a processing element 706, 708 shown in FIG. 8 is provided in FIG. 9. FIG. 9 effectively forms the calculations for the $k^{th}$ trellis stage according to equations (7), (8), (9) and (10). The annotations of FIG. 9 indicate the data path widths for the example of the LTE turbo code, which employs sixteen transitions between eight states. As shown in FIG. 9 processing element 706 is comprised of four sub processing elements 901, 902, 904, 906 which respectively perform the calculations according to equations (7), (8), (9) and (10). A first sub-processing element 901 receives an a priori LLR for each of the L message, systematic or parity bits considered by the trellis stage on a first input 908 which are received by a summation unit 910. The summation unit 910 effectively combines the a priori LLR message values to form an a priori transition metric for each of the sixteen transitions $(S_{k-1}, S_k)$. The outputs of the summation unit 910 are received on a first input 912 of an adder 914. The adder receives on a second input 916 an a priori forward state metric $\overline{\alpha}_{k-1}(S_{k-1})$ for each of the eight previous states $(S_{k-1})$ from the $k-1^{th}$ processing element and on a second input 918 an a priori backward state metric $\overline{\beta}_k(S_k)$ for each of the eight next states $(S_k)$ from the $k^{th}$ processing element. At an output 920 of the adder 914, an a posteriori state transition metric $\overline{\delta}_k(S_{k-1}, S_k)$ is formed for each of the sixteen transitions in the $k^{th}$ stage of the trellis, according to equation (7). The a posteriori state transition metrics $S_k(S_{k-1}, S_k)$ are fed to the second sub-processing element 902 and the third sub-processing element 904 to respectively perform equations (8) and (9) to calculate an extrinsic forward state metric $\overline{\alpha}_k(S_k)$ for each of the eight next states $(S_k)$ of the $k^{th}$ stage in the trellis, as well as to calculate an extrinsic backward state metric $\overline{\beta}_{k-1}(S_{k-1})$ for each of the eight previous states $(S_{k-1})$. The sixteen a posteriori transition metrics $\overline{\delta}_k(S_{k-1}, S_k)$ which are received from the output of the adder 914 on channel 920 are fed to a max* calculation unit 922 within the second sub-processing element 902, which generates an a posteriori output for each of the eight next states $(S_k)$, which is fed on a first input 924 to a subtracting unit 926. On a second input 928 of the subtracting unit 926 the a priori backward state metric $\overline{\beta}_k(S_k)$ for each of the eight next states $(S_k)$ is fed and the subtraction unit 926 generates at an output 930, an extrinsic forward state metric $\overline{\alpha}_k(S_k)$ for each of the eight next states $(S_k)$ of the trellis stage, according to equation (8). The third sub-processing element 904 receives the sixteen a posteriori transition metrics $\overline{\delta}_k(S_{k-1}, S_k)$ by an input 920 at a max* calculation unit 940 which generates an a posteriori output for each of the eight previous states $(S_{k-1})$, which are fed to a first input 942 of a subtracting unit 944. A second input 946 of the subtracting unit 944 receives the eight forward state metrics $\bar{\alpha}_{k-1}(S_{k-1})$ for the eight previous states. The subtracting unit 944 forms at an output 946, an extrinsic backward state metric $\bar{\beta}_{k-1}(S_{k-1})$ for each of the eight previous states $(S_{k-1})$, according to equation (9). The fourth sub-processing element 906 processes according to equation (10) and can generate an extrinsic LLR for each of the L number of message, systematic or parity bits considered by the trellis stage. In some applications however, LLRs are only required for the message bits, for the sake of iterative exchange with the one or more other detector circuits. For example, there is one extrinsic message LLR for an LTE decoder and two LLRs for a WiMAX decoder. The fourth sub-processing element 906 includes a max* calculation unit block 950, which receives the set of sixteen a posteriori transition metrics $\bar{\delta}_k(S_{k-1}, S_k)$ and selects the subset of eight corresponding to transitions implying a bit value of $b_j(S_{k-1}, S_k)=1$. A second max* calculation unit block 952 selects the subset of a posteriori transition metrics $\bar{\delta}_k (S_{k-1}, S_k)$ for the transitions corresponding to a bit value of $b_j(S_{k-1}, S_k)=0$. An output of the respective first and second max* calculation units blocks 950 and 952 can be generated for each of the L number of message, systematic or parity bits and fed to first and second inputs 954, 956 of a subtraction unit 958. The subtraction unit 958 can receive on a third input 960 the L number of a priori LLRs. The subtraction unit 958 can form at an output 962, an extrinsic LLR $\bar{b}_{j,k}^e$ for each of the L number of message, systematic or parity bits.

As will be appreciated from the explanation provided above, one of the functions of removing the data dependency is that the forward state metric $\bar{\alpha}_k (S_k)$ for the $k^{th}$ stage is calculated immediately from the backward state metric $\bar{\beta}_k (S_k)$ for the $k^{th}$ stage combined with the max* value of the transition branch. Similarly, the backward state metric $\bar{\beta}_{k-1}(S_{k-1})$ for the $k^{th}$ stage is calculated from the forward state metric $\bar{\alpha}_{k-1}(S_{k-1})$ for the $k^{th}$ stage received from the second neighbouring processing element combined with a max* value of the transition branch metrics. Accordingly, a processing element does not have to wait until all the other processing elements have finished the forward or backward recursion in order to calculate the extrinsic LLR message values for the $k^{th}$ stage by combining the calculated forward and backward state metrics with the transition state metrics determined from the received a priori LLR message values. It is this combination of features which allows the processing element to form part of a parallel processing turbo decoder in which the data dependencies have been reduced, so at each iteration each of the processing elements operates in parallel and the processing elements for the upper and lower decoders operate contemporaneously in the same clock cycle.

More Detailed Example Embodiment

Figure 10:
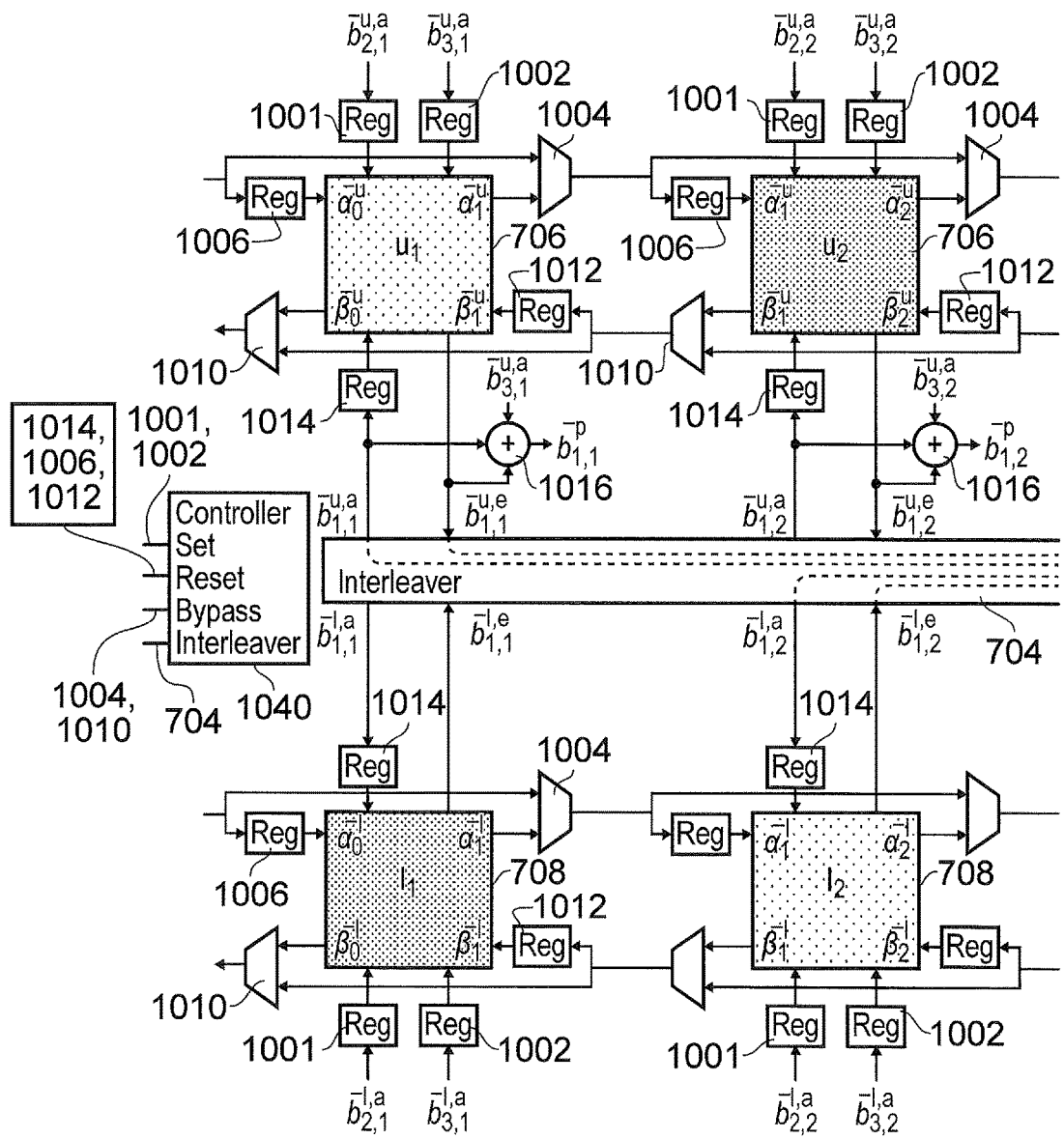
FIG. 10 is a schematic functional block layout of a fully-parallel turbo decoder according to an example embodiment of the present technique.
Figure 10:
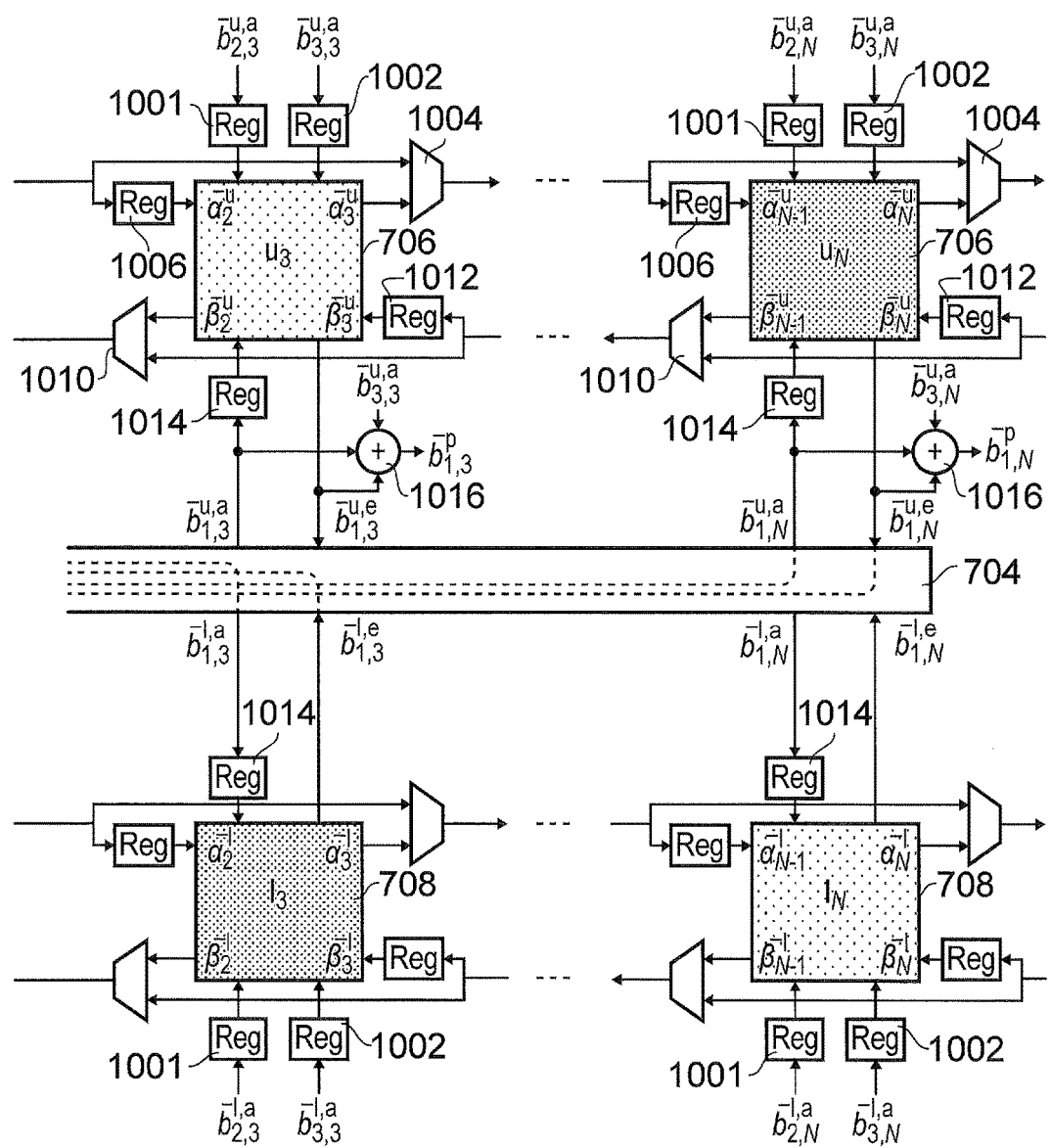

A detailed implementation of the fully-parallel turbo decoder according to embodiment of the present technique is provided in FIG. 10. FIG. 10 presents the fully parallel turbo decoder shown in FIG. 8 but including a more detailed implementation for the example where the $k^{th}$ trellis stage and processing element processes one a priori message LLR $\bar{b}_{1,k}^a$, one a priori parity LLR $\bar{b}_{2,k}^a$ and one a priori systematic LLR $\bar{b}_{3,k}^a$. However, parts also appearing in FIG. 8 have the same numerical references and for brevity only the differences with respect to FIG. 8 will be described.

According to the present technique, each of the processing elements of the detection circuit may includes a control unit, and for each of the processing elements, a selectable bypass circuit, which is provided for the processing element and configurable under control of the control unit, to bypass the processing element to disable the processing elements. The bypass circuit may be implemented as a controllable multiplexer and a register for storing forward or backward state metrics for feeding to a neighbouring processing element. As such the processing elements can be selectively enabled/disabled in order to make a power saving when these are not required.

As explained above, the turbo encoder typically includes an interleaver, which interleavers the data symbols encoded by the first convolutional encoder in accordance with an interleaving pattern before being encoded by second convolutional encoder. As such, the controller can control the selectable bypass circuits to disable selected processing elements of the upper detection circuit and the lower detection processor in accordance with the interleaving pattern used by the interleaver. The interleaver may be therefore configurable to de-interleave the extrinsic soft decision values exchanged between the first detection circuit and the second detection circuit in accordance with the interleaving pattern. The controller may therefore disable the processing elements of the upper detection circuit and the processing elements of the lower detection circuit alternately between clock cycles and in accordance with the interleaving pattern.

As shown in FIG. 10, each of the a priori parity and systematic LLRs $\bar{b}_{2,k}^a$ and $\bar{b}_{3,k}^a$ are received respectively in a register 1001, 1002 and held throughout the iterative decoding process for feeding into the processing element 706, 708 for the upper decoder 701 and the lower decoder 702. The $k^{th}$ processing element in each decoder employs storage registers 1006, 1012 and 1014 for storing the a priori forward state metrics $\bar{\alpha}_{k-1}$, a priori backward state metrics $\bar{\beta}_k$ and a priori message LLR $\bar{b}_{1,k}^a$ between successive clock cycles, respectively. The extrinsic forward state metrics $\bar{\alpha}_k$ and the extrinsic backward state metrics $\bar{\beta}_{k-1}$ are provided to multiplexers 1004 and 1010, respectively. The multiplexers 1004, 1010 can be configured to provide the extrinsic forward state metrics $\bar{\alpha}_k$ to the $k+1^{th}$ processing element and the extrinsic backward state metrics $\bar{\beta}_{k-1}$ to the $k-1^{th}$ processing element. Alternatively, the multiplexers 1004, 1010 can be configured to by-pass the $k^{th}$ processing element. This allows for selected processing elements to be switched off to reflect a shorter frame length and corresponding interleaver pattern. Accordingly, a corresponding saving in energy consumption can be achieved. As for the example shown in FIG. 8, extrinsic message LLR $\bar{b}_{1,k}^e$ is output from the $k^{th}$ processing element in the upper or lower decoder 701, 702 and fed through the interleaver 704 to form an a priori message LLR for the other decoder to use in the next clock cycle. Accordingly, a register 1014 stores the input a priori message LLR $\bar{b}_{1,k}^a$ between successive clock cycles. A determination of the a posteriori message LLR $\bar{b}_{1,k}^a$ is formed by an adder 1016 which combines the a priori message LLR $\bar{b}_{1,k}^a$, the extrinsic message LLR $\bar{b}_{1,k}^e$ and optionally the a priori systematic LLR $\bar{b}_{3,k}^a$. The turbo decoder may be controlled by a control unit 1040, which provides control signals for the multiplexers 1004 and 1010, as well as a global reset to zero signal for the registers 1006, 1012 and 1014, which is required as explained below. The control unit 1040 may also be used to reconfigure the interleaver 704, which may be implemented as a Beneg network or with multiplexers. Alternatively, the interleaver may be hardwired and the by-pass circuits described above may be controlled to select particular sub-sets of the interleaver.

Initialisation State

At the start of the first decoding iteration, no extrinsic information is available. In this case, the $k^{th}$ algorithmic block in each row employs zero values for the a priori LLR value $\bar{b}_{1,k}^a$ the a priori forward state metrics $\bar{\alpha}_{k-1}$, and the a priori backward state metrics $\bar{\beta}_k$. This may be implemented using a global reset to zero signal for the registers 1006, 1012 and 1014. As an exception to this however, the first algorithmic block in the each row employs $\bar{a}_0 = [0, -\infty, -\infty, \ldots, -\infty]$ throughout all decoding iterations, since the convolutional encoders always begin from an initial state of $S_0=0$. Similarly, the last algorithmic block from the each row employs $\bar{\beta}_N=[0, 0, 0, \ldots, 0]$ throughout all decoding iterations, since the final state of the convolutional encoder $S_N$ is not known in advance to the receiver, when termination is not employed. The operation of the first and last algorithmic blocks when termination or tail-biting is employed is discussed below.

Odd-Even Turbo Decoder

As mentioned above some turbo encoders, such as for example encoders operating in accordance with the LTE and WiMAX turbo codes employ an odd-even interleaver [14]. More explicitly, the LTE interleaver 704 only connects algorithmic blocks from the upper decoder 701 having an odd index k to algorithmic blocks from the lower decoder 702 that also have an odd index k. Similarly, algorithmic blocks having even indices k in the upper decoder 701 are only connected to algorithmic blocks having even indices k in the lower decoder 702. Owing to this, the 2N algorithmic blocks of FIG. 8 and FIG. 10 can be grouped into two sets, where all algorithmic blocks within a particular set are independent, having no connections to each other. The first set comprises all algorithmic blocks or processing elements from the upper decoder having an odd index k, as well as all blocks from the lower decoder having an even index k, which are depicted with light shading in FIGS. 8 and 10. The second set is complementary to the first, comprising the algorithmic blocks having dark shading in FIGS. 8 and 10. In this way, an iterative exchange of extrinsic information between 2N algorithmic blocks can be instead thought of as an iterative exchange of extrinsic information between the two sets of algorithmic blocks. For the example shown in FIG. 10 the interleaver 704 has employed an odd-even interleaving pattern such as that performed by an LTE turbo encoder or WiMAX turbo encoder.

More generally, for examples in which the interleaver design prevents grouping into sets of independent algorithmic blocks, all algorithmic blocks are operated in every time period, corresponding to T=1 time period per decoding iteration. However, in the case of an odd-even interleaver, the simultaneous operation of both sets of independent algorithmic blocks is analogous to juggling two balls, which are simultaneously thrown between two hands, but remain independent of each other. In the present fully-parallel turbo decoder, this corresponds to two independent iterative decoding processes, which have no influence on each other. Therefore, one of these independent iterative decoding processes can be considered to be redundant and may be discarded. This can be achieved by operating the algorithmic blocks of only one set in each time period, with consecutive time periods alternating between the two sets. With this approach, each decoding iteration can be considered to comprise T=2 consecutive time periods. Although this is double the number required by the T=1 approach described above, this T=2 approach requires half as many decoding iterations in order to achieve the same error correction performance. Therefore, the T=2 approach maintains the same processing throughput and latency as the T=1 approach, but achieves a 50% reduction in complexity per message frame.

Therefore in FIGS. 8 and 10, two sets of processing elements (algorithmic blocks) are grouped as shown with a lighter shading and a darker shading. As shown in FIG. 10 each of the processing elements has either a darker shade or a lighter shade depending on whether they are odd or even. In accordance with the present technique where the interleaver 704 performs odd and even interleaving then odd bits in the upper or lower decoder are interleaved to odd bits in the other of the upper and lower decoders.

Figure 11:
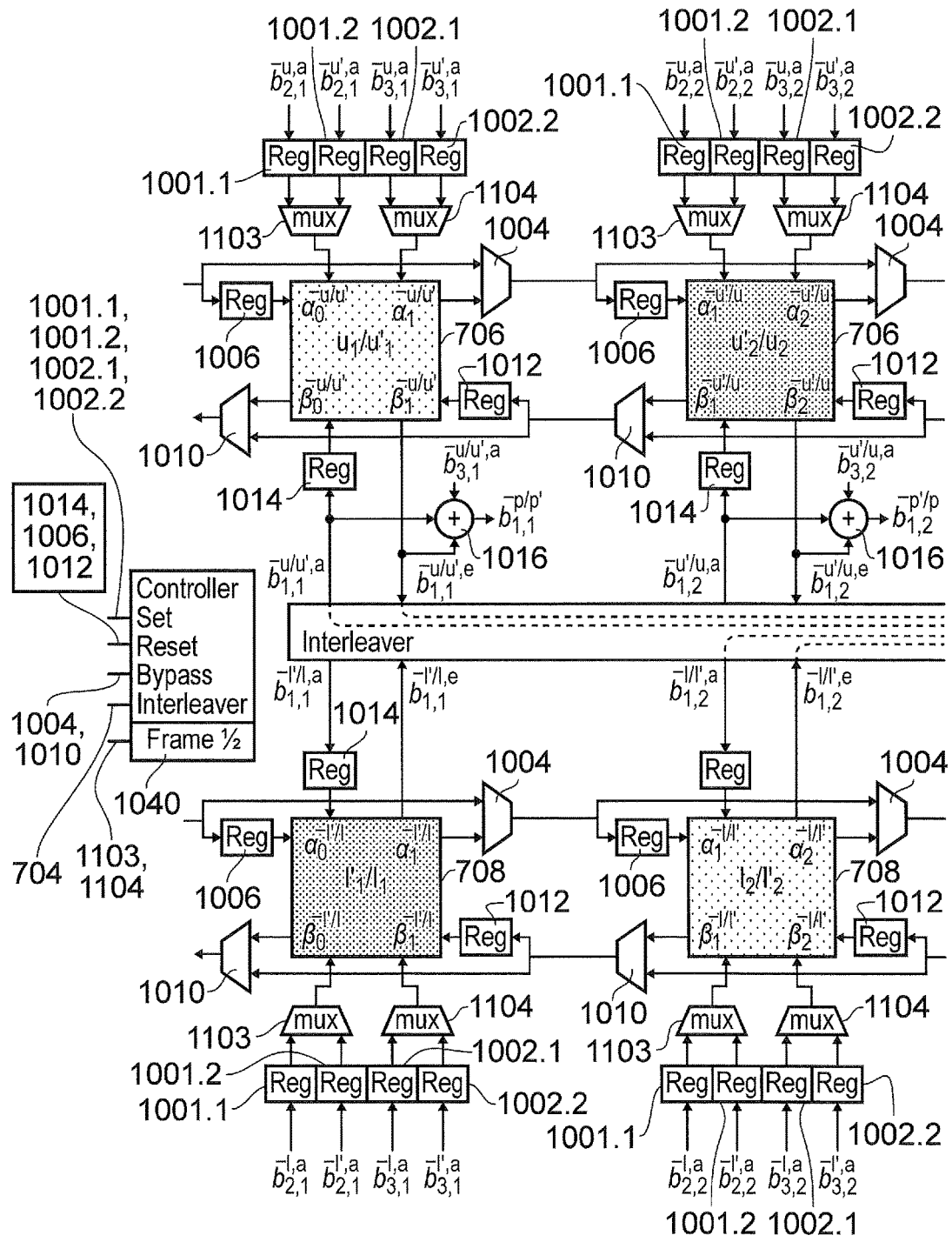
FIG. 11 is a schematic functional block layout of a fully-parallel turbo decoder according to a further example embodiment of the present technique.
Figure 11:
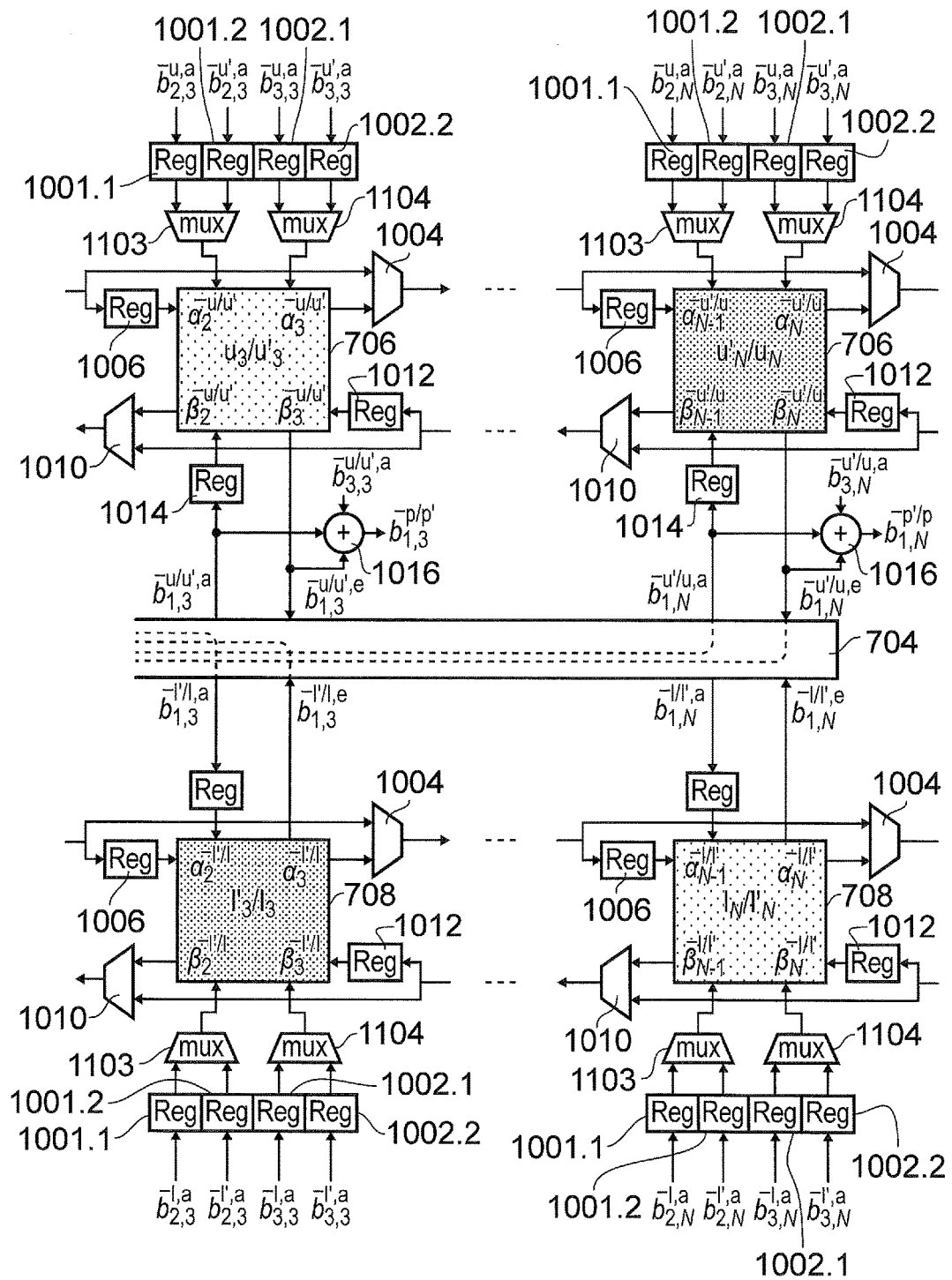
Figure 12:
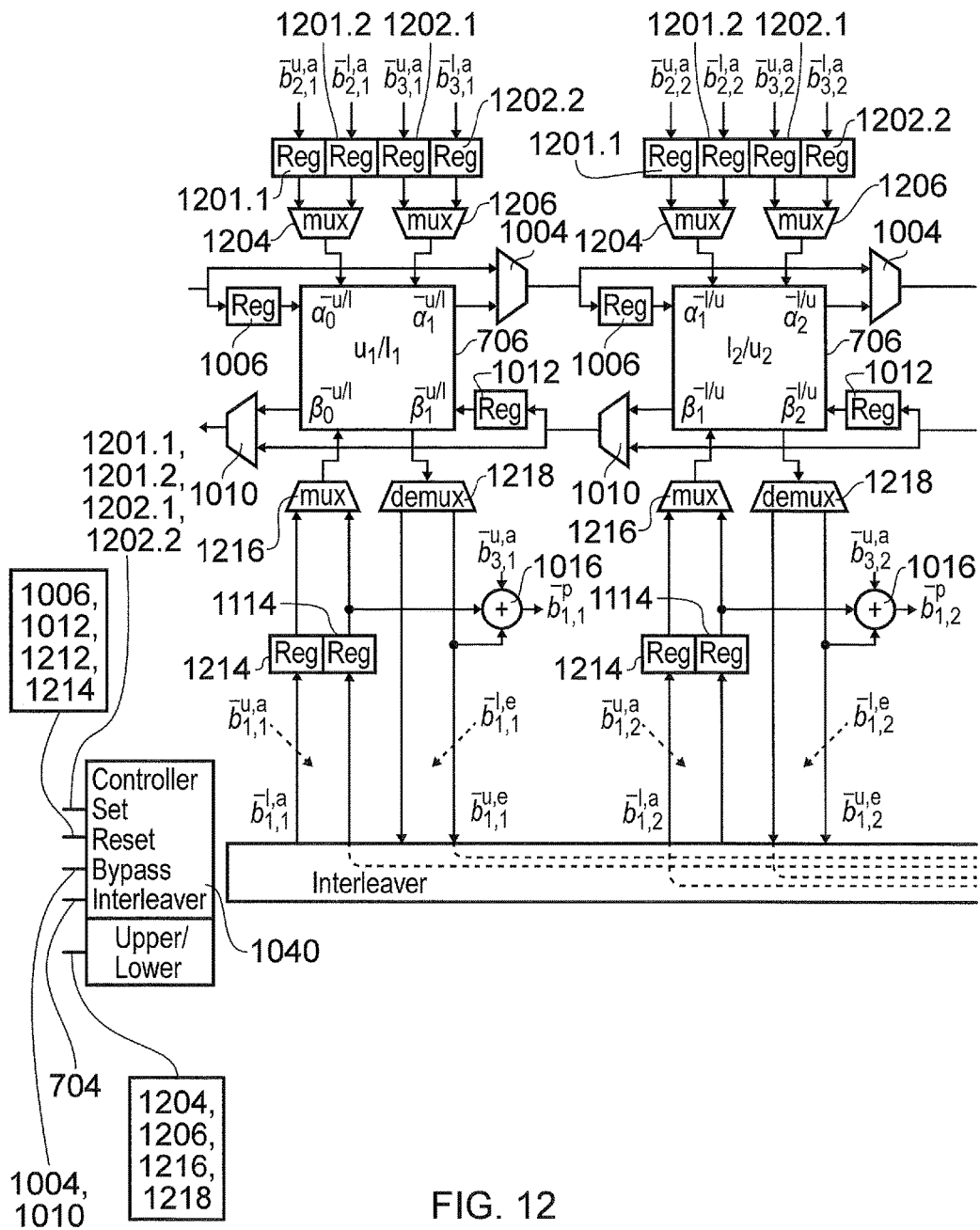
FIG. 12 is a schematic functional block layout of a fully-parallel turbo decoder according to a further example embodiment of the present technique.
Figure 12:
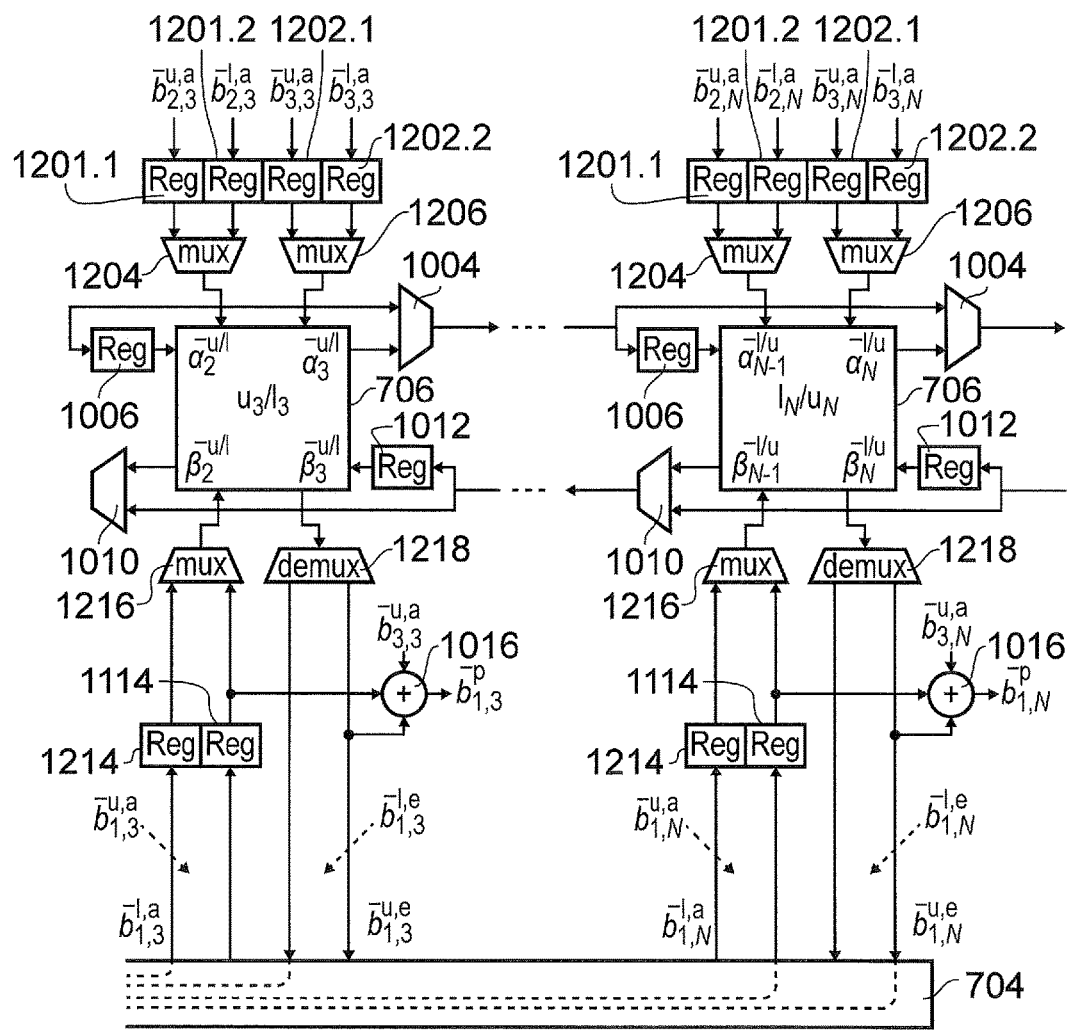

Furthermore, while one set of algorithmic blocks is being used in a particular time period to decode a particular message frame, the other set of blocks can be used to decode a different message frame, as shown in FIG. 11 and discussed below. In this way, the two sets of algorithmic blocks may be operated concurrently, alternating between the concurrent decoding of two different message frames and facilitating a 100% increase in the overall processing throughput. As discussed below, FIG. 12 shows an alternative arrangement, in which half as many processing elements are employed to decode a single message frame. Here, in successive time periods, each processing element alternates between the role of an algorithmic block in the upper decoder and in the lower decoder.

FIG. 11 provides an embodiment of the present technique in which a fully-parallel turbo decoder includes two independent iterative decoding processes, which have no influence on each other. FIG. 11 corresponds to the example embodiment shown in FIG. 10 for turbo decoding in accordance with data turbo encoded by an LTE encoder and corresponds to FIG. 8 and so only differences will be described. In FIG. 11, the turbo decoder of FIG. 10 is shown to include for each processing element 706, 708 two sets of registers 1001.1, 1001.2, 1002.1, 1002.2, which operate under the control of a control unit 1040. Each of the sets stores two a prior LLRs for respective soft decision values for different turbo encoded data frames. The odd-indexed (lighter shaded) processing elements 706 for the upper decoder 701 and the even-indexed (lighter shaded) processing elements 708 for the lower decoder 702 receive soft decision values $\bar{b}_{2,k|k}^{u,a}$, $\bar{b}_{3,k|k}^{u,a}$ and $\bar{b}_{2,k|k}^{l,a}$ is even $\bar{b}_{3,k|k\ is\ even}^{l,a}$ respectively from a first set of register elements 1001.1, 1002.1 in one time period from a first frame of turbo encoded data. The even-indexed (darker shaded) processing elements 706 for the upper decoder 701 and the odd-indexed (darker shaded) processing elements 708 for the lower decoder 702 receive soft decision values $\bar{b}_{2,k|k\ is\ even}^{u,a}$, $b_{3,k|k\ is\ even}^{u,a}$ and $\bar{b}_{2,k|k\ is\ odd}^{l,a}$, $\bar{b}_{3,k|k\ is\ odd}^{l,a}$ respectively from a second set of register elements 1001.2, 1002.2 from the second frame of turbo encoded data in the same time period. In the next time period, the even-indexed (darker shaded) processing elements 706 for the upper decoder 701 and the odd-indexed (darker shaded) processing elements 708 for the lower decoder 702 receive soft decision values $\bar{b}_{2,k|k\ is\ even}^{u,a}$, $\bar{b}_{3,k|k\ is\ even}^{u,a}$ and $\bar{b}_{2,k|k\ is\ odd}^{l,a}$, $\bar{b}_{3,k|k\ is\ odd}^{l,a}$ respectively from the first set of register elements 1001.1, 1002.1 from the second frame of turbo first frame of turbo encoded data, and the odd-indexed (lighter shaded) processing elements 706 for the upper decoder 701 and the even-indexed (lighter shaded) processing elements 708 for the lower decoder 702 receive soft decision values $\bar{b}_{2,k|k\ is\ odd}^{u,a}$, $\bar{b}_{3,k|k\ is\ odd}^{u,a}$ and $\bar{b}_{2,k|k\ is\ even}^{l,a}$, $\bar{b}_{3,k|k\ is\ even}^{l,a}$ respectively from the second set of register elements 1001.2, 1002.2 from the second frame of turbo encoded data. Accordingly, both the first and the second frames of turbo encoded data can be decoded contemporaneously. Accordingly, the adders 1016 will alternate between providing a posteriori LLRs pertaining to the first frame $\tilde{b}_{1,k}^{p}$ and to the second frame $\tilde{b}_{1,k}^{p'}$, in successive time periods.

Another embodiment is shown in FIG. 12. The embodiment shown in FIG. 12 utilises the odd-even interleaving to the effect of halving the number of processing elements 706 which are used to perform the turbo decoding process. This corresponds to the example embodiment shown in FIG. 10 for turbo decoding in accordance with data turbo encoded by an LTE encoder and so corresponds to FIG. 8 and so only differences will be described.

In FIG. 12, the turbo decoder of FIG. 10 is modified to include only half the number of processing elements 706. Each of the processing elements is provided with two sets of registers 1201.1, 1201.2, 1202.1, 1202.2. Each of the sets stores two a priori LLRs for respective soft decision values $\tilde{b}_{2,k}^{u,a}, \tilde{b}_{3,k}^{u,a}$ and $\tilde{b}_{2,k}^{l,a}, \tilde{b}_{3,k}^{l,a}$ for the upper and lower turbo encoded data of the frame.

The arrangement of the processing elements 706 shown in FIG. 12 is configured to perform a turbo decoding process according to the present technique on a single frame of data symbols under the control of a control unit 1040. By taking advantage of the 50% reduction in processing, which can be achieved with an odd-even interleaver, in alternating cycles, the processing elements perform the turbo decoding process according to the present technique by alternating between the soft decision values $\tilde{b}_{2,k}^{u,a}, \tilde{b}_{3,k}^{u,a}$ for the upper convolutional encoded data fed from the registers 1201.1, 1202.1 fed via the multiplexers 1204, 1206, and the soft decision values $\tilde{b}_{2,k}^{l,a}, \tilde{b}_{3,k}^{l,a}$ for the lower convolutional encoded data fed from the registers 1201.2, 1202.2 fed via the multiplexers 1204, 1206. Furthermore the alternating cycles process the odd and even data symbols. The interleaver 704 feeds the odd and then even extrinsic data symbol values $\tilde{b}_{1,k}^{e}$ from the processing elements 706 via a de-multiplexer 1218 and the interleaver 704 to be stored in registers 1212, 1214 and fed via a multiplexer 1216 to the processing elements as the a priori data information $\tilde{b}_{1,k}^{a}$ for the next cycle.

In clock cycles having odd indices, the multiplexers 1204, 1206 and 1216 of each processing element having an odd index k are configured to read from the registers 1201.1, 1202.1 and 1214. These registers provide the a priori LLRs $\tilde{b}_{1,k|k\ is\ odd}^{u,a}, \tilde{b}_{2,k|k\ is\ odd}^{u,a}$ and $\tilde{b}_{3,k|k\ is\ odd}^{u,a}$, which pertain to the upper decoder. The demultiplexer 1218 is configured to provide the extrinsic LLR $\tilde{b}_{1,k|k\ is\ odd}^{u,a}$, which is passed to the interleaver 704 and the adder 1016, which generates the a posteriori LLR $\tilde{b}_{1,k|k\ is\ odd}^{p}$. The register 1212 is written with the a priori LLR $\tilde{b}_{1,k|k\ is\ odd}^{l,a}$ provided by the interleaver 704, ready to be used in the next clock cycle. Meanwhile, the multiplexers 1204, 1206 and 1216 of each processing element having an even index k are configured to read from the registers 1201.2, 1202.2 and 1212 in clock cycles having odd indices. These registers provide the a priori LLRs $\tilde{b}_{1,k|k\ is\ even}^{l,a}, \tilde{b}_{2,k|k\ is\ even}^{l,a}$ and $\tilde{b}_{3,k|k\ is\ even}^{l,a}$, which pertain to the lower decoder. The demultiplexer 1218 is configured to provide the extrinsic LLR $\tilde{b}_{1,k|k\ is\ even}^{l,e}$ which is passed to the interleaver 704. The register 1214 is written with the a priori LLR $\tilde{b}_{1,k|k\ is\ even}^{u,a}$ provided by the interleaver 704, ready to be used in the next clock cycle.

In clock cycles having even indices, the multiplexers 1204, 1206 and 1216 of each processing element having an even index k are configured to read from the registers 1201.1, 1202.1 and 1214. These registers provide the a priori LLRs $\tilde{b}_{1,k|k\ is\ even}^{u,a}, \tilde{b}_{2,k|k\ is\ even}^{u,a}$ and $\tilde{b}_{3,k|k\ is\ even}^{u,a}$, which pertain to the upper decoder. The demultiplexer 1218 is configured to provide the extrinsic LLR $\tilde{b}_{1,k|k\ is\ even}^{u,e}$, which is passed to the interleaver 704 and the adder 1016, which generates the a posteriori LLR $\tilde{b}_{1,k|k\ is\ even}^{p}$. The register 1212 is written with the a priori LLR $\tilde{b}_{1,k|k\ is\ even}^{l,a}$ provided by the interleaver 704, ready to be used in the next clock cycle. Meanwhile, the multiplexers 1204, 1206 and 1216 of each processing element having an odd index k are configured to read from the registers 1201.2, 1202.2 and 1212 in clock cycles having even indices. These registers provide the a priori LLRs $\tilde{b}_{1,k|k\ is\ odd}^{l,a}, \tilde{b}_{2,k|k\ is\ odd}^{l,a}$ and $\tilde{b}_{3,k|k\ is\ odd}^{l,a}$ which pertain to the lower decoder. The demultiplexer 1218 is configured to provide the extrinsic LLR $\tilde{b}_{1,k|k\ is\ odd}^{l,e}$, which is passed to the interleaver 704. The register 1214 is written with the a priori LLR $\tilde{b}_{1,k|k\ is\ odd}^{u,a}$ provided by the interleaver 704, ready to be used in the next clock cycle.

As will be appreciated therefore the example embodiment shown in FIG. 12 can perform a turbo decoding process on a data frame which has been turbo encoded using an internal odd-even interleaver, with the effect that a 50% reduction in processing hardware can be achieved.

Termination of Turbo Decoder

Figure 13:
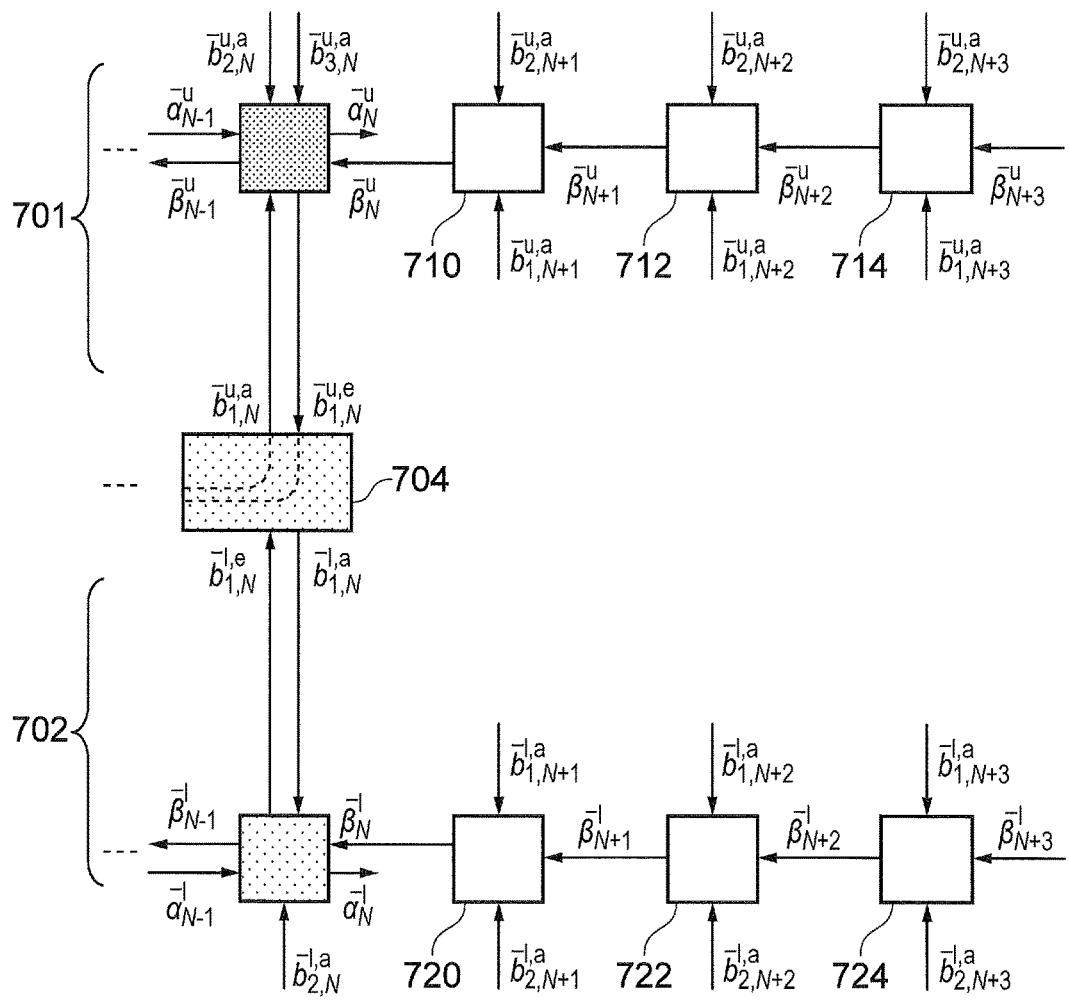
FIG. 13 is a schematic block layout of processing elements forming part of the fully-parallel turbo decoder of FIG. 8, which are responsible for terminating a frame of data being decoded.

As mentioned above, in some examples a data frame is terminated using one or more additional bits or symbols, so that the decoder can know the state in which the frame terminates. For the example of the LTE turbo encoder, twelve termination bits are used to force each of its convolutional encoders into the final state, for which $S_{N+3}=0$. In the receiver, the demodulator provides the corresponding LLRs $\tilde{b}_{1,N+1}^{u,a}, \tilde{b}_{1,N+2}^{u,a}, \tilde{b}_{1,N+3}^{u,a}, \tilde{b}_{2,N+1}^{u,a}, \tilde{b}_{2,N+2}^{u,a}, \tilde{b}_{2,N+2}^{u,a}$ and $\tilde{b}_{2,N+3}^{u,a}$ to the upper row, while the lower row is provided with $\tilde{b}_{1,N+1}^{l,a}, \tilde{b}_{1,N+2}^{l,a}, \tilde{b}_{1,N+3}^{l,a}, \tilde{b}_{2,N+1}^{l,a}, \tilde{b}_{2,N+2}^{l,a}$ and $\tilde{b}_{2,N+3}^{l,a}$. As shown in FIG. 13, these LLRs can be provided to three additional algorithmic blocks, which are positioned at the end of each row in the proposed fully-parallel turbo decoder.

FIG. 13 provides a schematic block diagram which shows processing elements involved in the termination bits for the frame where the turbo encoded frame terminates in known states. As shown in FIG. 13, an output of the turbo decoders internal interleaver 704 exchanges data bits with the upper turbo decoder 701 and the lower turbo decoder 702 as explained with reference to FIG. 8. However, as shown in FIG. 13, three termination processing elements are shown for the upper turbo decoder 701 as processing element 710, 712, 714. The lower turbo decoder 702 comprises three termination units 720, 722, 724 which processes the termination bits for the frame as explained as follows.

The three additional algorithmic blocks at the end of each row do not need to be operated iteratively, within the iterative decoding process. Instead, they can be operated just once, before the iterative decoding process begins, using a backwards recursion. More specifically, the algorithmic blocks with the index k=N+3 may employ Equations (2) and (4) in order to process the L=2 LLRs $\tilde{b}_{1,N+3}^{a}$ and $\tilde{b}_{2,N+3}^{a}$. Here, the state metrics $\bar{\beta}_{N+3}=[0, -\infty, -\infty, \ldots, -\infty]$ should be employed since a final state of $S_{N+3}=0$ is guaranteed. The resultant state metrics $\bar{\beta}_{N+2}$ can then be provided to the algorithmic block having the index k=N+2. In turn, this uses the same process in order to obtain $\bar{\beta}_{N+1}$, which is then provided the block where k=N+1 in order to obtain $\bar{\beta}_N$ in the same way. The resultant values of & may then be employed throughout the iterative decoding process, without any need to operate the three additional algorithmic blocks again. Note that there is no penalty associated with adopting this approach, since Equations (2) and (4) reveal that the values of $\bar{\beta}_N$ are independent of all values that are updated as the iterative decoding process proceeds.

Note that since the LTE turbo encoder does not output the systematic frame $b_3^{l,a}$ produced by the lower convolutional encoder, the $k^{th}$ algorithmic block in the lower row uses (2) to consider only the L=2 a priori LLRs $\bar{b}_{1,k}^{l,a}$ and $\bar{b}_{2,k}^{l,a}$. By contrast the algorithmic block in the upper row having the index k∈[1, N] considers the L=3 a priori LLRs $\bar{b}_{1,k}^{u,a}$, $\bar{b}_{2,k}^{u,a}$ and $\bar{b}_{3,k}^{u,a}$. This is shown in FIG. 10 for the algorithmic blocks having the index k=N.

WiMAX Turbo Decoder

As for the example of a turbo decoder which is configured to decode turbo encoded data in accordance with the LTE turbo code, a turbo decoder configured in accordance with an embodiment of the present technique to decode a data frame encoded with a WiMAX turbo code also employs an odd-even interleaver [14], allowing it to benefit from a 50% reduction in the computational complexity of the fully-parallel turbo decoder, as shown in FIG. 10. Furthermore, the concurrent decoding of two message frames is supported, facilitating a 100% increase in overall processing throughput, as shown in FIG. 11. Alternatively, a 50% reduction in hardware can be achieved using the approach of FIG. 12. A fully-parallel turbo decoder embodying the present technique applies the equations (7) to (10), which are adapted to support duo-binary nature of the WiMAX turbo code. Here, the algorithmic blocks in the upper row consider L=6 a priori LLRs, while those in the lower row consider L=4 LLRs, since the systematic frames $b_5^l$ and $b_6^l$ produced by the lower convolutional code are not output. More specifically, the $k^{th}$ algorithmic block in the upper decoder 701 is provided with six a priori LLRs $\bar{b}_{1,k}^{u,a}, \bar{b}_{2,k}^{u,a}, \bar{b}_{3,k}^{u,a}, \bar{b}_{4,k}^{u,a}, \bar{b}_{5,k}^{u,a}$ and $\bar{b}_{6,k}^{u,a}$, using these to generate two extrinsic LLRs $\bar{b}_{1,k}^{u,e}$ and $\bar{b}_{2,k}^{u,e}$. By contrast, $\bar{b}_{1,k}^{l,a}, \bar{b}_{2,k}^{l,a}, \bar{b}_{3,k}^{l,a}$ and $\bar{b}_{4,k}^{l,a}$, are provided to the $k^{th}$ algorithmic block in the lower row, which generates two extrinsic LLRs $\bar{b}_{1,k}^{l,e}$ and $\bar{b}_{2,k}^{l,e}$ in response. Tail-biting can be achieved by employing $\bar{\alpha}_0 = [0, 0, 0, \ldots, 0]$ and $\bar{\beta}_N = [0, 0, 0, \ldots, 0]$ in the first iteration. In all subsequent iterations, the most-recently obtained values of $\bar{\alpha}_N$ and $\bar{\beta}_0$ can be employed for a $\bar{\alpha}_0$ and $\bar{\beta}_N$, respectively.

Comparison of Fully Parallel Turbo Decoder with Log-BCJR Decoder

The following paragraphs provide an analysis comparing an embodiment of the present technique, which provides a fully-parallel turbo decoder with a conventional turbo decoder employing the Log-BCJR turbo decoder, as well as with another known turbo decoding algorithm disclosed in [10]. For each of these turbo decoders the number of time periods required per decoding iteration is identified, the memory requirements analysed and the computational complexity per decoding iteration, the time period duration and the number of decoding iterations required to achieve a particular error correction performance, respectively identified in order to illustrate some advantages of the present technique. Furthermore, these characteristics are combined in order to quantify the overall throughput, latency and computational complexity of these turbo decoders, when employed for both LTE and WiMAX turbo decoding. The comparisons are summarized in Table 1, which is provided in FIG. 14, which provides various characteristics of the Log-BCJR algorithm and the state-of-the-art algorithm of [10], relative to those of a fully parallel turbo decoder embodying the present technique, when implementing the LTE and WiMAX turbo decoders using the approximate max* operator of equation (12). These utilise an abbreviation TtotP, which is used to mean "times that of the proposed fully-parallel turbo decoder".

As explained above, embodiments of the present technique can provide a fully parallel turbo decoder, which derived from the Log-BCJR algorithm. However, as explained the data dependencies within each iteration have been removed, allowing the forward and backward state metrics to be only generated in respect of one iteration per stage, before being used by a neighbouring processing element to generate the state metrics for a subsequent iteration.

Although the simplified Log-BCJR turbo decoder described above with reference to FIG. 7 requires T=4N time periods to complete each decoding iteration, several techniques have been proposed for significantly reducing this. For example, the Non-Sliding Window (NSW) technique [10] may be employed to decompose the algorithmic blocks of FIG. 7 into 64 windows, each comprising an equal number of consecutive blocks. Here, the data dependencies between adjacent windows are eliminated by initializing each window's recursions using results provided by the adjacent windows in the previous decoding iteration, rather than in the current one. Furthermore, within each window, the NSW technique performs the forward and backward recursions simultaneously, only performing Equations (5) and (6) once these recursions have crossed over. Additionally, a Radix-4 transform [10] allows the number of algorithmic blocks employed in a Log-BCJR turbo decoder of FIG. 7 to be halved, along with the number of time periods required to process them. Here, each algorithmic block corresponds to the merger of two state transition diagrams into one, effectively doubling the number of a priori LLRs L considered by each algorithmic block. By combining the NSW technique and the Radix-4 transform, the state-of-the-art LTE turbo decoder [10] can complete each decoding iteration using just T=N/32 time periods, provided that the frame length satisfies N ∈[2048, 6114]. Note however that this number is N/64 TtotP fully-parallel turbo decoder for the above example, which requires only T=2 time periods per decoding iteration. When employing the maximum LTE frame length of N=6144 bits, the number of time periods per decoding iteration required by the state-of-the-art LTE turbo decoder is nearly two orders-of-magnitude above the number required by the proposed fully-parallel algorithm.

As described above, the state-of-the-art LTE turbo decoding algorithm of [10] employs the Radix-4 transform to double the number of a priori LLRs considered by each algorithmic block, resulting in L=6 for the blocks in the upper row and L=4 for those in the lower row. Owing to this, this state-of-the-art algorithm can also be employed for WiMAX turbo decoding, since this naturally requires algorithmic blocks that consider L=6 and L=4 a priori LLRs, as explained above. Note however that in this application, the turbo decoder does not benefit from halving the number of algorithmic blocks required, as is achieved when applying the Radix-4 transform to an LTE turbo decoder. On the other hand, the WiMAX turbo decoder can benefit from the NSW technique of the state-of-the-art algorithm, provided that N ∈[1440, 2440], resulting in T=N/16 time periods per decoding iteration. As shown in the Table above, this number is N/32 TtotP of the fully-parallel turbo decoder.

Memory Requirements

As explained above, example embodiments of the present technique can provide a fully-parallel turbo decoder as for the examples of FIGS. 8 and 9, in which the outputs produced by each algorithmic block in any particular time period are used by the connected blocks in the next time period. Owing to this, embodiments of the present technique have reduced memory capacity requirements compared to conventional turbo decoders for storing variables between consecutive time periods. More specifically, besides registers used for temporary storage between two consecutive clock cycles, memory is only required for storing the a priori LLRs provided by the demodulator, which are required throughout the iterative decoding process. In the case of the LTE turbo decoder, memory is required for storing the 3N+12 a priori LLRs that are provided by the demodulator, while 6N a priori LLRs need to be stored in the WiMAX turbo decoder.

By contrast, the Log-BCJR turbo decoder algorithm of FIG. 7 has significantly higher memory requirements compared to an equivalent fully-parallel turbo decoder embodying the present technique of FIGS. 8, 9, 10, 11, 12 and 13. Both the fully-parallel turbo decoder of the present technique and the Log-BCJR turbo decoder algorithm require memory for storing the a priori LLRs provided by the demodulator. Furthermore, memory is required for storing the M×K×N a priori transition metrics that are produced by Equation (2) during the forward recursion, so that they can be used by (4) and (5) during the backward recursion. Likewise, memory is required for storing the M×N extrinsic state metrics that are produced by Equation (3) during the forward recursion, so that they can be used by equation (5) during the backward recursion. Finally, in the case of the LTE turbo decoder, memory is required for storing the N extrinsic LLRs that are produced by equation (6), while 2N extrinsic LLRs need to be stored in the WiMAX turbo decoder. Note that the additional memory required by the Log-BCJR turbo decoder algorithm can be reused by both the upper and lower decoder of FIG. 7, since they are not operated concurrently. As shown in the above Table, the amount of memory required by the Log-BCJR algorithm is 9.33 and 8 TtotP, when implementing the LTE and WiMAX turbo decoders, respectively.

It should also be noted that the state-of-the-art LTE turbo decoder [10] employs the Radix-4 transform, which halves the number of extrinsic state metrics that must be stored. Furthermore, the state-of-the-art LTE turbo decoder uses a re-computation technique [10] to further reduce the memory requirements. Rather than storing the a priori transition metrics during the forward recursion, so that they can be reused during the backward recursion, the re-computation technique simply recalculates these metrics during the backwards recursion. In addition to this, the state-of-the-art LTE turbo decoder stores only ⅙ of the extrinsic state metrics during the forward recursion and recalculates the other ⅚ of these metrics during the backward recursion. Owing to its employment of these techniques, the amount of memory required by the state-of-the-art LTE turbo decoder is 1.67 TtotP. However, as will be explained shortly, storing the sum of the a priori parity LLRs $\overline{b}_2^{u,a}$, and the a priori systematic LLRs $\overline{b}_3^{u,a}$, is beneficial to the algorithmic blocks in the upper row of the proposed fully-parallel algorithm, when employed for LTE turbo decoding. This renders the amount of memory required by the state-of-the-art LTE turbo decoder equal to 1.25 TtotP, as shown in the Table 1 of FIG. 14.

Likewise, when the state-of-the-art algorithm is applied to WiMAX turbo decoding, the required memory is also 1.67 TtotP, as shown in Table 1 of FIG. 14. Note that this ratio is maintained even though the WiMAX turbo decoder does not benefit from the Radix-4 transform, which halves the number of algorithmic blocks that are required, as well as the number of extrinsic state metrics that must be stored. This is because in addition to requiring twice as much storage for extrinsic state metrics, the WiMAX turbo code also requires twice as much storage for LLRs, since it is duo-binary.

Computational Complexity

The number of additions, subtractions and max* operations that are employed within each processing element of a turbo decoder embodying the present technique and the Log-BCJR algorithms are quantified in Table 2 provided in FIG. 15, for both the LTE and WiMAX turbo decoder.

A number of techniques have been employed to minimize the number of operations that are listed in the Table 2 of FIG. 15. For example, the a priori metrics $\overline{\gamma}_k(S_{k-1}, S_k)$ of some particular transitions are equal to each other, allowing them to be computed once and then reused. Furthermore, some a priori metrics $\overline{\gamma}_k(S_{k-1},S_k)$ are zero-valued and so there is no need to add them into the corresponding $\overline{\delta}_k(S_{k-1},S_k)$, $\overline{\alpha}_k(S_k)$ or $\overline{\beta}_{k-1}(S_{k-1})$ calculations. Finally, when computing the extrinsic LLR $\overline{b}_{1,k}^e$ in the WiMAX turbo decoder, the results of some max* operations can be reused to compute the extrinsic LLR $\overline{b}_{2,k}^e$. Note that the algorithmic blocks in the upper row of the LTE and WiMAX turbo decoders consider a higher number of a priori LLRs L than those of the lower row, resulting in a slightly higher complexity. Therefore, the Table 2 presents the average of the number of operations that are employed by the algorithmic blocks in the upper and lower rows, resulting in some non-integer values.

For both the LTE and WiMAX turbo decoders, a fully-parallel turbo decoder embodying the present technique requires fewer additions and subtractions than the Log-BCJR algorithm, as well as an equal number of max*operations. When the approximation of (12) is employed, max* operations can be considered to have a similar computational complexity to additions and subtractions [15]. As shown in the Table 1 of FIG. 14, the computational complexity per decoding iteration C of the Log-BCJR algorithm is therefore 1.1 and 1.25 TtotP, when implementing the LTE and WiMAX turbo decoders, respectively.

Note that the state-of-the-art LTE turbo decoder [10] employs the Radix-4 transform, as well as the approximation of (12). When employing the Radix-4 transform, the Log-BCJR LTE turbo decoder has the same complexity per algorithmic block as that presented in the Table 1 for the Log-BCJR WiMAX turbo decoder. However, it should be noted that the Radix-4 transform halves the number of algorithmic blocks that are required, as above. Furthermore, as explained above, the state-of-the-art LTE turbo decoder recalculates the a priori transition metrics of (2) and ⅚ of the extrinsic state metrics of (3) during the backward recursion. Therefore, the state-of-the-art LTE turbo decoder has a complexity per decoding iteration C that is 1.77 TtotP, as shown in the Table 1. When applying the state-of-the-art algorithm's recalculation technique to the WiMAX turbo code, its complexity per decoding iteration C corresponds to 1.58 TtotP, as shown in the Table 1 of FIG. 14.

Time Period Duration

A turbo decoder according to the present technique can be arranged so that each of the algorithmic blocks in FIGS. 8 to 13 can be completed within a single time period. However, the amount of time D that is required for each time or clock cycle period depends on the computational requirements of the algorithmic blocks. More specifically, the required duration D depends on the critical path through the data dependencies that are imposed by the computational requirements of the algorithmic blocks. For example, in the proposed fully-parallel algorithm, Equations (8), (9) and (10) are independent of each other, but they all depend upon (7). As a result, the computation of (7) must be completed first, but then (8), (9) and (10) can be computed in parallel. Of these three equations, it is (10) that requires the most time for computation, since it is a function of more variables than (8) and (9). Therefore, the critical path of the algorithmic blocks in the proposed fully-parallel algorithm depends on the computational requirements of (7) and (10).

Equation (7) is employed to obtain an a posteriori metric $\delta(S_{k-1}, S_k)$ for each transition in the state transition diagram. However, these can all be calculated in parallel, using an addition of five variables in the case of the algorithmic blocks in the upper turbo decoder 701, which consider L=3 a priori LLRs, for example. By contrast, an addition of just four variables is required in the case of the algorithmic blocks in the lower turbo decoder 702 which L=2. A summation of v number of variables requires v−1 additions, some of which can be performed in parallel. More specifically, the variables can be added together in pairs and then in a second step, the resultant sums can be added together in pairs. This process can continue until only a single sum remains, requiring a total of $[\log_2(v)]$ steps. Accordingly, Equation (7) contributes three additions to the critical path of the algorithmic blocks in the upper row of the proposed fully-parallel LTE turbo decoder, as well as two additions for the blocks in the lower row. The maximum of these two critical path contributions is presented in the corresponding curly brackets of Table 2, since it imposes the greatest limitation on the time period duration. A similar analysis can be employed to determine each of the other critical path contributions that are provided in the curly brackets of Table 2.

As shown in Table 2 of FIG. 15 the critical path of the Log-BCJR algorithm is longer than that of the proposed fully-parallel algorithm, requiring time periods having a longer duration D and resulting in slower operation. When the approximation of (12) is employed, max* operations can be considered to make similar contributions to the critical path as additions and subtractions. As shown in Table 1, the critical path and hence the required time period duration D of the Log-BCJR algorithm is therefore 1.13 and 1.22 TtotP, when implementing the LTE and WiMAX turbo decoders, respectively.

Note however that the state-of-the-art LTE turbo decoder [10] employs the Radix-4 transform, as well as the approximation of (12). When employing the Radix-4 transform, the Log-BCJR LTE turbo decoder has the same critical path as that presented in Table II for the Log-BCJR WiMAX turbo decoder. However, the state-of-the-art LTE turbo decoder employs pipelining [10] to spread the computation of Equations (2)-(6) over several consecutive time periods. This reduces the critical path to that of Equation (4) alone, namely one addition and two max*operations. By contrast, the proposed fully-parallel algorithm has a critical path comprising five additions and three max* operations. Note however that the contribution of one addition can be eliminated from this total by employing a technique similar to pipelining. More specifically, the sum of the a priori parity LLRs $\bar{b}_2^{u,a}$, and the a priori systematic LLRs $\bar{b}_3^{u,a}$ may be computed before iterative decoding commences. The result may be stored and used throughout the iterative decoding process by the algorithmic blocks in the upper row of the proposed fully-parallel LTE turbo decoder. This reduces the critical path contribution of Equation (2) in the upper row to two additions, which is equal to that of the lower row. Therefore, the critical path and time period duration D of the state-of-the-art LTE turbo decoder can be considered to be 0.43 TtotP, as shown in Table 1. Similarly, when applying the state-of-the-art algorithm to WiMAX turbo decoding, the result is the same critical path of one addition and two max*operations. As shown in Table 1, this critical path is 0.33 TtotP, which requires five additions and four max*operations.

Error Correction Performance

A decoding performance of a fully-parallel turbo decoder embodying the present technique will now be compared to that of a turbo decoder which employs the Log-BCJR algorithm. FIGS. 16a, 16b, 16c and 17a, 17b and 17c provide simulation results providing plots of Signal to Noise Ratio (SNR) per bit $E_b/N_0$, where $E_b/N_0[dB]=SNR[dB]-10\log_{10}(R)$ in this case for performance of a fully-parallel turbo decoder compared with that of the Log-BCJR algorithm as will be explained in the following paragraphs.

Figure 16:
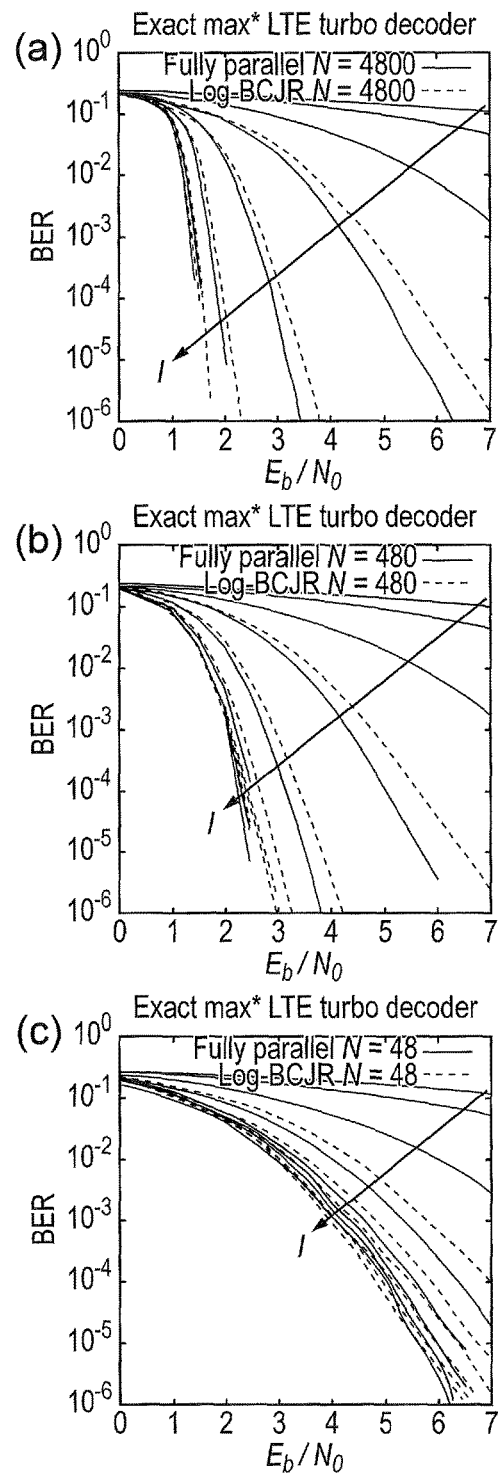
FIGS. 16a, 16b and 16c provide graphical plots of bit error rate with respect to signal to noise ratio representing the error correction performance of an LTE turbo decoder when decoding frames comprising (a) N=4800, (b) N=480 and (c) N=48 bits.

FIGS. 16a, 16b and 16c provide graphs for error correction performance of an LTE turbo decoder when using the exact max* operator of Equation (11) to decode frames comprising (a) N=4800, (b) N=480 and (c) N=48 bits. For the simulation results for which FIGS. 16a, 16b and 16c were generated, BPSK modulation is employed for transmission over an uncorrelated narrow band Rayleigh fading channel. The plots are provided for the case where the number of iterations I is in the range 1, 2, 4, 8, 16, 32, 64, 128. Decoding iterations are performed using the proposed fully parallel algorithm as well as for iterations of 1, 2, 4, 8, 16 decoding iterations using the conventional BCJR-algorithm.

FIGS. 16a, 16b and 16c provide a comparison between the fully-parallel turbo decoder and the BCJR-algorithm. These results show that regardless of the frame length N, the proposed fully-parallel algorithm can converge to the same error correction performance as the Log-BCJR algorithm. However, the fully-parallel turbo decoder embodying the present technique can be seen to converge relatively slowly, requiring significantly more decoding iterations I than the Log-BCJR algorithm. Note that this is not unexpected, since LDPC decoders employing a parallel scheduling are known to require more decoding iterations than those employing a serial scheduling [16].

Figure 17:
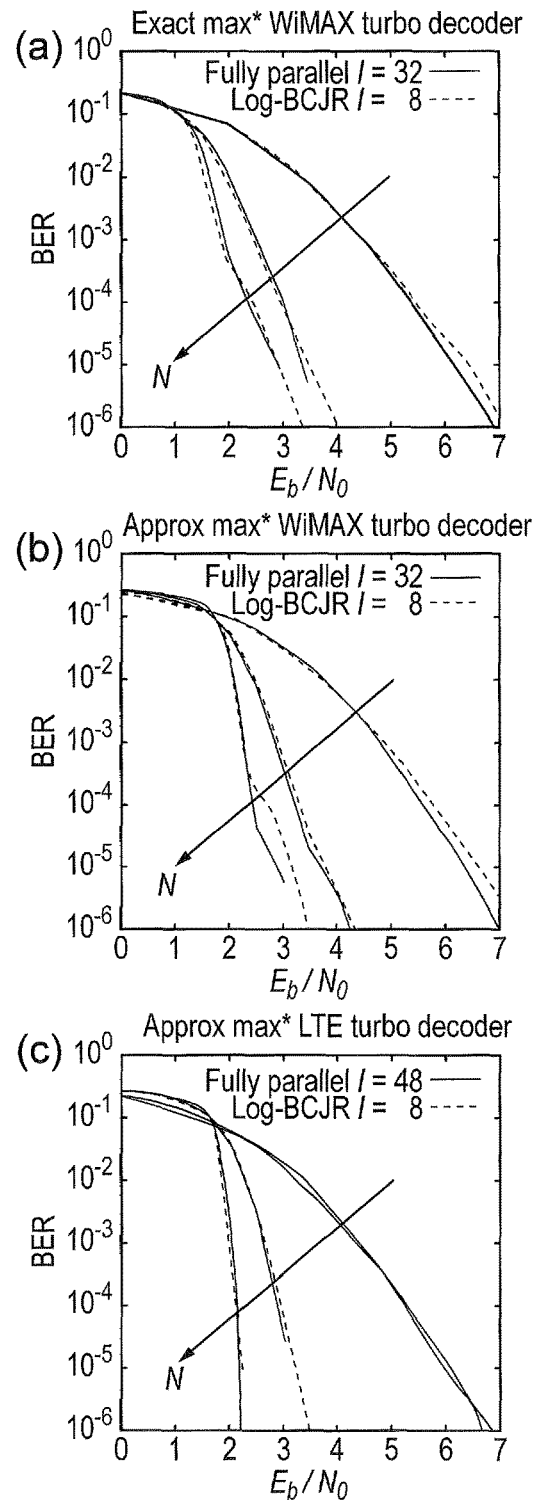
FIGS. 17a, 17b and 17c graphical plots of bit error rate with respect to signal to noise ratio representing the error correction performance of a WiMAX turbo decoder when using the exact max* operator, FIG. 17b the WiMAX turbo decoder when using the approximate max* operator.

FIGS. 17a, 17b and 17c provide an error correction performance of 17a a WiMAX turbo decoder when using the exact max* operator of equation (11), FIG. 17b the WiMAX turbo decoder when using the approximate max* operator of equation (12) and FIG. 17c the LTE turbo decoder when using the approximate max* operator. The example simulation results were generated for the transmission of the data symbols over BPSK modulation for transmission over an uncorrelated narrow band Rayleigh fading channel. The plots of the bit error rate with respect to signal to noise ratio are provided for the case where the number of iterations are I=32 or I=48 decoding operations using the proposed fully parallel algorithm, as well as I=8 decoding iterations using a conventional Log-BCJR algorithm. Frame lengths of 48, 480, 4800 were employed for the LTE turbo code while frame length N of 24, 240, 2400 for the WiMAX turbo code were used.

The results provided in FIGS. 16a, 16b and 16c suggest that the number of decoding iterations I required by the Log-BCJR algorithm to achieve a particular BER is consistently around ½ TtotP, for the case of LTE turbo decoding using the exact max* operator of (11). As shown by the results presented in FIGS. 17a, 17b and 17c, when employing the approximate max* operator of (12), this number changes to ⅙ TtotP, as shown in FIG. 17c and Table 1. More specifically, FIG. 17c shows that regardless of the frame length N ∈{48, 480, 4800}, the Log-BCJR algorithm employing I=8 decoding iterations achieves the same bit error rate as the proposed fully-parallel algorithm employing I=48 iterations. In the case of the WiMAX turbo code, FIG. 17a and FIG. 17b reveal that the number of decoding iterations I required by the Log-BCJR algorithm is ¼ TtotP, regardless of the frame length N and whether the exact or the approximate max* operator is employed. Note that the error correction performance of the state-of-the-art algorithm of [10] is slightly degraded by its employment of the NSW technique, although this degradation can be considered to be insignificant. Therefore as shown in Table 1, the number of decoding iterations I required by the state-of-the-art algorithm can also be considered to be ⅙ and ¼ TtotP, for the LTE and WiMAX turbo codes, respectively.

Overall Characteristics

The latency D×T×I of a turbo decoder is given by the product of the time period duration D, the number of time periods per decoding iteration T and the required number of decoding iterations I. Meanwhile, the processing throughput is inversely proportional to the latency D×T×I For both LTE and WiMAX turbo decoding, Table 1 quantifies the latency and throughput of the Log-BCJR algorithm and the state-of-the-art algorithm of [10], relative to those of a fully-parallel turbo encoder embodying the present technique. In the case of an LTE turbo code employing the longest supported frame length of N=6144 bits, the latency and throughput of the proposed fully-parallel algorithm are more than three orders-of-magnitude superior to those of the Log-BCJR algorithm. Furthermore, when compared with the state-of-the-art algorithm of [10], the proposed fully-parallel algorithm has a latency and throughput that is 6.88 times superior. Note however that the advantage offered by the proposed fully-parallel algorithm is mitigated if the frame length N is reduced. In the case of the shortest frame length N=2048 that is supported by the considered parameterisation of the state-of-the-art algorithm's NSW technique, the superiority of the proposed fully-parallel algorithm is reduced to 2.29 times. When applying the state-of-the-art algorithm to the WiMAX turbo decoding of frames having lengths in the range N E [1440, 2400], the superiority of the proposed fully-parallel turbo decoder according to the present technique ranges from 3.71 times, up to 6.19 times. Compared to the Log-BCJR algorithm for WiMAX turbo decoding, the fully-parallel turbo decoder according to the present technique is more than three orders-of-magnitude superior, when employing the maximum frame length of N=2400.

The state-of-the-art LTE turbo decoder of [10] achieves a processing throughput of 2.15 Gbit/s and a latency of 2.85 µs, when decoding frames comprising N=6144 bits. This is achieved using a clock frequency of 450 MHz, which corresponds to a time period duration of 2.22 ns. The results of Table 1 suggest that the fully-parallel turbo decoder according to the present technique could achieve a processing throughput of 14.8 Gbit/s and a latency of 0.42 µs, using a clock frequency of 194 MHz. Furthermore, it may be assumed that the state-of-the-art turbo decoder of [10] could maintain a processing throughput of 2.15 Gbit/s when applied for WiMAX decoding. If so, then this suggests that the proposed fully-parallel algorithm could achieve a processing throughput of 13.3 Gbit/s and a latency of 0.36 µs, when decoding frames having a length of N=2400 bits. Note that these multi-gigabit throughputs are comparable to those that are offered by fully-parallel LDPC decoders [9].

While the fully-parallel turbo decoder according to the present technique offers significant improvements to processing throughput and latency, this is achieved at the cost of requiring an increased parallelism and computational complexity. The overall computational complexity C×I is given as the product of the computational complexity per decoding iteration C and the required number of decoding iterations I. For both LTE and WiMAX turbo decoding, Table 1 quantifies the overall computational complexity of the Log-BCJR algorithm and the state-of-the-art algorithm of [10], relative to those of the proposed fully-parallel algorithm. As shown in Table 1, the computational complexity of the proposed fully-parallel algorithm can be more than five times higher than that of the Log-BCJR algorithm. Compared to the state-of-the-art algorithm of [10] however, the proposed fully-parallel algorithm has a computational complexity that is about three times higher.

Pipelined Fully-Parallel Turbo Decoder

A further example embodiment of the present technique provides further enhancement in which the modified turbo decoder is adapted to allow a pipelined element to the parallel processing operation. An embodiment of the present technique will be explain with reference to FIGS. 18, 19, 20, 21 and 22.

As described above, in the $t^{th}$ time period during the operation of an LTE fully parallel turbo decoder, the $k^{th}$ processing element in the upper row of FIG. 8 may employ Equations (7) to (10) to combine the L=3 a priori LLRs $\overline{b}_{1,k}^{t-1,u,a}$ and $\overline{b}_{3,k}^{t-1,u,a}$, as well as the M=8 a priori forward state metrics of $\overline{\alpha}_{k-1}^{t-1,u}=[\overline{\alpha}_{k-1}^{t-1,u}(S_{k-1})]_{S_{k-1}=0}^{M-1}$ and the M=8 a priori backward state metrics of $\overline{\beta}_k^{t-1,u}=[\overline{\beta}_k^{t-1,u}(S_k)]_{S_k=0}^{M-1}$, which were generated by the connected processing elements in the previous time period, having the index t−1. This results in the set of MK=16 a posteriori transition metrics, where each $\overline{\delta}_k^t(S_{k-1},S_k)$ corresponds to a particular one of the K=2 transitions that emerge from one of the M=8 states. Following this, the a posteriori transition metrics are combined to obtain the M=8 extrinsic forward state metrics of $\overline{\alpha}_k^{t,u}$ and the M=8 a priori backward state metrics of $\overline{\beta}_{k-1}^{t,u}$, as well as the extrinsic LLR $\overline{b}_{1,k}^{t,u,e}$, which is interleaved to obtain the a priori LLR $\overline{b}_{1,\pi_{-1}}^{t,l,a}$. Meanwhile, in the $t^{th}$ time period, the $k^{th}$ processing element in the lower row of FIG. 8 may employ Equations (7) to (10) to process the L=2 a priori LLRs $\overline{b}_{1,k}^{t-1,l,a}$ and $\overline{b}_{2,k}^{t-1,l,a}$, as well as the M=8 a priori forward state metrics of $\overline{\alpha}_{k-1}^{t-1,l}$ and the M=8 a priori backward state metrics of $\overline{\beta}_k^{t-1,l}$. This results in the M=8 extrinsic forward state metrics of $\overline{\alpha}_k^{t,l}$ and the M=8 a priori backward state metrics of $\overline{\beta}_{k-1}^{t,l}$, as well as the extrinsic LLR $\overline{b}_{1,k}^{t,l,e}$, which is interleaved to obtain the a priori LLR $\overline{b}_{1,\pi}^{t,u,a}$. The LLRs and state metrics generated in the $t^{th}$ time period may then be employed by the connected processing elements in the next time period, having the index t+1.

Figure 18:
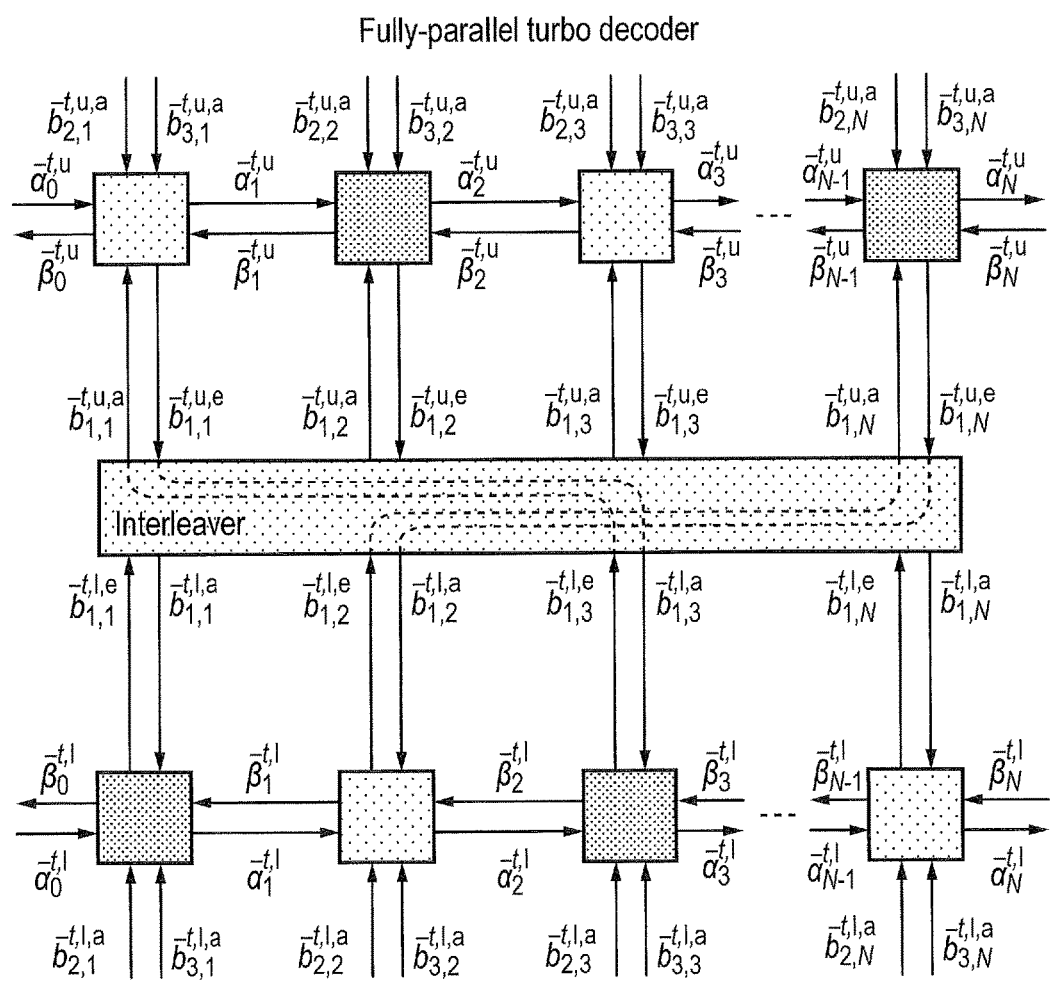
FIG. 18 provides a schematic block diagram of an alternative embodiment of the fully-parallel turbo decoder shown in FIG. 8, which is specific to the LTE turbo code.

Equivalently, the LTE fully parallel turbo decoder may be implemented using FIG. 18 and Equations (15) to (18), in order to benefit from a reduced complexity C and time period duration D. In this case, each processing element in the lower row of FIG. 18 processes L=3 a priori LLRs $\overline{b}_{1,k}^{t-1,l,a}$, $\overline{b}_{2,k}^{t-1,l,a}$ and $\overline{b}_{3,k}^{t-1,l,a}$, rather than L=2 as described above. Here, $b_{3,k}^{t-1,l,a}$ is provided by the interleaver, according to $\overline{b}_{3,k}^{t-1,u,a}$. Note that Equations (15) to (18) operate on the basis of the a priori transitions metrics $\overline{\gamma}_k^t(S_{k-1}, S_k)$, rather than the a posteriori transition metrics $\overline{\delta}_k^t(S_{k-1},S_k)$ of Equations (7) to (10). Note also that the subtraction of $\overline{\alpha}_k^t(0)$ and $\overline{\beta}_{k-1}^t(0)$ in Equations (16) and (17) represents normalization, which avoids the extrinsic state metric values growing without bound and overflowing in fixed-point implementations.

$$\bar{\gamma}_k^t(S_{k-1},S_k) = \sum_{j=1}^3 [b_j(S_{k-1},S_k) \cdot \bar{b}_{j,k}^{t-1,a}] \quad (15)$$

$$\bar{\alpha}_k^t(S_k) = [\max^*_{\{S_{k-1}|c(S_{k-1},S_k)=1\}}[\bar{\gamma}_k^t(S_{k-1},S_k) + \bar{\alpha}_{k-1}^{t-1}(S_{k-1})]] - \bar{\alpha}_k^t(0) \quad (16)$$

$$\bar{\beta}_{k-1}^t(S_{k-1}) = [\max^*_{\{S_k|c(S_{k-1},S_k)=1\}}[\bar{\gamma}_k^t(S_{k-1},S_k) + \bar{\beta}_k^{t-1}(S_k)]] - \bar{\beta}_{k-1}^t(0) \quad (17)$$

$$\bar{b}_{1,k}^{t,e} = [\max^*_{\{(S_{k-1},S_k)|b_1(S_{k-1},S_k)=1\}}[b_2(S_{k-1},S_k) \cdot \bar{b}_{2,k}^{t-1,a} + \bar{\alpha}_{k-1}^{t-1}(S_{k-1}) + \bar{\beta}_k^{t-1}(S_k)]] - [\max^*_{\{(S_{k-1},S_k)|b_1(S_{k-1},S_k)=0\}}[[b_2(S_{k-1},S_k) \cdot \bar{b}_{2,k}^{t-1,a} + \bar{\alpha}_{k-1}^{t-1}(S_{k-1}) + \bar{\beta}_k^{t-1}(S_k)]]] \quad (18)$$

As in the fully parallel turbo decoder of FIG. 8, the alternative design of FIG. 18 can activate all processing elements in all time periods. Alternatively, the alternative design of FIG. 18 can exploit the odd-even nature of the LTE turbo code in order to improve its complexity, throughput or hardware resource requirement, as in the fully parallel turbo decoder of FIG. 8. The complexity can be improved when decoding a single frame by using alternate time periods to alternate between (a) activating only the lightly-shaded processing elements in FIG. 18 and (b) activating only those that are darkly-shaded, in analogy with FIG. 10. Alternatively, the throughput can be improved by decoding two frames simultaneously. This is achieved by using alternate time periods to alternate between (a) using the lightly-shaded and darkly-shaded processing elements in FIG. 18 to decode the first and second frame respectively, and (b) using them to decode the second and first frame respectively, in analogy with FIG. 11. Finally, the hardware resource requirement can be improved by using only the upper row of processing elements to decode a single frame. This is achieved by using alternate time periods to alternate between (a) using the lightly-shaded and darkly-shaded processing elements in FIG. 18 to perform the operations of the corresponding processing element in the upper and lower row respectively and (b) using them to perform the operations of the corresponding processing element in the lower and upper row respectively, in analogy with FIG. 12.

Figure 19:
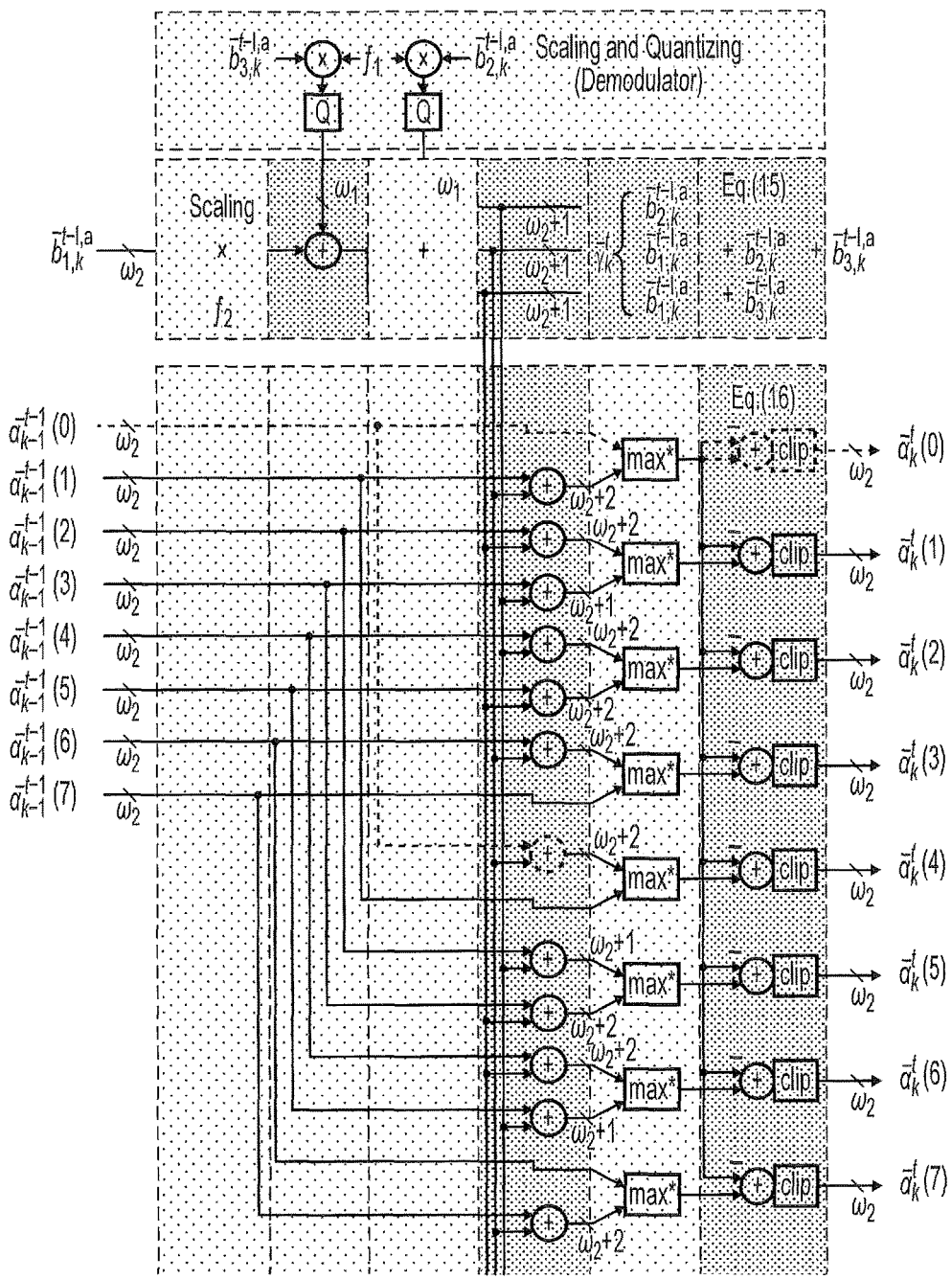
FIG. 19 is an example circuit providing a detailed implementation of a fully-parallel turbo decoder according to the example shown in FIG. 18, which is specific to the LTE turbo code.
Figure 19:
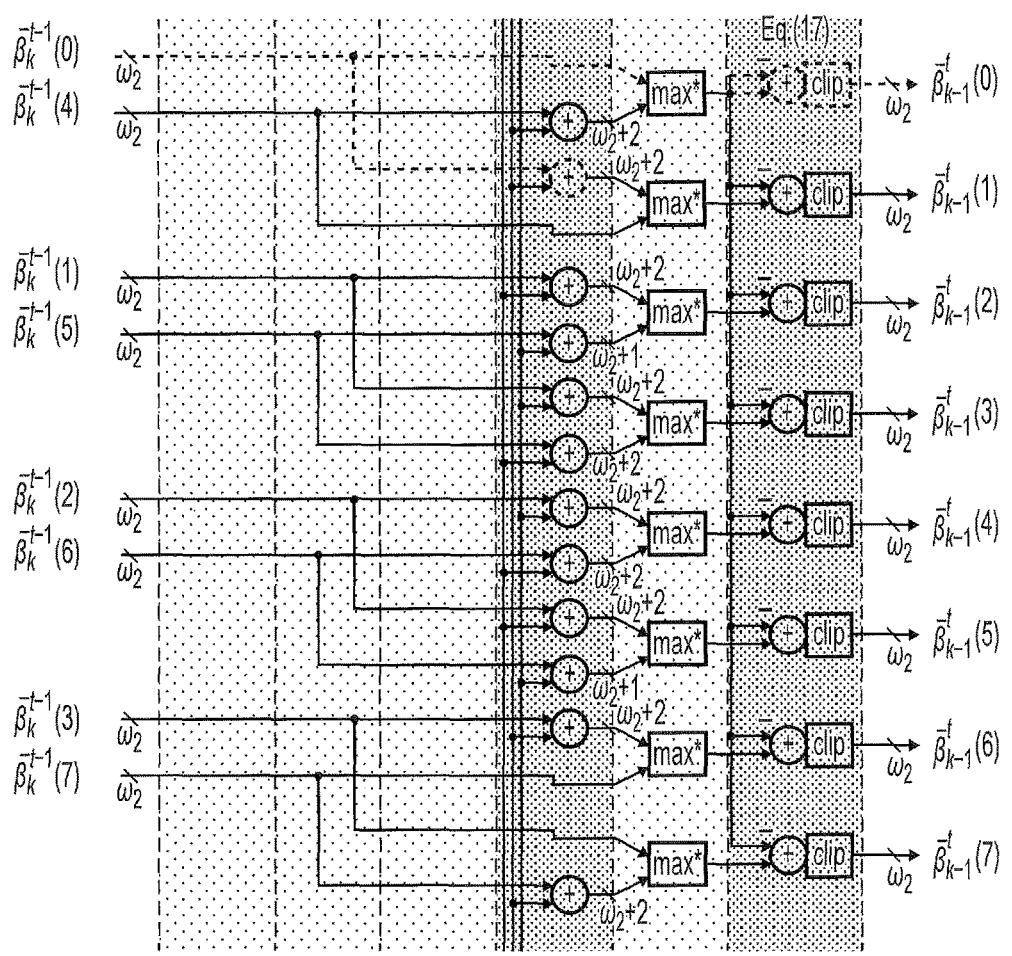
Figure 19:
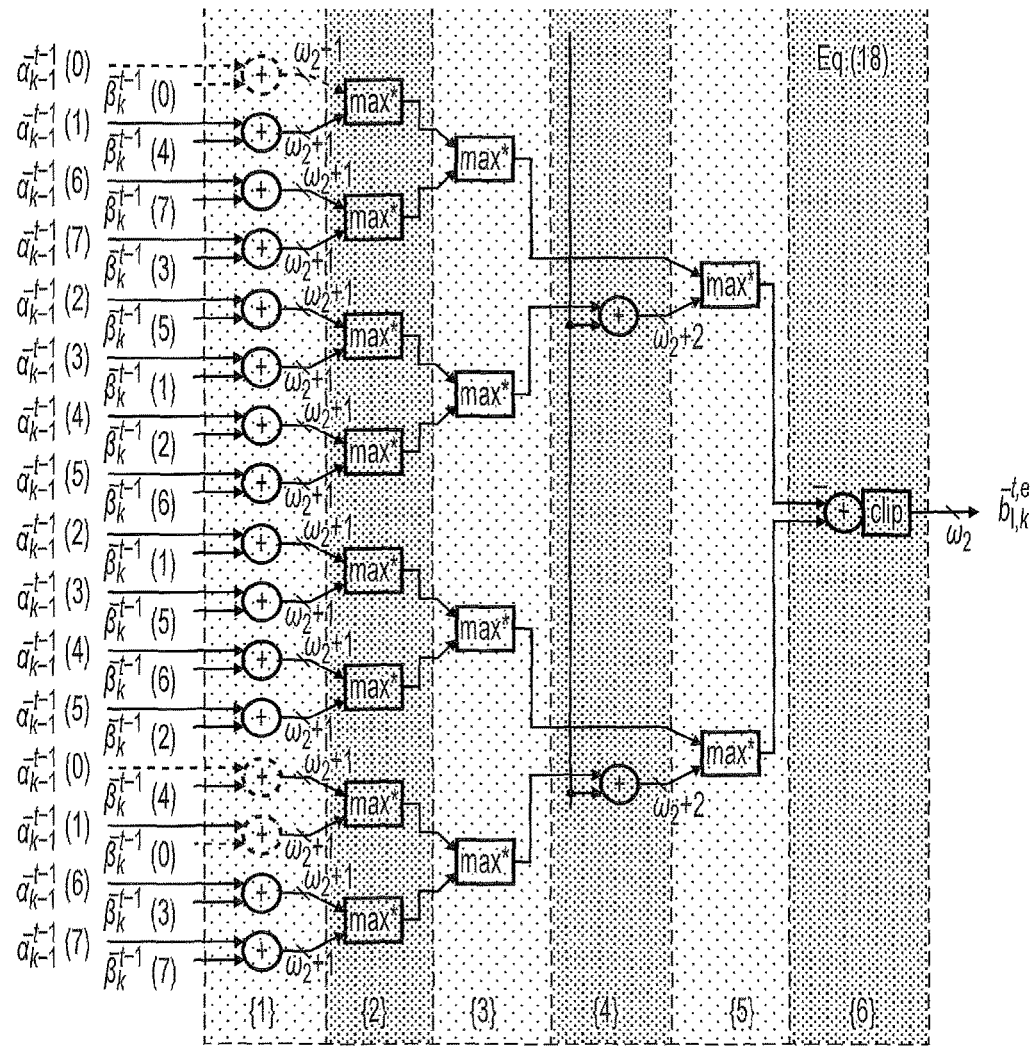

In the processing elements of the alternative design of FIG. 18, Equations (15) to (18) may be implemented using the data path of FIG. 19. Here, the implementation of Equation (15) exploits the observation that all MK=16 a priori transition metrics $\bar{\gamma}_k^{-t}(S_{k-1},S_k)$ adopt one of four values, namely 0, $\bar{b}_{2,k}^{t-1,a}$, $\bar{b}_{1,k}^{t-1,a} + \bar{b}_{2,k}^{t-1,a} + \bar{b}_{3,k}^{t-1,a}$ or $\bar{b}_{1,k}^{t-1,a} + \bar{b}_{3,k}^{t-1,a}$. Likewise, the implementation of Equation (18) exploits the observation that max*(a+c, b+c)=max*(a, b)+c in order to reduce the number of additions required. Furthermore, since normalization guarantees that $\bar{\alpha}_k^t(0)=0$ and $\bar{\beta}_{k-1}^t(0)=0$, the additions shown with dashed outlines can be omitted. Scaling is included for the sake of mitigating the error correction performance degradation that occurs when employing the approximation max*(a, b)≈max(a, b), where the scaling by $f_2=0.75$ can be implemented for fixed-point arithmetic using bit shifting and a single addition. Finally, clipping is used to maintain the bit widths of the fixed point arithmetic, where $w_1=4$ and $w_2=6$ may be employed, for example. Note that the critical path of FIG. 19 comprises six data path stages, resulting in a time period duration of D=6. This critical path is imposed by Equation (18), as well as by the serial operation of Equation (15) then Equations (16) and (17), where the latter three equations each comprise only three data path stages individually.

Figure 20:
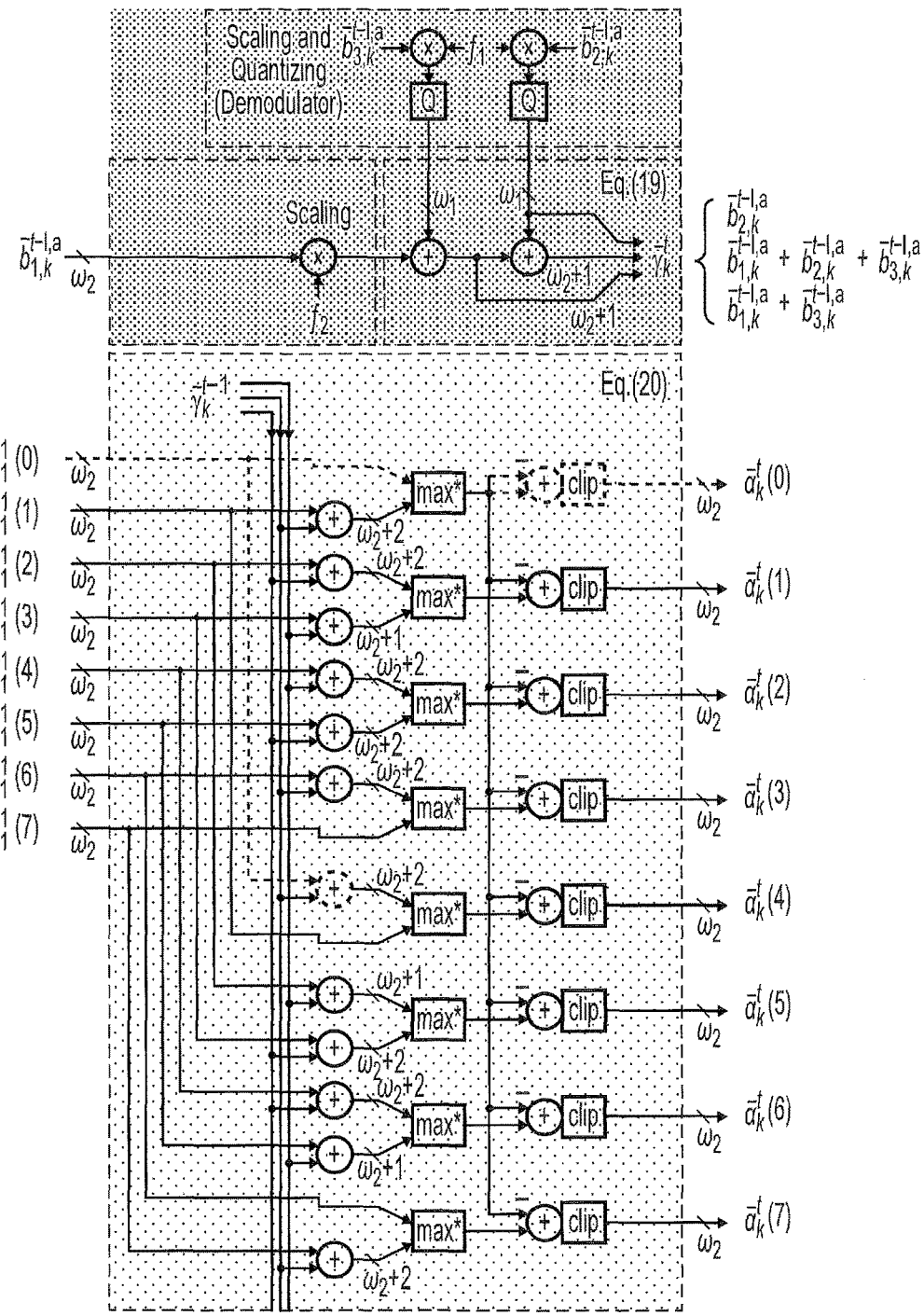
FIG. 20 is an example circuit providing a detailed implementation of a pipelined fully-parallel turbo decoder, which is specific to the LTE turbo code.
Figure 20:
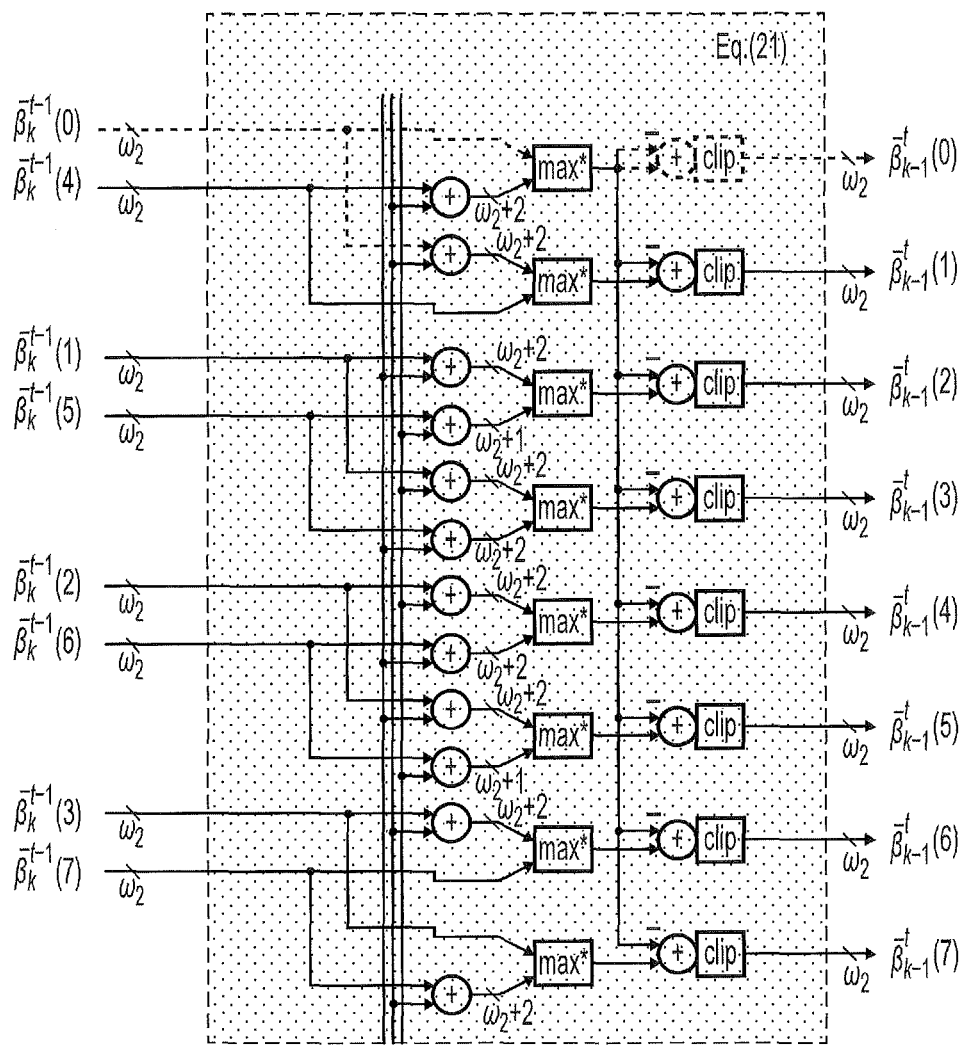
Figure 20:
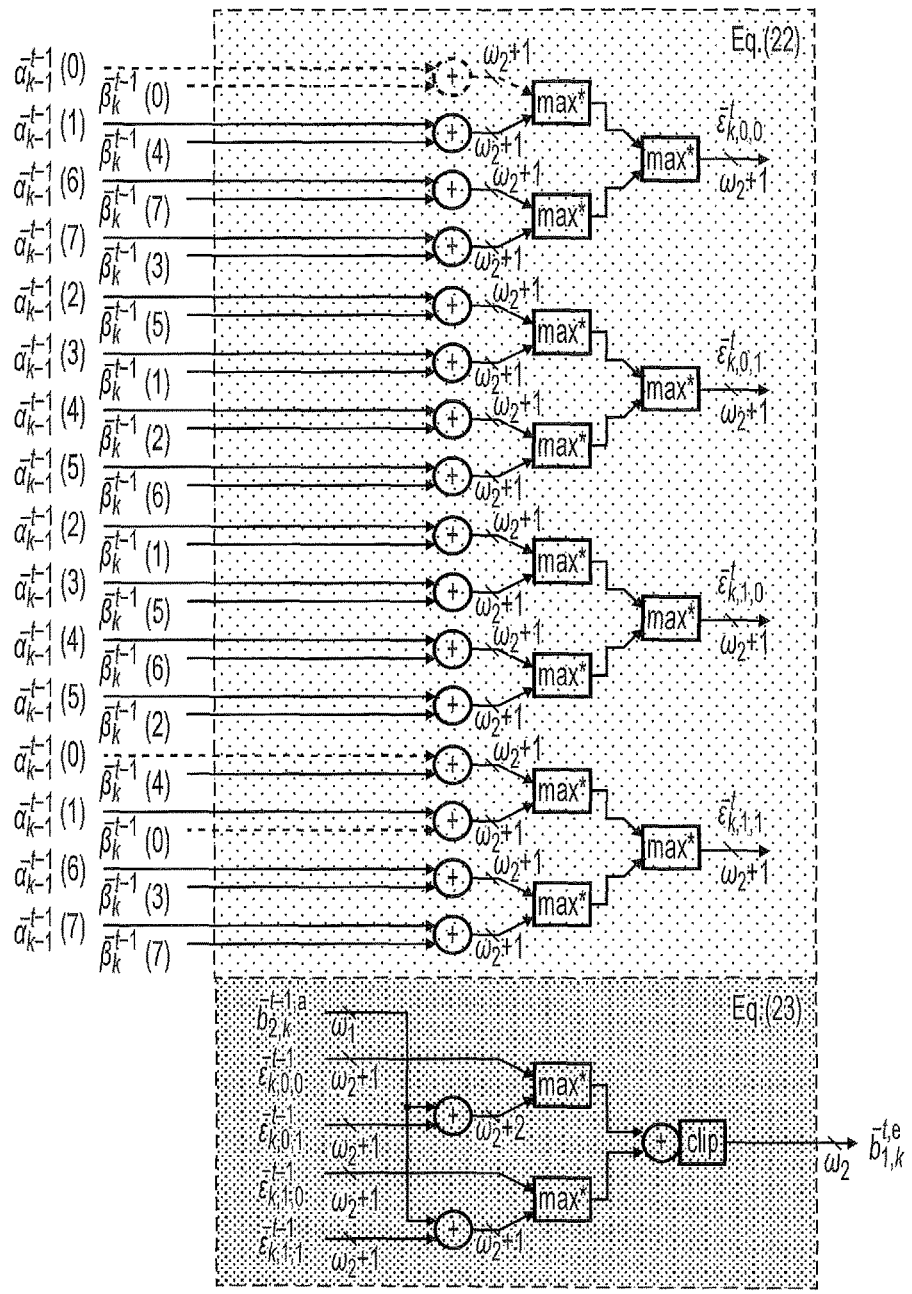

This motivates the pipelined data path of FIG. 20, which has a critical path comprising only three data path stages, resulting in a time period duration of D=3. The operation of this data path may be described by Equations (19) to (23). Note that Equations (20) and (21) are functions of the pipelined a priori transition metrics $\bar{\gamma}_k^{t-1}(S_{k-1},S_k)$ calculated in the previous time period, rather than of those $\bar{\gamma}_k^t(S_{k-1},S_k)$ calculated in the current time period, as employed by Equations (16) and (17). Furthermore, Equations (22) and (23) split Equation (18) into two pipeline stages, where the extrinsic LLR $\bar{b}_{1,k}^{t,e}$ becomes a function of intermediate calculations results $\bar{\varepsilon}_{k,l,m}^{t-1}$ in obtained in the previous time period.

$$\bar{\gamma}_k^t(S_{k-1},S_k) = \sum_{j=1}^3 [b_j(S_{k-1},S_k) \cdot \bar{b}_{j,k}^{t-1,a}] \quad (19)$$

$$\bar{\alpha}_k^t(S_k) = [\max^*_{\{S_{k-1},S_k=1\}}[\bar{\gamma}_k^{t-1}(S_{k-1},S_k) + \bar{\alpha}_{k-1}^{t-1}(S_{k-1})]] - \bar{\alpha}_k^t(0) \quad (20)$$

$$\bar{\beta}_{k-1}^t(S_{k-1}) = [\max^*_{\{S_k|c(S_{k-1},S_k)=1\}}[\bar{\gamma}_k^{t-1}(S_{k-1},S_k) + \bar{\beta}_k^{t-1}(S_k)]] - \bar{\beta}_{k-1}^t(0) \quad (21)$$

$$\bar{\varepsilon}_{k,l,m}^t = \max^*_{\{(S_{k-1},S_k)|b_1(S_{k-1},S_k)=m\}}[\bar{\alpha}_{k-1}^{t-1}(S_{k-1}) + \bar{\beta}_k^{t-1}(S_k)] \quad (22)$$

$$\bar{b}_{1,k}^{t,e} = [\max^*_{\{m\in\{0,1\}\}}[m \cdot \bar{b}_{2,k}^{t-1,a} + \bar{\varepsilon}_{k,1,m}^{t-1}]] - [\max^*_{\{m\in\{0,1\}\}}[m \cdot \bar{b}_{2,k}^{t-1,a} + \bar{\varepsilon}_{k,0,m}^{t-1}]] \quad (23)$$

Figure 21:
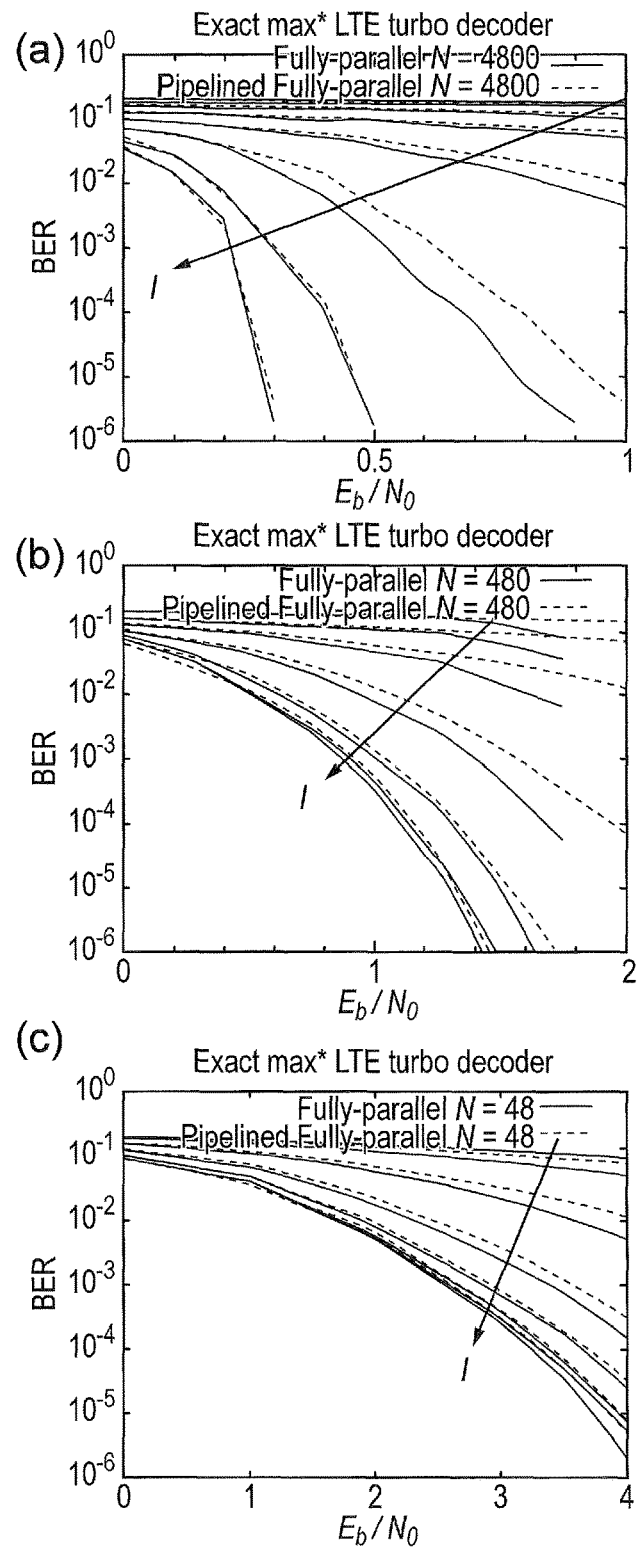
FIGS. 21a, 21b and 21c provide graphical plots of bit error rate with respect to signal to noise ratio representing the error correction performance of LTE turbo decoders employing the circuits of FIGS. 19 and 20, when decoding frames comprising (a) N=4800, (b) N=480 and (c) N=48 bits.

Note that the pipelined data path of FIG. 20 causes the fully parallel turbo decoder to process state metrics at a different rate to the LLRs. More specifically, while the extrinsic state metrics $\bar{\alpha}_k^t(S_k)$ and $\bar{\beta}_{k-1}^t(S_{k-1})$ are affected by the a priori state metrics provided in the previous time period $\bar{\alpha}_{k-1}^{t-1}(S_{k-1})$ and $\bar{\beta}_k^{t-1}(S_k)$, they are not affected by the a priori LLRs provided in the previous time period $\bar{b}1,k^{t-1,a}$, $\bar{b}_{2,k}^{t-1,a}$ and $\bar{b}_{3,k}^{t-1,a}$. Instead, they are affected by the a priori LLRs provided two time periods ago $\bar{b}_{1,k}^{t-2,a}$, $\bar{b}_{2,k}^{t-2,a}$ and $\bar{b}_{3,k}^{t-2,a}$. Likewise, the extrinsic LLR $\bar{b}_{1,k}^{t,e}$ is not affected by the a priori state metrics provided in the previous time period $\bar{\alpha}_{k-1}^{t-1}(S_{k-1})$ and $\bar{\beta}_k^{t-1}(S_k)$. Instead, it is affected by the a priori state metrics provided two time periods ago $\bar{\alpha}_{k-1}^{t-2}(S_{k-1})$ and $\bar{\beta}_k^{t-2}(S_k)$. Owing to this, the pipelined data path results in a different error correction performance for the fully parallel turbo decoder. FIG. 21 compares the BER performance of the pipelined fully parallel turbo decoder with that of the original design, when employing BPSK modulation for communication over an AWGN channel. Since the time period duration D of the original design is double that of the pipelined design, a fair comparison in terms of decoding time is obtained by comparing I iterations of the original design with 2I iterations of the pipelined design. As shown in FIG. 21, the pipelined design offers an improved BER performance compared to the original design, when the decoding time is fixed. Equivalently, the pipelined design can be said to offer an improved throughput and latency compared to the original design, when the target BER is fixed.

Figure 22:
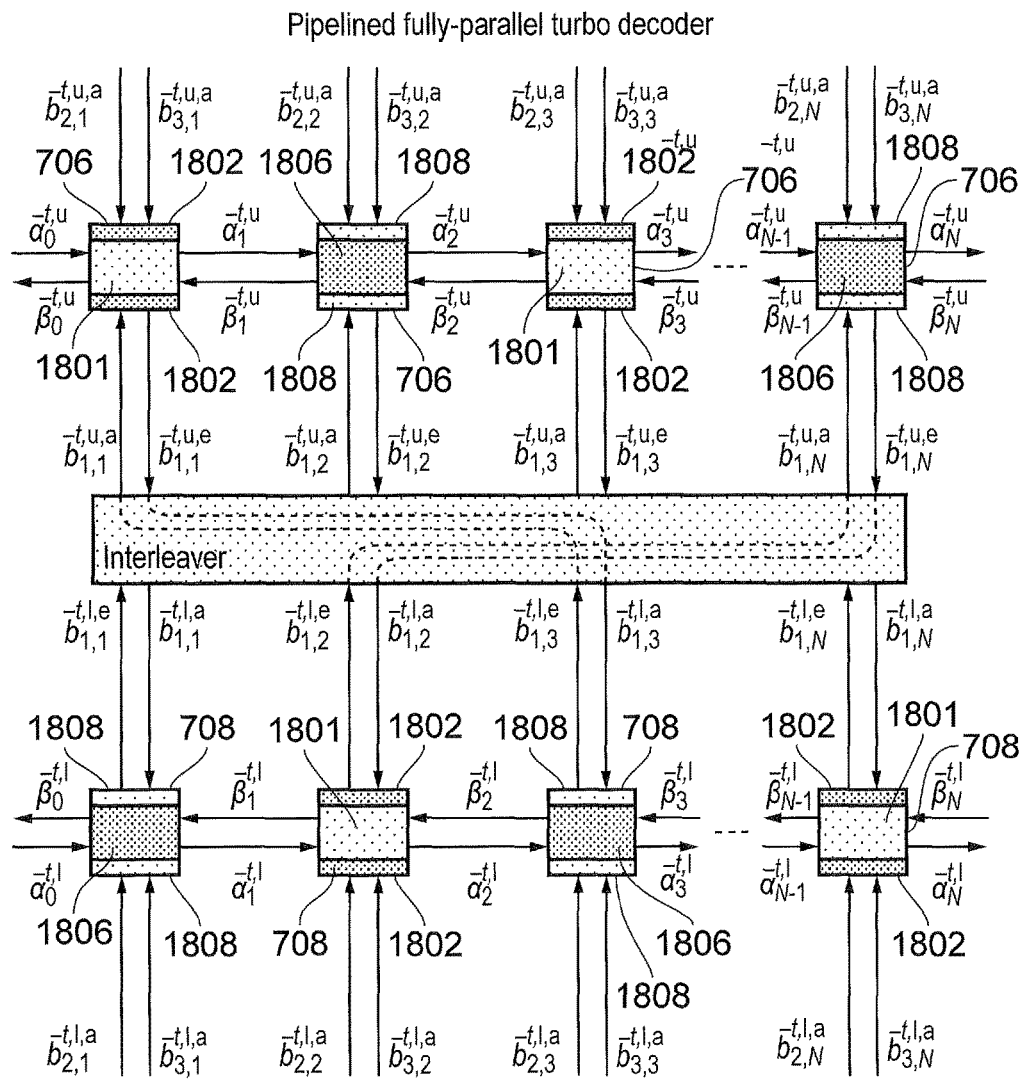
FIG. 22 provides a schematic block diagram of a pipelined fully-parallel turbo decoder according to another example embodiment in which odd and even processors perform alternately different parts of the calculations required of the fully-parallel turbo decoder, which is specific to the LTE turbo code.

As in the fully parallel turbo decoder of FIG. 18, the pipelined design can activate all processing elements in all time periods. Alternatively, the pipelined design can exploit the odd-even nature of the LTE turbo code in order to improve its complexity, throughput or hardware resource requirement, as shown in FIG. 22, where parts corresponding to those on the FIG. 10 bear the same numerical references. Here, the top and bottom shaded regions 1802, 1808 of each processing element 706, 708 implement Equations (19) and (23) respectively, while the middle shaded region 1801, 1806 implements Equations (20) to (22). The complexity of the pipelined fully parallel turbo decoder can be improved when decoding a single frame by using alternate time periods to alternate between (a) activating only the lighted-shaded parts 1801, 1808 of the processing elements in FIG. 22 and (b) activating only the darkly-shaded parts 1802, 1806, in analogy with FIG. 10. Alternatively, the throughput can be improved by decoding two frames simultaneously. This is achieved by using alternate time periods to alternate between (a) using the lightly-shaded and darkly-shaded parts of the processing elements in FIG. 22 to decode the first and second frame respectively, and (b) using them to decode the second and first frame respectively, in analogy with FIG. 11. Finally, the hardware resource requirement can be improved by using only the upper row of processing elements to decode a single frame. This is achieved by using alternate time periods to alternate between (a) using the lightly-shaded and darkly-shaded parts of the processing elements in FIG. 22 to perform the operations of the corresponding processing element in the upper and lower row respectively and (b) using them to perform the operations of the corresponding processing element in the lower and upper row respectively, in analogy with FIG. 12.

Summary of Advantages

Embodiments of the present technique can provide a fully-parallel turbo decoder which eliminates or at least reduces data dependencies of known techniques and facilitates a fully-parallel operation. Owing to its significantly increased parallelism, embodiments of the present technique can facilitate throughputs and latencies that are up to 6.88 times superior than those of known techniques, when employed for standardized turbo codes. In these applications, a turbo decoder according to the present technique can facilitate processing throughputs of up to 14.8 Gbit/s, as well as latencies as small as 0.42 μs, but of course the actual throughput and latency will depend on the hardware technology used. However, this is achieved at the cost of a computational complexity that is about three times higher than that of the conventional techniques.

As mentioned above, embodiments of the present technique can provide a turbo decoding or detecting process for recovering or detecting data, which has in general undergone a Markov type process. In this regard, embodiments of the present technique can provide a turbo detector or decoder, which processes soft decision values to generate extrinsic values, which can become a priori values for another decoder/detector. As will be appreciated therefore the turbo detector could operate by exchanging extrinsic information with another detector or decoder. A fully-parallel turbo detector embodying the present technique could therefore be used to form an equaliser, a synchronisation detector, a channel estimator, a multi-user detector, a MIMO detector or a joint source/channel decoder.

Although the present technique has been described with reference to LTE and WiMAX, it will be appreciated that there are only examples and a turbo decoder according to the present technique could be used for any form of turbo encoded data and is not limited to LTE or WiMAX.

According to the above description, embodiments of the present technique can provide a receiver for detecting and recovering a frame of data symbols from a received signal, the data symbols of the frame having been effected, during the process of transmission, by a Markov process with the effect that the data symbols of the frame in the received signal are dependent one or more preceding data symbols which can be represented as a trellis having a plurality of trellis stages. The receiver comprises a first detection processor configured to receive the frame of data symbols represented as a soft decision value for each data symbol of the frame, and at least one other detection processor which is configured to co-operate with the first detection processor to perform in combination a turbo detection process to generate an estimate of the frame of data symbols. The first detection processor comprises a plurality of processing elements, each of the processing elements being associated with one of the trellis stages representing the dependency of the data symbols of the frame according to the Markov process and each of the processing elements is configured to receive one or more soft decision values corresponding to one or more data symbols associated with the trellis stage. Each of the one or more of the processing elements is configured, in one processing iteration to receive data representing an a priori forward state metric from a first neighboring processing element, data representing an a priori backward state metric from a second neighboring processing element, and data representing a priori information for the one or more data symbols being detected for the trellis stage associated with the processing element from the at least one other detection processor. Each processing elements combines the a priori forward state metric, the a priori backward state metric and the a priori information relating to the one or more data symbols to determine an extrinsic forward state metric, an extrinsic backward metric and extrinsic data information corresponding to the one or more data symbols for the trellis stage associated with the processing element. Each processing element provides the extrinsic forward state metric to the second neighboring processing element, the extrinsic backward state metric to the first neighboring processing element, which becomes the a priori backward state metric for the next iteration, and the extrinsic data information to the at least one other detection processor, which becomes the a priori information relating to the data symbol for the next iteration. For each of a plurality of iterations of the turbo detection process, the first detection processor and the at least one other detection processor are configured to exchange for each of the processing elements representing the trellis stages the a priori information for the one or more data symbols being detected for the trellis stage associated with the processing element and the extrinsic data information corresponding to the one or more data symbols generated by the processing. As explained above, processing can take place in two or more of the decoders contemporaneously, so that each of the decoders is generating intermediate results to be exchanged with the others of the decoders. Furthermore, fixed point representation of the information exchanged between processing elements can be used.

According to one example embodiment there is provided a detection circuit for performing a turbo detection process to recover a frame of data symbols or bits from a received signal comprising data representing one or more soft decision values for each data symbol of the frame. The data symbols or bits of the frame have been affected, during transmission, by a Markov process with the effect that the data symbols of the frame in the received signal are dependent on one or more preceding data symbols which can be represented as a trellis having a plurality of trellis stages. The detection processor comprises a plurality of processing elements. Each of the processing elements is associated with one of the trellis stages representing the dependency of the data symbols of the frame according to the Markov process and each of the processing elements is configured to receive one or more soft decision values corresponding to one or more data symbols associated with the trellis stage. Each of one or more of the processing elements is configured, in one clock cycle, to receive data representing a priori forward state metrics from a first neighboring processing element, to receive data representing a priori backward state metrics from a second neighboring processing element, and to receive data representing a priori soft decision values for the one or more data symbols being detected for the trellis stage associated with the processing element. The processing element combines the a priori forward state metrics, the a priori backward state metrics and the a priori soft decision values relating to the one or more data symbols to determine extrinsic forward state metrics, extrinsic backward metrics and extrinsic soft decision values corresponding to the one or more data symbols for the trellis stage associated with the processing element, and communicates the extrinsic forward state metrics to the second neighboring processing element, which becomes the a priori forward state metrics for a next clock cycle, communicates the extrinsic backward state metrics to the first neighboring processing element, which becomes the a priori backward state metrics for the next clock cycle, and provides the extrinsic soft decision values, which becomes the a priori soft decision values relating to the data symbol for the next clock cycle. For one or more of a plurality of consecutive clock cycles of the turbo detection process, the processing elements of the detection circuit are configured to operate simultaneously.

For example, for each of a plurality of clock cycles of the turbo detection process, the detection circuit is configured to process, for each of the processing elements representing the trellis stages, the a priori information for the one or more data symbols being detected for the trellis stage associated with the processing element. In some examples, the detection circuit operates in co-operation with another detection circuit, and to exchange the extrinsic soft decision values corresponding to the one or more data symbols generated by the processing element, with the other detection circuit. In some example the extrinsic soft decision values are exchanged after each clock cycle.

REFERENCES

[1] ETSI TS36.212 v 10.8.0 (2013-06)LTE; Evolved Universal Terrestrial Radio Access (E-UTRA); Multiplexing and Channel Coding, V10.2.0 ed., 2011.
[2] IEEE 802.16-2012 Standard for Local and Metropolitan Area Networks-Part 16: Air Interface for Broadband Wireless Access Systems, 2012.
[3] C. Berrou, A. Glavieux, and P. Thitimajshima, "Near Shannon limit error-correcting coding and decoding: Turbo-codes (1)," in Proc. IEEE Int. Conf. on Communications, vol. 2, Geneva, Switzerland, May 1993, pp. 1064-1070.
[4] P. Robertson, E. Villebrun, and P. Hoeher, "A comparison of optimal and sub-optimal MAP decoding algorithms operating in the log domain," in Proc. IEEE Int. Conf. on Communications, vol. 2, Seattle, Wash., USA, June 1995, pp. 1009-1013.
[5] IEEE 802.11n-2009 Standard for Information Technology-Telecommunications and Information Exchange between Systems—Local and Metropolitan Area Networks-Specific Requirements-Part 11: Wireless LAN Medium Access Control (MAC) and Physical Layer (PHY), 2009.
[6] D. J. C. MacKay and R. M. Neal, "Near Shannon limit performance of low density parity check codes," Electron. Lett., vol. 32, no. 18, pp. 457-458, August 1996.
[7] M. Fossorier, "Reduced complexity decoding of low-density parity check codes based on belief propagation," IEEE Trans. Commun., vol. 47, no. 5, pp. 673-680, May 1999.
[8] 5G Radio Access. Ericsson White Paper, June 2013.
[9] V. A. Chandrasetty and S. M. Aziz, "FPGA implementation of a LDPC decoder using a reduced complexity message passing algorithm," Journal of Networks, vol. 6, no. 1, pp. 36-45, January 2011.
[10] T. Ilnseher, F. Kienle, C. Weis, and N. Wehn, "A 2.15 GBit/s turbo code decoder for LTE Advanced base station applications," in Proc. Int. Symp. on Turbo Codes and Iterative Information Processing, Gothenburg, Sweden, August 2012, pp. 21-25.
[11] L. Fanucci, P. Ciao, and G. Colavolpe, "VLSI design of a fully-parallel high-throughput decoder for turbo gallager codes," IEICE Trans. Fundamentals, vol. E89-A, no. 7, pp. 1976-1986, July 2006.
[12] D. Vogrig, A. Gerosa, A. Neviani, A. Graell I Amat, G. Montorsi, and S. Benedetto, "A 0.35-µm CMOS analog turbo decoder for the 40-bit rate ⅓ UMTS channel code," IEEE J. Solid-State Circuits, vol. 40, no. 3, pp. 753-762, 2005.
[13] Q. T. Dong, M. Arzel, C. J. Jego, and W. J. Gross, "Stochastic decoding of turbo codes." IEEE Trans. Signal Processing, vol. 58, no. 12, pp. 6421-6425, December 2010.
[14] A. Nimbalker, Y. Blankenship, B. Classon, and T. K. Blankenship, "ARP and QPP interleavers for LTE turbo coding," in Proc. IEEE Wireless Commun. Networking Conf., Las Vegas, Nev., USA, March 2008, pp. 1032-1037.
[15] L. Li, R. G. Maunder, B. M. Al-Hashimi, and L. Hanzo, "A low-complexity turbo decoder architecture for energy-efficient wireless sensor networks," IEEE Trans. VLSI Syst., vol. 21, no. 1, pp. 14-22, January 2013. [Online]. Available: http://eprints.soton.ac.uk/271820/
[16] P. Radosavljevic, A. de Baynast, and J. R. Cavallaro, "Optimized message passing schedules for LDPC decoding," in Asilomar Conf. Signals Systems and Computers, no. 1, Pacific Grove, Calif., USA, October 2005, pp. 591-595.
[17] CN 102611464
[18] CN 102723958
[19] WO 2011/082509
[20] "A 122 Mb/s Turbo decoder using a mid-range GPU" by Xianjun J., et al, published at Wireless Communications and Mobile Computing Conference (IWCMC), 2013 9th International, pages 1090-1094, 1-5 Jul. 2013.

The invention claimed is:

1. A detection circuit for performing a turbo detection process to recover a frame of data symbols from a received signal comprising fixed point data representing one or more soft decision values for each data symbol of the frame, the data symbols of the frame having been affected, during the process of transmission, by a Markov process with the effect that the data symbols of the frame in the received signal are dependent on one or more preceding data symbols which can be represented as a trellis having a plurality of trellis stages, the detection circuit comprising a plurality of processing elements, each of the processing elements being associated with one of the trellis stages representing the dependency of the data symbols of the frame according to the Markov process and each of the processing elements is configured to receive fixed point data representing soft decision values for one or more data symbols associated with the trellis stage, and each of one or more of the processing elements is configured, in one clock cycle to receive fixed point data representing a priori forward state metrics from a first neighboring processing element, to receive fixed point data representing a priori backward state metrics from a second neighboring processing element, and to receive fixed point data representing a priori soft decision values for the one or more data symbols being detected for the trellis stage associated with the processing element, to combine the a priori forward state metrics, the a priori backward state metrics and the a priori soft decision values relating to the one or more data symbols to determine one or more fixed point extrinsic forward state metrics, one or more fixed point extrinsic backward metrics and fixed point extrinsic soft decision values corresponding to the one or more data symbols for the trellis stage associated with the processing element, and to communicate the one or more extrinsic forward state metrics to the second neighboring processing element, which become the a priori forward state metrics for that processing element in a next clock cycle, to communicate the one or more extrinsic backward state metrics to the first neighboring processing element, which become the a priori backward state metrics for that processing element in the next clock cycle, and to provide the one or more extrinsic soft decision values, which become the a priori soft decision values relating to the data symbols for a next clock cycle, wherein for one or more of a plurality of consecutive clock cycles of the turbo detection process, the processing elements of the detection circuit are configured to operate simultaneously.

2. A detection circuit as claimed in claim 1, wherein each of the one or more processing elements is configured, in one clock cycle to form for each transition of the plurality of transitions of the trellis, an a posteriori transition metric ($.delta._k(S_{k-1},S_k)$), by combing the a priori forward state metric ($.alpha._{k-1}(S_{k-1})$) of the transition's previous state ($S_{k-1}$) received from the first neighbouring neighboring processing element, the backward state metric ($.beta._k (S_k)$) of the transition's next state ($S_k$) received from the second neighboring processing element and at least one of a combination of soft decision values for each of the one or more data symbols corresponding to the state transition ($[.SIGMA._{j=1}^{L}[b_j(S_{k-1},S_k)b_{j,k}^a]]$), or other soft decision information ($\ln[\Pr\{S_k|S_{k-1}\}]$) relating to the state transition.

3. A detection circuit as claimed in claim 1, wherein each of the one or more processing elements is configured to form for each transition of the plurality of transitions of the trellis, an a posteriori transition metric ($.delta._k (S_{k-1}, S_k)$) in one clock cycle, by combining the a priori forward state metric ($.alpha._{k-1}(S_{k-1})$) of the transition's previous state ($S_{k-1}$) received from the first neighboring processing element, the backward state metric ($.beta._k(S_k)$) of the transition's next state ($S_k$) received from the second neighboring processing element, and a combination of soft decision values for each of the one or more data symbols corresponding to the state transition ($[.SIGMA._{j=1}^{L}[b_j(S_{k-1},S_k)b_{j,k}^a]]$) formed in a previous clock cycle.

4. A detection circuit as claimed in claim 2, wherein each of the one or more processing elements is configured, in one clock cycle, to determine for each next state ($S_k$) for the plurality of next states in the trellis, an extrinsic forward state metric ($\overline{\alpha}_k(S_k)$) by combining the a posteriori transition metrics ($\overline{\delta}_k(S_{k-1},S_k)$) for the connected transitions and subtracting the backward state metric ($\overline{\beta}_k(S_k)$) for that next state ($S_k$), and the combining of the a posteriori transition metrics ($\overline{\delta}_k(S_{k-1},S_k)$) for the connected transitions comprises determining a Jacobian logarithm of each of the a posteriori transition metrics for each of the transitions that is connected to that next state ($S_k$) in the trellis which the processing element represents $\max^*_{\{S_{k-1}|c(S_{k-1},S_k)=1\}}[\overline{\delta}_k(S_{k-1},S_k)]$), the Jacobian logarithm being defined as $$\max^*(\overline{\delta}_1,\overline{\delta}_2)=\max(\overline{\delta}_1,\overline{\delta}_2)+\ln(1+e^{-|(\overline{\delta}_1-\overline{\delta}_2)|})$$

for a pair of a posteriori transition metrics, wherein the Jacobian logarithm may be approximated as $$\max^*(\overline{\delta}_1,\overline{\delta}_2)\approx\max(\overline{\delta}_1,\overline{\delta}_2), \text{ or}$$

$$\max^*(\overline{\delta}_1,\overline{\delta}_2)\approx A\cdot\max(\overline{\delta}_1,\overline{\delta}_2)+B,$$

where A and B are constant values, or $$\max^*(\overline{\delta}_1,\overline{\delta}_2)\approx A(\overline{\delta}_1,\overline{\delta}_2)\cdot\max(\overline{\delta}_1,\overline{\delta}_2)+B(\overline{\delta}_1,\overline{\delta}_2),$$

where A and B are simple functions of the a posteriori transition metrics $\overline{\delta}_1,\overline{\delta}_2$.

5. A detection circuit as claimed in claim 2, wherein each of the one or more processing elements is configured, in one clock cycle to determine for each previous state ($S_{k-1}$) for the plurality of previous states in the trellis, an extrinsic backward state metric ($\overline{\beta}_{k-1}(S_{k-1})$) by combining the a posteriori transition metrics ($\overline{\delta}_k(S_{k-1},S_k)$) for the connected transitions and subtracting the forward state metric ($\overline{\alpha}_{k-1}(S_{k-1})$) for that previous state ($S_{k-1}$), and the combining of the a posteriori transition metrics ($\overline{\delta}_k(S_{k-1},S_k)$) for the connected transitions comprises determining a Jacobian logarithm of each of the a posteriori transition metrics for each of the transitions that is connected to that previous state ($S_{k-1}$) in the trellis which the processing element represents $\max^*_{\{S_k|c(S_{k-1},S_k)=1\}}[\overline{\delta}_k(S_{k-1},S_k)]$), the Jacobian logarithm being defined as $$\max^*(\overline{\delta}_1,\overline{\delta}_2)=\max(\overline{\delta}_1,\overline{\delta}_2)+\ln(1+e^{-|(\overline{\delta}_1-\overline{\delta}_2)|})$$

for a pair of a posteriori transition metrics $\overline{\delta}_1,\overline{\delta}_2$, wherein the Jacobian logarithm may be approximated as $$\max^*(\overline{\delta}_1,\overline{\delta}_2)\approx\max(\overline{\delta}_1,\overline{\delta}_2), \text{ or}$$

$$\max^*(\overline{\delta}_1,\overline{\delta}_2)\approx A\cdot\max((\overline{\delta}_1,\overline{\delta}_2)+B,$$

where A and B are constant values, or $$\max^*(\overline{\delta}_1,\overline{\delta}_2)\approx A(\overline{\delta}_1,\overline{\delta}_2)\cdot\max(\overline{\delta}_1,\overline{\delta}_2)+B(\overline{\delta}_1,\overline{\delta}_2),$$

where A and B are simple functions of the a posteriori transition metrics $\overline{\delta}_1,\overline{\delta}_2$.

6. A detection circuit as claimed in claim 2, wherein each of the one or more processing elements is configured, in one clock cycle, to form for each data symbol ($b_{j,k}$) of the plurality of data symbols considered by each trellis stage, an extrinsic soft decision value ($\overline{b}_{j,k}^e$) by combining the a posteriori transition metrics ($\overline{\delta}_k(S_{k-1},S_k)$) for the each of the transitions in the trellis stage and subtracting the a priori soft decision value ($\overline{b}_{j,k}^a$) for that data symbol ($b_{j,k}$).

7. A detection circuit as claimed in claim 2, wherein each of the one or more processing elements is configured, in one clock cycle, to form for each data symbol ($b_{j,k}$) of the plurality of data symbols considered by each trellis stage, an extrinsic soft decision value ($\overline{b}_{j,k}^e$) by combining the a priori soft decision values ($\overline{b}_{j,k}^e$) for the data symbols ($b_{j,k}$) with a combination of intermediate calculation results ($\overline{\varepsilon}_{k,l,m}$) determined in a previous clock cycle by combining the a posteriori transition metrics ($\overline{\delta}_k(S_{k-1},S_k)$) for each of the transitions in the trellis stage.

8. A detection circuit as claimed in claim 6, wherein the combining of the a posteriori transition metrics comprises forming a difference between
- a Jacobian logarithm of the set of a posteriori transition metrics for the set of the transitions in the trellis stage where the implied value for that data symbol ($b_{j,k}$) is a binary one (($S_{k-1}, S_k$)|$b_j(S_{k-1}, S_k)=1$), and
- a Jacobian logarithm of the set of a posteriori transition metrics for the set of the transitions in the trellis stage where the implied value for that data symbol ($b_{j,k}$) is a binary zero (($S_{k-1}, S_k$)|$b_j(S_{k-1}, S_k)=0$).

9. A detection circuit as claimed in claim 1, wherein the frame of data symbols has been encoded during the process of transmission with a turbo encoder comprising a first convolutional encoder, an interleaver and a second convolutional encoder, the Markov process which has affected the frame of data symbols during the processing of transmission being produced by the first convolutional encoder and the second convolutional encoder, the detection circuit being arranged to perform the turbo detection process in accordance with the first convolutional code, a second detection circuit being arranged to perform the turbo detection process in accordance with the second convolutional code, and for each clock cycle the detection circuit and the second detection circuit performs decoding processes for the respective first and second convolutional codes, exchanging extrinsic soft decision values through an interleaver circuit, which becomes the a priori soft decision values relating to the data symbol for the next clock cycle for the other of the detection circuit and the second detection circuit.

10. A detection circuit as claimed in claim 1, comprising
- a set of storage registers for each of the processing elements in the detection circuit, which are used for storing the a priori soft decision values for the one or more data symbols, the a priori forward state metrics and the a priori backward state metrics that will be processed by the processing element in the next clock cycle,
- a control unit, and
- for each of the processing elements, a selectable bypass circuit, which is configurable under control of the control unit, to bypass the processing element and the associated registers to disable the processing elements.

11. A detection circuit as claimed in claim 9, wherein the transmission process includes an interleaver that has interleaved data symbols of the data frame having odd indices to data symbols of an interleaved frame that also have odd indices, and data symbols of the data frame having even indices to data symbols of the interleaved frame that also have even indices, and
- the set of storage registers comprises for each of the processing elements in the detection circuit, one or more storage registers for storing the a priori soft decision values for the one or more data symbols, the a priori forward state metrics and the a priori backward state metrics that will be processed by the processing element in the next clock cycle, and
- the control unit which is configured in every other clock cycle of the turbo detection process to enable the processing elements of the detection circuit for processing the data symbols having odd indices and to disable the other half of the processing elements of the detection circuit for the data symbols having even indices, and in all other clock cycles of the turbo detection process to enable the other half of the processing elements for processing the data symbols having even indices and to disable the first half of the processing elements for processing the data symbols having odd indices.

12. A detection circuit as claimed in claim 9, wherein the transmission process includes an interleaver that has interleaved data symbols of each data frame having odd indices to data symbols of a corresponding interleaved frame that also have odd indices, and data symbols of each data frame having even indices to data symbols in the corresponding interleaved frame that also have even indices, and the detection circuit comprises
- a corresponding interleaver circuit, and the set of storage registers includes
- two sets of storage registers for each of the processing elements in the detection circuit, where each set of registers is used for storing the a priori soft decision values for the one or more data symbols in a different one of the frame or a second frame, as well as for storing the a priori forward state metrics and the a priori backward state metrics for that frame, which will be processed by the processing element in the next clock cycle that uses the processing element for decoding the corresponding frame, and
- the control unit is configured in every other clock cycle to load the a priori soft decision values and store the extrinsic soft decision values for the processing elements having odd-indices using the corresponding registers for a first of the frames, while loading the a priori soft decision values and storing the extrinsic soft decision values for the processing elements having even-indices using the corresponding registers for the second of the frames, and in all other clock cycles loading the a priori soft decision values and storing the extrinsic soft decision values for the processing elements having even-indices using the corresponding registers for the first of the frames, while loading the a priori soft decision values and storing the extrinsic soft decision values for the processing elements having odd-indices using the corresponding registers for the second of the frames, thereby simultaneously decoding the frame and the second frame, both employing the same interleaving pattern.

13. A detection circuit as claimed in claim 9, wherein the transmission process includes an interleaver that has interleaved data symbols of the data frame having odd indices to data symbols of an interleaved frame that also have odd indices, and data symbols of the data frame having even indices to data symbols in the interleaved frame that also have even indices, and the set of one or more storage registers comprises
- two sets of storage registers for each of the processing elements in the detection circuit, where each set of registers is used for storing the a priori soft decision values for the one or more data symbols in a different one of two Markov processes, as well as for storing the a priori forward state metrics and the a priori backward state metrics for that Markov process, which will be processed by the processing element in the next clock cycle that uses the processing element for decoding the corresponding Markov process, and
- the control unit is configured in every other clock cycle to load the a priori soft decision values and store the extrinsic soft decision values for the processing elements having odd-indices using the corresponding registers for the first Markov process, while loading the a priori soft decision values and storing the extrinsic soft decision values for the processing elements having even-indices using the corresponding registers for the second Markov process, and in all other clock cycles loading the a priori soft decision values and storing the extrinsic soft decision values for the processing elements having even-indices using the corresponding registers for the first Markov process, while loading the a priori soft decision values and storing the extrinsic soft decision values for the processing elements having odd-indices using the corresponding registers for the second Markov, thereby simultaneously decoding two Markov processes, and the detection circuit comprises an interleaver circuit which is configured in every other clock cycle to implement the interleaver pattern which supplies the a priori soft decision values for the first Markov process to the processing elements having odd-indices, while implementing the interleaver pattern which supplies the a priori soft decision values for the second Markov process to the processing elements having even-indices, and in all other clock cycles implementing the interleaver pattern which supplies the a priori soft decision values for the first Markov process to the processing elements having even-indices, while implementing the interleaver pattern which supplies the a priori soft decision values for the second Markov process to the processing elements having odd-indices.

14. A detection circuit as claimed in claim 9, wherein the transmission process includes an interleaver that has interleaved data symbols of the data frame having odd indices to data symbols of an interleaved frame that also have odd indices, and data symbols of the data frame having even indices to data symbols of the interleaved frame that also have even indices, and the set of storage registers comprises for each of the processing elements in the detection circuit, one or more storage registers for storing the a priori soft decision values for the one or more data symbols, the combination of soft decision values for each of the one or more data symbols corresponding to each state transition, the intermediate calculation results ($\bar{\varepsilon}_{k,l,m}$) determined by combining the a posteriori transition metrics ($\bar{\delta}_k(S_{k-1},S_k)$) for each of the transitions in the trellis stage, the a priori forward state metrics and the a priori backward state metrics that will be processed by the processing element in the next clock cycle, and the control unit which is configured in every other clock cycles of the turbo detection process to disable the processing of all information besides enabling the processing elements of the detection circuit for the data symbols having odd indices to process the a priori soft decision values for the one or more data symbols, and to process the intermediate calculation results ($\bar{\varepsilon}_{k,l,m}$) determined by combining the a posteriori transition metrics ($\bar{\delta}_k(S_{k-1},S_k)$) for each of the transitions in the trellis stage, and to enable the processing elements of the detection circuit for the data symbols having even indices to process the combination of soft decision values for each of the one or more data symbols corresponding to each state transition, to process the a priori forward state metrics, and to process the a priori backward state metrics, and in the other clock cycles of the turbo detection process to disable the processing of all information besides enabling the processing elements of the detection circuit for the data symbols having odd indices to process the combination of soft decision values for each of the one or more data symbols corresponding to each state transition, to process the a priori forward state metrics, and to process the a priori backward state metrics, and to enable the processing elements of the detection circuit for the data symbols having even indices to process the a priori soft decision values for the one or more data symbols, and to process the intermediate calculation results ($\bar{\varepsilon}_{k,l,m}$) determined by combining the a posteriori transition metrics ($\bar{\delta}k(S_{k-1},S_k)$) for each of the transitions in the trellis stage.

15. A detection circuit as claimed in claim 9, wherein the transmission process includes an interleaver that has interleaved data symbols of each data frame having odd indices to data symbols of a corresponding interleaved frame that also have odd indices, and data symbols of each data frame having even indices to data symbols in the corresponding interleaved frame that also have even indices, and the detection circuit comprises a corresponding interleaver circuit, and the set of storage registers includes two sets of storage registers for each of the processing elements in the detection circuit, where each set of registers is used for storing the a priori soft decision values for the one or more data symbols in a different one of the frame or a second frame, as well as for storing a combination of soft decision values for each of the one or more data symbols corresponding to each state transition, the intermediate calculation results ($\bar{\varepsilon}_{k,l,m}$) being determined by combining the a posteriori transition metrics ($\bar{\delta}_k(S_{k-1},S_k)$) for each of the transitions in the trellis stage, the a priori forward state metrics and the a priori backward state metrics for that frame, which will be processed by the processing element in the next clock cycle that uses the processing element for decoding the corresponding frame, and the control unit which is configured in every other clock cycles of the turbo detection process to enable the processing elements of the detection circuit for the data symbols having odd indices to process the a priori soft decision values for the one or more data symbols in the registers corresponding to the first frame, to process the intermediate calculation results ($\bar{\varepsilon}_{k,l,m}$) determined by combining the a posteriori transition metrics ($\bar{\delta}_k(S_{k-1},S_k)$) for each of the transitions in the trellis stage in the registers corresponding to the first frame, to process the combination of soft decision values for each of the one or more data symbols corresponding to each state transition in the registers corresponding to the second frame, to process the a priori forward state metrics in the registers corresponding to the second frame, and to process the a priori backward state metrics in the registers corresponding to the second frame, and to enable the processing elements of the detection circuit for the data symbols having even indices to process the combination of soft decision values for each of the one or more data symbols corresponding to each state transition in the registers corresponding to the first frame, to process the a priori forward state metrics in the registers corresponding to the first frame, to process the a priori backward state metrics in the registers corresponding to the first frame, to process the a priori soft decision values for the one or more data symbols in the registers corresponding to the second frame, and to process the intermediate calculation results ($\bar{\varepsilon}_{k,l,m}$) determined by combining the a posteriori transition metrics ($\bar{\delta}_k(S_{k-1},S_k)$) for each of the transitions in the trellis stage in the registers corresponding to the second frame, and in the other clock cycles of the turbo detection process to enable the processing elements of the detection circuit for the data symbols having odd indices to process the combination of soft decision values for each of the one or more data symbols corresponding to each state transition in the registers corresponding to the first frame, to process the a priori forward state metrics in the registers corresponding to the first frame, to process the a priori backward state metrics in the registers corresponding to the first frame, to process the a priori soft decision values for the one or more data symbols in the registers corresponding to the second frame, and to process the intermediate calculation results ($\bar{\varepsilon}_{k,l,m}$) determined by combining the a posteriori transition metrics ($\bar{\delta}_k(S_{k-1},S_k)$) for each of the transitions in the trellis stage in the registers corresponding to the second frame, and to enable the processing elements of the detection circuit for the data symbols having even indices to process the a priori soft decision values for the one or more data symbols in the registers corresponding to the first frame, to process the intermediate calculation results ($\bar{\varepsilon}_{k,l,m}$) determined by combining the a posteriori transition metrics ($\bar{\delta}_k(S_{k-1},S_k)$) for each of the transitions in the trellis stage in the registers corresponding to the first frame, to process the combination of soft decision values for each of the one or more data symbols corresponding to each state transition in the registers corresponding to the second frame, to process the a priori forward state metrics in the registers corresponding to the second frame, and to process the a priori backward state metrics in the registers corresponding to the second frame, thereby simultaneously decoding the frame and the second frame, both employing the same interleaving pattern.

16. A detection circuit as claimed in claim 9, wherein the transmission process includes an interleaver that has interleaved data symbols of the data frame having odd indices to data symbols of an interleaved frame that also have odd indices, and data symbols of the data frame having even indices to data symbols in the interleaved frame that also have even indices, and the set of one or more storage registers comprises two sets of storage registers for each of the processing elements in the detection circuit, where each set of registers is used for storing the a priori soft decision values for the one or more data symbols in a different one of two Markov processes, as well as for storing a combination of soft decision values for each of the one or more data symbols corresponding to each state transition, the intermediate calculation results ($\bar{\varepsilon}_{k,l,m}$) being determined by combining the a posteriori transition metrics ($\bar{\delta}_k(S_{k-1},S_k)$) for each of the transitions in the trellis stage, the a priori forward state metrics and the a priori backward state metrics for that Markov process, which will be processed by the processing element in the next clock cycle that uses the processing element for decoding the corresponding Markov process, and the control unit which is configured in every other clock cycles of the turbo detection process to enable the processing elements of the detection circuit for the data symbols having odd indices to process the a priori soft decision values for the one or more data symbols in the registers corresponding to the first Markov process, to process the intermediate calculation results ($\bar{\varepsilon}_{k,l,m}$) determined by combining the a posteriori transition metrics ($\bar{\delta}_k(S_{k-1},S_k)$) for each of the transitions in the trellis stage in the registers corresponding to the first Markov process, to process the combination of soft decision values for each of the one or more data symbols corresponding to each state transition in the registers corresponding to the second Markov process, to process the a priori forward state metrics in the registers corresponding to the second Markov process, and to process the a priori backward state metrics in the registers corresponding to the second Markov process, and to enable the processing elements of the detection circuit for the data symbols having even indices to process the combination of soft decision values for each of the one or more data symbols corresponding to each state transition in the registers corresponding to the first Markov process, to process the a priori forward state metrics in the registers corresponding to the first Markov process, to process the a priori backward state metrics in the registers corresponding to the first Markov process, to process the a priori soft decision values for the one or more data symbols in the registers corresponding to the second Markov process, and to process the intermediate calculation results ($\bar{\varepsilon}_{k,l,m}$) determined by combining the a posteriori transition metrics ($\bar{\delta}_k(S_{k-1},S_k)$) for each of the transitions in the trellis stage in the registers corresponding to the second Markov process, and in the other clock cycles of the turbo detection process to enable the processing elements of the detection circuit for the data symbols having odd indices to process the combination of soft decision values for each of the one or more data symbols corresponding to each state transition in the registers corresponding to the first Markov process, to process the a priori forward state metrics in the registers corresponding to the first Markov process, to process the a priori backward state metrics in the registers corresponding to the first Markov process, to process the a priori soft decision values for the one or more data symbols in the registers corresponding to the second Markov process, and to process the intermediate calculation results ($\bar{\varepsilon}_{k,l,m}$) determined by combining the a posteriori transition metrics ($\bar{\delta}_k(S_{k-1},S_k)$) for each of the transitions in the trellis stage in the registers corresponding to the second Markov process, and to enable the processing elements of the detection circuit for the data symbols having even indices to process the a priori soft decision values for the one or more data symbols in the registers corresponding to the first Markov process, to process the intermediate calculation results ($\bar{\varepsilon}_{k,l,m}$) determined by combining the a posteriori transition metrics ($\bar{\delta}_k(S_{k-1},S_k)$) for each of the transitions in the trellis stage in the registers corresponding to the first Markov process, to process the combination of soft decision values for each of the one or more data symbols corresponding to each state transition in the registers corresponding to the second Markov process, to process the a priori forward state metrics in the registers corresponding to the second Markov process, and to process the a priori backward state metrics in the registers corresponding to the second Markov process, thereby simultaneously decoding two Markov processes, and the detection circuit comprises an interleaver circuit which is configured in every other clock cycle to implement the interleaver pattern which supplies the a priori soft decision values for the first Markov process to the processing elements having odd-indices, while implementing the interleaver pattern which supplies the a priori soft decision values for the second Markov process to the processing elements having even-indices.

17. A receiver circuitry for estimating a frame of data symbols from a received signal, the receiver circuitry comprising a first detection circuit, and at least one other detection circuit which is configured to co-operate with the first detection circuit to perform in combination a turbo detection process to generate an estimate of the frame of data symbols, and a clock generating clock cycles according to a predetermined frequency, wherein the first detection circuit performs at least part of the turbo detection process for recovering the frame of data symbols from the received signal, the received signal comprising one or more soft decision values for each data symbol of the frame, the data symbols of the frame having been affected, during the process of transmission, by a Markov process with the effect that the data symbols of the frame in the received signal are dependent on one or more preceding data symbols which can be represented as a trellis having a plurality of trellis stages, and the first detection circuit comprises a plurality of processing elements, each of the processing elements being associated with one of the trellis stages representing the dependency of the data symbols of the frame according to the Markov process and each of the processing elements is configured to receive fixed point data representing soft decision values for one or more data symbols associated with the trellis stage, and each of one or more of the processing elements is configured, in one clock cycle to receive fixed point data representing a priori forward state metrics from a first neighboring processing element, to receive fixed point data representing a priori backward state metrics from a second neighboring processing element, and to receive fixed point data representing a priori soft decision values for the one or more data symbols being detected for the trellis stage associated with the processing element, to combine the a priori forward state metrics, the a priori backward state metrics and the a priori soft decision values relating to the one or more data symbols to determine one or more fixed point extrinsic forward state metrics, one or more fixed point extrinsic backward metrics and fixed point extrinsic soft decision values corresponding to the one or more data symbols for the trellis stage associated with the processing element, and to communicate the one or more extrinsic forward state metrics to the second neighboring processing element, which become the a priori forward state metrics for that processing element in a next clock cycle, to communicate the one or more extrinsic backward state metrics to the first neighboring processing element, which become the a priori backward state metrics for that processing element in the next clock cycle, and to provide the one or more extrinsic soft decision values, which become the a priori soft decision values relating to the data symbols for a next clock cycle, wherein for one or more of a plurality of consecutive clock cycles of the turbo detection process, the processing elements of the detection circuit are configured to operate simultaneously, and for one or more of a plurality of consecutive clock cycles of the turbo detection process, the first detection circuit and the at least one other detection circuit are configured in operate simultaneously.

18. A method for performing a turbo detection process to recover a frame of data symbols from a received signal comprising one or more soft decision values for each data symbol of the frame, the data symbols of the frame having been affected, during the process of transmission, by a Markov process with the effect that the data symbols of the frame in the received signal are dependent on one or more preceding data symbols which can be represented as a trellis having a plurality of trellis stages, the method comprising receiving at a detection circuit the frame of data symbols represented as a fixed point soft decision value for each data symbol of the frame, performing the turbo detection process to generate an estimate of the frame of data symbols, the detection circuit including a plurality of processing elements, each of the processing elements is associated with one of the trellis stages representing the dependency of the data symbols of the frame according to the Markov process and each of the processing elements is configured to receive fixed point data representing soft decision values for one or more data symbols associated with the trellis stage, and the method comprises for each of one or more of the processing elements in one clock cycle receiving fixed point data representing a priori forward state metrics from a first neighboring processing element, receiving fixed point data representing an a priori backward state metrics from a second neighboring processing element, and receiving fixed point data representing a priori soft decision values for the one or more data symbols being detected for the trellis stage associated with the processing element, combining the a priori forward state metrics, the a priori backward state metrics and the a priori soft decision values relating to the one or more data symbols to determine one or more fixed point extrinsic forward state metrics, one or more fixed point extrinsic backward metrics and fixed point extrinsic soft decision values corresponding to the one or more data symbols for the trellis stage associated with the processing element, and communicating the one or more extrinsic forward state metrics to the second neighboring processing element, which become the a priori forward state metric for the processing element in the next clock cycle, communicating the one or more extrinsic backward state metrics to the first neighboring processing element, which become the a priori backward state metrics for that processing element in the next clock cycle, and providing the one or more extrinsic soft decision values, which become the a priori soft decision values relating to the data symbols for the next clock cycle, wherein for one or more of a plurality of consecutive clock cycles of the turbo detection process, the processing elements of the detection circuit are configured to operate simultaneously.

19. A mobile communications device comprising transmitter circuitry configured to transmit signals via a wireless access interface of a wireless communications network, and receiver circuitry configured to receive signals via the wireless access interface of the wireless communications network, and controller circuitry configured to control the transmitter circuitry and the receiver circuitry to transmit data to the wireless communications network and to receive data from the wireless communications network via the wireless access interface, the receiver circuitry comprising a detection circuit for performing a turbo detection process to recover a frame of data symbols from a received signal comprising one or more soft decision values for each data symbol of the frame, the data symbols of the frame having been affected, during the process of transmission, by a Markov process with the effect that the data symbols of the frame in the received signal are dependent on one or more preceding data symbols which can be represented as a trellis having a plurality of trellis stages, and the detection circuit comprises a plurality of processing elements, each of the processing elements being associated with one of the trellis stages representing the dependency of the data symbols of the frame according to the Markov process and each of the processing elements is configured to receive fixed point data representing soft decision values for one or more data symbols associated with the trellis stage, and each of one or more of the processing elements is configured, in one clock cycle to receive fixed point data representing a priori forward state metrics from a first neighboring processing element, to receive fixed point data representing a priori backward state metrics from a second neighboring processing element, and to receive fixed point data representing a priori soft decision values for the one or more data symbols being detected for the trellis stage associated with the processing element, to combine the a priori forward state metrics, the a priori backward state metrics and the a priori soft decision values relating to the one or more data symbols to determine one or more fixed point extrinsic forward state metrics, one or more fixed point extrinsic backward metrics and fixed point extrinsic soft decision values corresponding to the one or more data symbols for the trellis stage associated with the processing element, and to communicate the one or more extrinsic forward state metrics to the second neighboring processing element, which become the a priori forward state metrics for that processing element in a next clock cycle, to communicate the one or more extrinsic backward state metrics to the first neighboring processing element, which become the a priori backward state metrics for that processing element in the next clock cycle, and to provide the one or more extrinsic soft decision values, which become the a priori soft decision values relating to the data symbols for a next clock cycle, wherein for one or more of a plurality of consecutive clock cycles of the turbo detection process, the processing elements of the detection circuit are configured to operate simultaneously.

20. A base station for forming part of a wireless communications network, the base station comprising transmitter circuitry configured to transmit signals via a wireless access interface of the wireless communications network to one or more communications devices, receiver circuitry configured to receive signals from the one or more communications devices via the wireless access interface of the wireless communications network, and controller circuitry configured to control the transmitter circuitry and the receiver circuitry to transmit data to the one or more communications devices or to receive data from the one or more communications devices via the wireless access interface, the receiver circuitry comprising a detection circuit for performing a turbo detection process to recover a frame of data symbols from a received signal comprising one or more soft decision values for each data symbol of the frame, the data symbols of the frame having been affected, during the process of transmission, by a Markov process with the effect that the data symbols of the frame in the received signal are dependent on one or more preceding data symbols which can be represented as a trellis having a plurality of trellis stages, and the detection circuit comprises a plurality of processing elements, each of the processing elements being associated with one of the trellis stages representing the dependency of the data symbols of the frame according to the Markov process and each of the processing elements is configured to receive fixed point data representing soft decision values for one or more data symbols associated with the trellis stage, and each of one or more of the processing elements is configured, in one clock cycle to receive fixed point data representing a priori forward state metrics from a first neighboring processing element, to receive fixed point data representing a priori backward state metrics from a second neighboring processing element, and to receive fixed point data representing a priori soft decision values for the one or more data symbols being detected for the trellis stage associated with the processing element, to combine the a priori forward state metrics, the a priori backward state metrics and the a priori soft decision values relating to the one or more data symbols to determine one or more fixed point extrinsic forward state metrics, one or more fixed point extrinsic backward metrics and fixed point extrinsic soft decision values corresponding to the one or more data symbols for the trellis stage associated with the processing element, and to communicate the one or more extrinsic forward state metrics to the second neighboring processing element, which become the a priori forward state metrics for that processing element in a next clock cycle, to communicate the one or more extrinsic backward state metrics to the first neighboring processing element, which become the a priori backward state metrics for that processing element in the next clock cycle, and to provide the one or more extrinsic soft decision values, which become the a priori soft decision values relating to the data symbols for a next clock cycle, wherein for one or more of a plurality of consecutive clock cycles of the turbo detection process, the processing elements of the detection circuit are configured to operate simultaneously.

* * * * *